(12) United States Patent
Takeuchi et al.

(10) Patent No.: US 6,765,256 B2
(45) Date of Patent: Jul. 20, 2004

(54) SEMICONDUCTOR DEVICE

(75) Inventors: Masahiko Takeuchi, Hyogo (JP); Takashi Dokan, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/370,657

(22) Filed: Feb. 24, 2003

(65) Prior Publication Data

US 2004/0056282 A1 Mar. 25, 2004

(30) Foreign Application Priority Data

Sep. 19, 2002 (JP) ........................ 2002-273182

(51) Int. Cl.[7] ........................................... H01L 27/108
(52) U.S. Cl. ......................... 257/306; 257/773
(58) Field of Search ............... 257/306, 773, 257/532

(56) References Cited

U.S. PATENT DOCUMENTS 6,368,910 B1    4/2002 Sheu et al.
6,469,337 B1 * 10/2002 Sukekawa et al. .......... 257/306
6,580,111 B2 *  6/2003 Kim et al. ................. 257/301
2003/0107075 A1 * 6/2003 Cabral, Jr. et al. ......... 257/306

FOREIGN PATENT DOCUMENTS

JP    10-242418      9/1998
JP    P2000-216357 A  8/2000

* cited by examiner

Primary Examiner—Mark V. Prenty
(74) Attorney, Agent, or Firm—McDermott Will & Emery

(57) ABSTRACT

A semiconductor device includes: lower storage node electrodes provided on a main surface of a silicon substrate; a dielectric film provided on the lower storage node electrodes; an upper cell plate electrode provided on the dielectric film; and an interlayer insulating film covering the upper cell plate electrode. The upper cell plate electrode contains ruthenium. The interlayer insulating film has a contact hole reaching the upper cell plate electrode. The contact hole is provided so that the distance between the main surface of the silicon substrate and the bottom face of the contact hole is not less than the distance between the main surface of the silicon substrate and the bottom face of the upper cell plate electrode. A semiconductor device is provided wherein contact defects in the upper electrode and the generation of an area penalty are prevented.

9 Claims, 55 Drawing Sheets

SEMICONDUCTOR DEVICE

BACKGROUND OF THE INVENTION

1. Field of the Invention

The present invention generally relates to a semiconductor device, and more particularly to a semiconductor device with a capacitor.

2. Description of the Background Art

In recent years, a cylindrical capacitor structure wherein the effective area of an actual capacitor can be made large relative to the projection area of the memory cell has been widely used while, at the same time, miniaturization of the structure of semiconductor devices, in particular of DRAMs (dynamic random access memories), has proceeded. Such a cylindrical capacitor structure has a layered structure provided with a lower electrode formed in a cylinder, a dielectric film covering the surface of the lower electrode and a cell plate. FIG. 54 is a cross sectional view showing a semiconductor device having a cylindrical capacitor structure according to prior art.

With reference to FIG. 54, gate electrodes 104a to 104c are formed above the main surface 101a of a semiconductor substrate 101 with gate insulating films 103a to 103c intervened there between. Impurity regions 102a to 102d, as source/drain regions having a predetermined depth, are formed in main surface 101a of semiconductor substrate 101 so as to be located on both side faces of gate electrodes 104a to 104c. An impurity region 102e, having a predetermined depth, is formed at a distance away from impurity region 102d in main surface 101a of semiconductor substrate 101. Sidewall insulating films 115a to 105c are formed on the sidewalls of gate electrodes 104a to 104c. Coating insulating films 106a to 106c are formed on the top faces of gate electrodes 104a to 104c.

A first interlayer insulating film 107 made of a silicon oxide film is formed so as to cover main surface 101a of semiconductor substrate 101, coating insulating films 106a to 106c and sidewall insulating films 105a to 105c. Contact holes 108a and 108b, reaching impurity regions 102b and 102c are formed in first interlayer insulating film 107. Conductor films 109a and 109b are filled into contact holes 108a and 108b.

A second interlayer insulating film 110 made of a silicon oxide film is formed on first insulating film 107. A contact hole 111a reaching the top face of conductor film 109b is formed in second interlayer insulating film 110. A contact hole 111b reaching to impurity region 102e formed in main surface 101a of semiconductor substrate 101 is formed in first and second interlayer insulating films 107 and 110. Conductor films 115a and 115b are filled into contact holes 111a and 111b. First wire films 112a and 112b are formed on the top face of second interlayer insulating film 110 so as to make contact with conductor films 115a and 115b.

A third interlayer insulating film 113 made of a silicon oxide film is formed so as to cover second interlayer insulating film 110, first wire films 112a and 112b. A contact hole 114 reaching conductor film 109a formed in first interlayer insulating film 107 is formed in second and third interlayer insulating films 110 and 113. A conductor film 116 is filled into contact hole 114.

A fourth interlayer insulating film 118 made of a silicon oxide film is formed on third interlayer insulating film 113. A hole 119 reaching conductor film 116 formed in third interlayer insulating film 113 is formed in fourth interlayer insulating film 118. A cylindrical lower storage node electrode 120 is formed so as to cover the side face and the bottom face of hole 119 wherein lower storage node electrode 120 makes contact with conductor film 116. A dielectric film 121 is formed so as to cover the surface of lower storage node electrode 120 and a portion of the top face of fourth interlayer insulating film 118. An upper cell plate electrode 122 is formed so as to cover dielectric film 121 and so as to completely fill in the inside of hole 119. Lower storage node electrode 120, dielectric film 121 and upper cell plate electrode 122 form a cylindrical capacitor in a semiconductor device.

A fifth interlayer insulating film 123 made of a silicon oxide film is formed so as to cover upper cell plate electrode 122 and fourth interlayer insulating film 118. A contact hole 152a penetrating through upper cell plate electrode 122 and dielectric film 121 so as to reach the inside of fourth interlayer insulating film 118 is formed in fifth interlayer insulating film 123. The bottom face of contact hole 152a is defined by fourth interlayer insulating film 118. A contact hole 152b reaching first wire film 112b formed on the top face of second interlayer insulating film 110 is formed in third, fourth and fifth interlayer insulating films 113, 118 and 123. Conductor films 153a and 153b are filled into contact holes 152a and 152b. Conductor film 153a is connected to the sidewall of upper cell plate electrode 122 resulting from the formation of contact hole 152a. Second wire films 154a and 154b are formed on the top face of fifth interlayer insulating film 123 so as to make contact with conductor films 153a and 153b.

In a semiconductor device having such a cylindrical capacitor, it is necessary to increase the height of the capacitor in order to maintain the capacitance of the capacitor while reducing the size of the memory cell. Therefore, the height of fourth interlayer insulating film 118 tends to increase and the distance between the top face of fifth interlayer insulating film 123 and first wire film 112b becomes greater due, in particular, to this tendency.

In addition, for the purpose of setting upper cell plate electrode 122 at a predetermined potential, second wire film 154a provided on fifth interlayer insulating film 123 and upper cell plate electrode 122 are connected by conductor film 153a. Therefore, it is necessary to form contact hole 152a into which conductor film 153 is filled. On the other hand, for the purpose of supplying a signal to impurity region 102e and for fixing the potential thereof, second wire film 154b provided on fifth interlayer insulating film 123 and first wire film 112b provided on second interlayer insulating film 110 are connected by conductor film 153b. Therefore, it is necessary to form contact hole 152b into which conductor film 153b is filled.

These contact holes 152a and 152b are formed in the same etching step, after the provision of fifth interlayer insulating film 123, in order to reduce the number of manufacturing steps. Then, this etching step is carried out until contact hole 152b reaches first wire film 112b. Therefore, contact hole 152a first reaches the top face of upper cell plate electrode 122 and, after that, upper cell plate electrode 122 continuously undergoes etching until contact hole 152b reaches first wire film 112b. As a result of this, as shown in FIG. 54, a formation is obtained wherein contact hole 152a penetrates through upper cell plate electrode 122 so as to reach the inside of fourth interlayer insulating film 118.

In the case that contact hole 152a penetrates through upper cell plate electrode 122 in such a manner, and the amount of penetration is great, a problem arises wherein conductor film 153a is short circuited to, for example, first wire film 112a.

In addition, the area of contact between conductor film 153a filled into contact hole 152a and upper cell plate electrode 122 is only the sidewall of upper cell plate electrode 122 resulting from the formation of contact hole 152a and, therefore, the area of contact is small. In addition, in the case that conductor film 153a is formed by means of sputtering, the coverage of film formation is insufficient on the sidewall of upper cell plate electrode 122. Furthermore, in the case that the sidewall of upper cell plate electrode 122 recedes as a result of a wet process after the formation of contact hole 152a, the coverage of conductor film 153a at the time of film formation is worsened. Because of the above reasons, there is a risk that a defective contact between upper cell plate electrode 122 and conductor film 153a may generate.

Japanese Patent Laying-Open No. 2000-216357, for example, discloses a semiconductor device wherein a defective contact with a cell plate is prevented from generating for the purpose of solving the above problem. FIG. 55 is a cross sectional view showing the semiconductor device disclosed in Japanese Patent Laying-Open No. 2000-216357.

With reference to FIG. 55, gate electrodes 204 are formed above a silicon substrate 201 having an element isolation oxide film 202 and diffusion layer regions 203 with gate insulating films intervened there between. Nitrided films 205 are formed on the top faces of gate electrodes 204 and sidewall oxide films 206 are formed on the sidewalls of gate electrodes 204. A first interlayer insulating film 216 is formed so as to cover gate electrodes 204 and the main surface of silicon substrate 201. Local wires 207 reaching to diffusion layer regions 203 are formed in first interlayer insulating film 216. A second interlayer insulating film 217 is formed on first interlayer insulating film 216. A storage electrode 208 having a cylindrical structure is formed in second interlayer insulating film 217. Storage electrode 208 is electrically connected to a diffusion layer region 203 via a local wire 207.

A capacitance electrode 210 made of polysilicon is formed above storage electrode 208 with a capacitance insulating film intervened there between. A third interlayer insulating film 218 covering capacitance electrode 210 is formed on second interlayer insulating film 217. Metal wires 212 are formed on third interlayer insulating film 218. Gate electrodes 204, diffusion layer regions 203 and capacitance electrode 210, respectively, are electrically connected to metal wires 212 via metal contacts 211. A contact stopper 209 formed in the same layer as storage electrode 208 is formed beneath the contact between metal contact 211 and capacitance electrode 210. The film of capacitance electrode 210 positioned beneath metal contact 211 is formed to have a great thickness due to the existence of contact stopper 209.

In the case that a contact hole reaching a gate electrode 204 and a contact hole reaching capacitance electrode 210 are simultaneously formed, the contact hole reaching capacitance electrode 210 does not penetrate through capacitance electrode 210 because capacitance electrode 210 is deposited inside of contact stopper 209. Thereby, a metal wire 212 and capacitance electrode 210 can make sufficient electrical contact.

In the above described semiconductor device shown in FIG. 55, the film of capacitance electrode 210 positioned below metal contact 211 is formed to have a great thickness in order to prevent the contact hole reaching to capacitance electrode 210 from penetrating through capacitance electrode 210. In order to implement a semiconductor device having such a structure, however, a region must be obtained having a predetermined width in which the film of capacitance electrode 210 has a great thickness above silicon substrate 201, thereby an area penalty generates. The term area penalty indicates a disadvantage caused by usage of space above a semiconductor substrate wherein a structure is provided in order to achieve a specific purpose. Therefore, a problem arises wherein the area of the memory cell region increases, so that miniaturization of the semiconductor device cannot be implemented.

In addition, in the case that the contact hole reaching capacitance electrode 210 is formed up to the vicinity of contact stopper 209, the area of the sidewall of capacitance electrode 210 that makes contact with metal contact 211 is significantly increased by the amount of thickness of the film of capacitance electrode 210. The sidewall of capacitance electrode 210 resulting from the formation of the contact hole does not have the desired surface formation due to a variety of factors at the time of etching. Therefore, a problem arises wherein the contact resistance between metal contact 211 and capacitance electrode 210 is dispersed.

SUMMARY OF THE INVENTION

Therefore, an object of the present invention is to solve the above described problem and to provide a semiconductor device wherein contact defects in the upper electrode are prevented and the generation of an area penalty is prevented.

A semiconductor device according to the present invention includes: a lower electrode provided on a main surface of a semiconductor substrate; a dielectric film provided on the lower electrode; an upper electrode provided on the dielectric film; and an interlayer insulating film covering the upper electrode. The upper electrode contains at least one type selected from the group consisting of ruthenium, titanium nitride and platinum. The interlayer insulating film has a first hole reaching the upper electrode. The first hole is provided so that the distance between the main surface of the semiconductor substrate and the bottom face of the first hole is not less than the distance between the main surface of the semiconductor substrate and the bottom face of the upper electrode in the portion where the first hole reaches.

According to a semiconductor device having such a configuration, the upper electrode contains at least one type selected from the group consisting of ruthenium, titanium nitride and platinum, which are strongly resistant to oxidation. Therefore, even in the case that the upper electrode is exposed to an atmosphere that promotes oxidation in a manufacturing step of the semiconductor device, the upper electrode can be prevented from undergoing oxidation. Therefore, the generation of contact defects due to oxidation of the upper electrode can be prevented. In addition, in the case of ruthenium, the oxides of ruthenium are also conductive. Therefore, even when the upper electrode undergoes oxidation, contact defects do not generate in the upper electrode.

In addition, the sidewall of the upper electrode defined by the first hole does not have a depth greater than a constant depth. Therefore, the upper electrode can be provided with a stable contact resistance between the upper electrode and the conductive film filled into the first hole. Furthermore, contact defects of the upper electrode are prevented through the formation of the upper electrode of predetermined materials, instead of relying upon the specific structure. Accordingly, no area penalty is produced so that miniaturization of the semiconductor device can be implemented.

In addition, the first hole is formed in a manner that does not allow penetration beyond the upper electrode. Therefore, there is no risk of the first hole reaching a wire film or the like, separately provided from the upper electrode so that the conductive film filled into the first hole and this wire film form a short circuit. In addition, the bottom of the first hole is defined by the upper electrode, except for the case where the distance between the main surface of the semiconductor substrate and the bottom face of the first hole is equal to the distance between the main surface of the semiconductor substrate and the bottom face of the upper electrode. Therefore, the area of contact between the conductive film filled into the first hole and the upper electrode increases so that contact defects due to small contact area can be prevented.

In addition, the semiconductor device is preferably further includes a conductive film formed within the interlayer insulating film so that the distance between the top face of the interlayer insulating film and the conductive film is greater than the distance between the top face of the interlayer insulating film and the upper electrode. The interlayer insulating film has a second hole reaching the conductive film. The predetermined etchant used to form first and second holes through the removal of portions of the interlayer insulating film etches the upper electrode at a relatively low etching rate, while the predetermined etchant etches the interlayer insulating film at a relatively high etching rate.

According to the semiconductor device having such a configuration, in the case that the interlayer insulating film is etched so that the first hole and second hole, which is deeper than the first hole, are simultaneously formed, the upper electrode continues to undergo etching after the first hole has reached the top face of the upper electrode. However, the etchant for removal of portions of the interlayer insulating film etches the upper electrode at a relatively low etching rate and, therefore, it is difficult to etch the upper electrode when the interlayer insulating film is etched. Therefore, even when the upper electrode continues to undergo etching, etching stops at a predetermined position of the upper electrode so that the first hole is formed in a manner that does not allow penetration beyond the upper electrode. Thereby, the desired contact structure between the upper electrode and the conductive film filled into the first hole can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
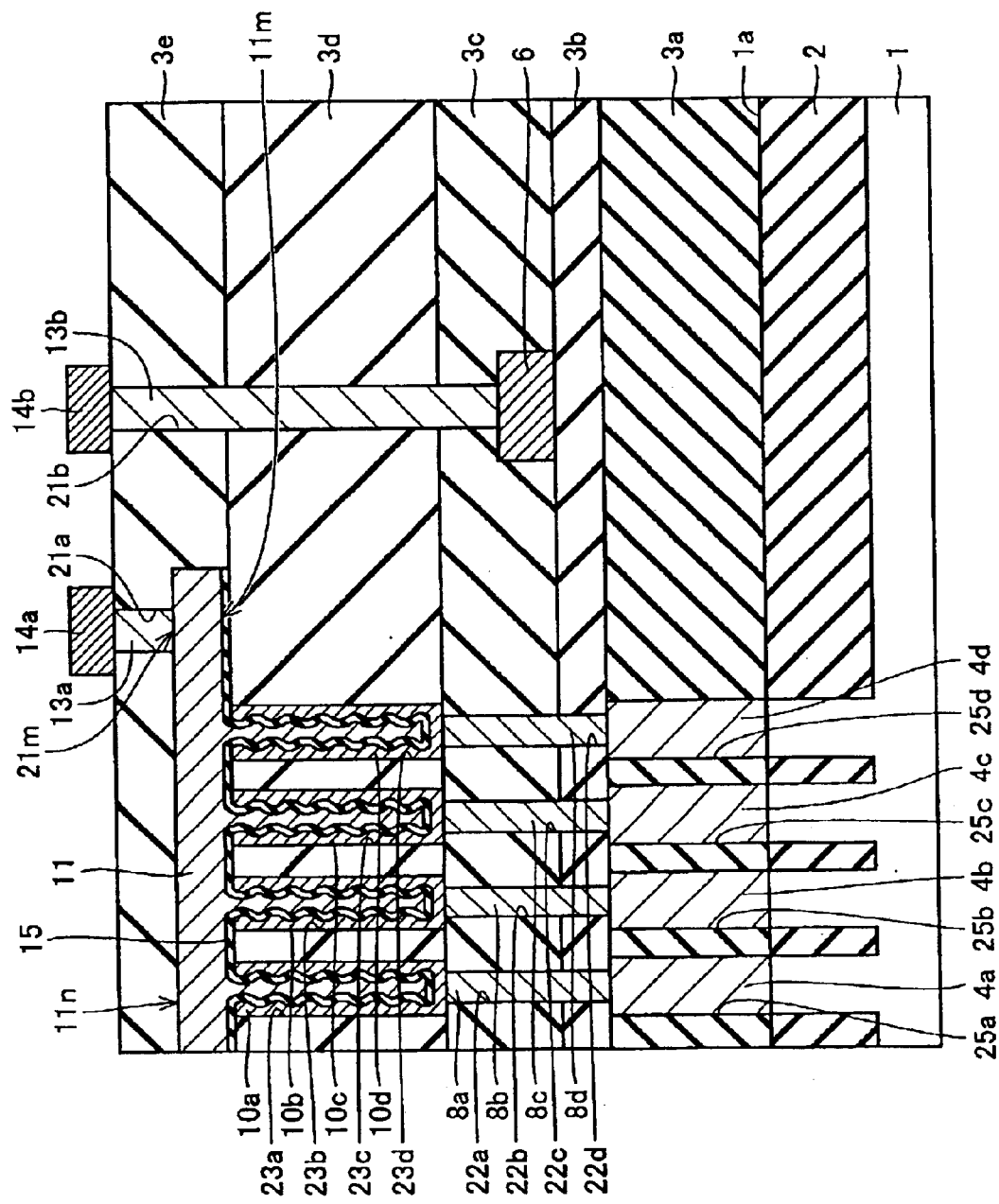
FIG. 1 is a cross sectional view showing a semiconductor device according to a first embodiment of the present invention.

With reference to FIG. 1, a semiconductor device has a MIS (metal-insulator-silicon) capacitor with a coarse, concave surface. Isolation insulating films 2 are formed at predetermined intervals in main surface 1a of a silicon substrate 1. Impurity regions having a predetermined depth, which are not shown, are formed as source/drain regions in main surface 1a of silicon substrate 1 divided into a plurality of pieces by means of isolation insulating films 2.

A first interlayer insulating film 3a made of a silicon oxide film is formed so as to cover main surface 1a of silicon substrate 1. Contact holes 25a to 25d are formed in first interlayer insulating film 3a so as to reach main surface 1a of silicon substrate 1 wherein impurity regions are formed, not shown. Landing plugs 4a to 4d are formed by filling in contact holes 25a to 25d with doped polysilicon, or the like.

A second interlayer insulating film 3b made of a silicon oxide film is formed on first interlayer insulating film 3a. A bit line wire 6 made of tungsten (W) is formed on the top face of second interlayer insulating film 3b so as to be positioned above an isolation insulating film 2 formed in silicon substrate 1.

A third interlayer insulating film 3c made of a silicon oxide film is formed on second interlayer insulating film 3b so as to cover bit line wire 6. Contact holes 22a to 22d are formed in second and third interlayer insulating films 3b and 3c so as to reach the respective top faces of landing plugs 4a to 4d. Storage node contacts 8a to 8d are formed by filling in contact holes 22a to 22d with doped polysilicon, or the like.

A fourth interlayer insulating film 3d made of a silicon oxide film is formed on third interlayer insulating film 3c. Holes 23a to 23d are formed in fourth interlayer insulating film 3d so as to reach the respective top faces of storage node contacts 8a to 8d. Lower storage node electrodes 10a to 10d made of doped polysilicon are formed in holes 23a to 23d so as to cover the bottoms and the sidewalls of holes 23a to 23d. Lower storage node electrodes 10a to 10d form additional recesses inside of holes 23a to 23d, wherein the surfaces of these recesses are uneven. Lower storage node electrodes 10a to 10d, of which the surfaces are uneven in the above manner, can be formed, for example, by crystallizing amorphous silicon in an uneven manner after deposition of amorphous silicon.

A dielectric film 15 made of tantalum oxide ($Ta_2O_5$) or barium strontium titanium oxide (BST) is formed so as to cover the recesses formed in lower storage node electrodes 10a to 10d and a portion of the top face of fourth interlayer insulating film 3d. An upper cell plate electrode 11 made of ruthenium (Ru) is formed so as to cover dielectric film 15 and so as to completely fill in holes 23a to 23d.

A capacitor of the semiconductor device is formed of lower storage node electrodes 10a to 10d, dielectric film 15 and upper cell plate electrode 11. In the present embodiment, the surfaces of lower storage node electrodes 10a to 10d are uneven so as to increase the area of the capacitor. Thereby, the storage capacitance of the capacitor can be increased.

A fifth interlayer insulating film 3e made of a silicon oxide film is formed on fourth interlayer insulating film 3d so as to cover upper cell plate electrode 11. A contact hole 21a is formed in fifth interlayer insulating film 3e so as to reach upper cell plate electrode 11. Bottom 21m of contact hole 21a is defined by top face 11n of upper cell plate electrode 11. A contact hole 21b is formed in third, fourth and fifth interlayer insulating films 3c, 3d and 3e so as to reach the top face of bit line wire 6. Metal plugs 13a and 13b made of tungsten are formed in contact holes 21a and 21b with barrier metal films intervened there between, not shown.

Aluminum wires 14a and 14b made of aluminum (Al) are formed on fifth interlayer insulating film 3e so as to make contact with the top faces of metal plugs 13a and 13b. Here, an interlayer insulating film 3 is formed of first to fifth interlayer insulating films 3a to 3e.

Figure 2:
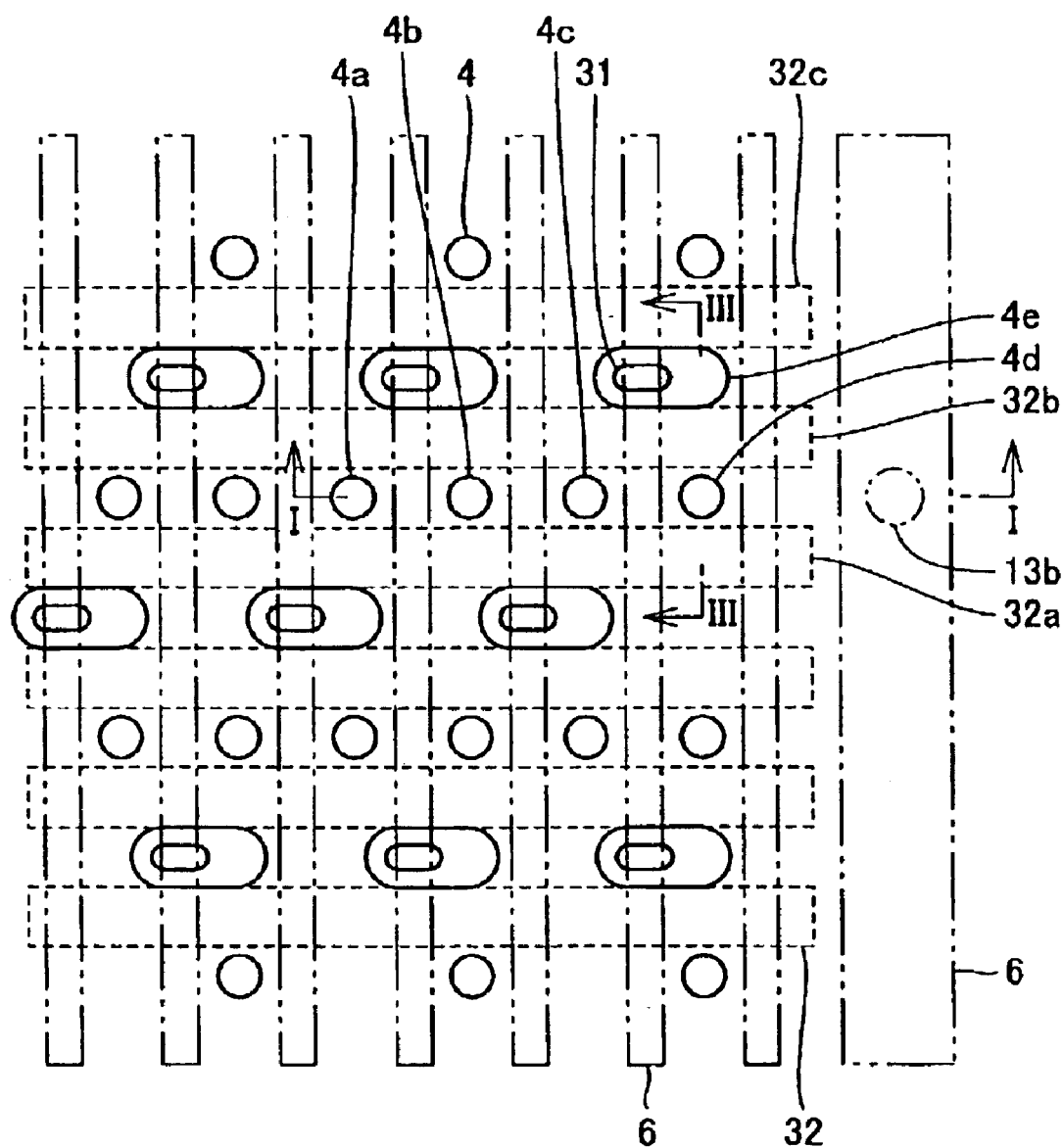
FIG. 2 is a plan view showing the semiconductor device of FIG. 1.

With reference to FIG. 2, the cross section along line I—I indicates the semiconductor device in FIG. 1. A plurality of gate electrodes 32 are formed above silicon substrate 1, not shown, at predetermined intervals. A plurality of bit line wires 6 is positioned so as to be approximately perpendicular to gate electrodes 32. Landing plugs 4, formed so as to extend from main surface 1a of silicon substrate 1, are positioned between adjacent gate electrodes 32. A storage node contact 31 is positioned above landing plug 4e so that storage node contact 31 is connected to a bit line wire 6.

Figure 3:
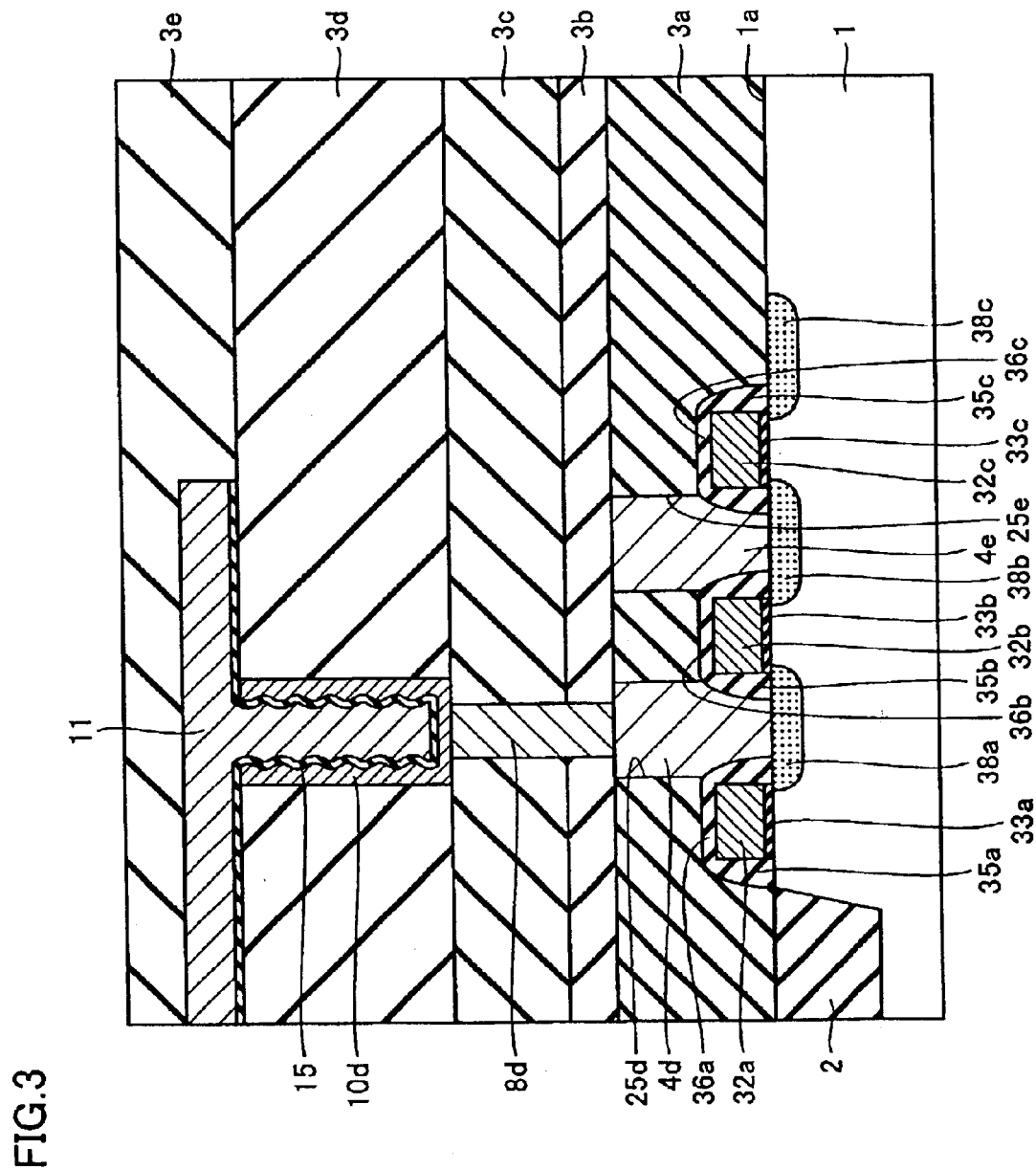
FIG. 3 is a cross sectional view along line III—III of FIG. 2.

With reference to FIG. 3, gate electrodes 32a to 32c are formed above main surface 1a of silicon substrate 1 with gate insulating films 33a to 33c intervened there between. Impurity regions 38a to 38c having a predetermined depth are formed as source/drain regions in main surface 1a of silicon substrate 1 so as to be positioned on both side faces of gate electrodes 32a to 32c. Sidewall insulating films 35a to 35c are formed on the sidewalls of gate electrodes 32a to 32c. Coating insulating films 36a to 36c are formed on the top faces of gate electrodes 32a to 32c. Contact holes 25d and 25e are formed in first interlayer insulating film 3a so as to reach impurity regions 38a and 38b. Landing plugs 4d and 4e are formed by filling in contact holes 25d and 25e with doped polysilicon, or the like.

A semiconductor device according to a first embodiment of the present invention is provided with lower storage node electrodes 10a to 10d as lower electrodes formed on main surface 1a of silicon substrate 1 as a semiconductor substrate, dielectric film 15 formed on lower storage node electrodes 10a to 10d, upper cell plate electrode 11 formed as an upper electrode on dielectric film 15 and interlayer insulating film 3 covering upper cell plate electrode 11. Upper cell plate electrode 11 includes ruthenium, so as to include at least one type selected from the group consisting of ruthenium, titanium nitride and platinum. Interlayer insulating film 3 has a contact hole 21a as a first hole reaching upper cell plate electrode 11. Contact hole 21a is provided so that the distance between main surface 1a of silicon substrate 1 and bottom 21m of contact hole 21a is not less than the distance between main surface 1a of silicon substrate 1 and bottom 11m of upper cell plate electrode 11 in the portion wherein contact hole 21a reaches upper cell plate electrode 11.

The semiconductor device is further provided with bit line wire 6 as a conductive film formed within interlayer insulating film 3 so that the distance between the top face of interlayer insulating film 3, that is to say the top face of fifth interlayer insulating film 3e, and bit line wire 6 is greater than the distance between the top face of fifth interlayer insulating film 3e and upper cell plate electrode 11. Interlayer insulating film 3 has contact hole 21b as a second hole reaching bit line wire 6. A predetermined etchant for forming contact holes 21a and 21b by removing portions of interlayer insulating film 3 etches upper cell plate electrode 11 at a relatively low etching rate while the predetermined etchant etches interlayer insulating film 3 at a relatively high etching rate.

With reference to FIGS. 1 and 4 to FIG. 9, a manufacturing process for the semiconductor device after the formation of upper cell plate electrode 11 will be described.

Figure 4:
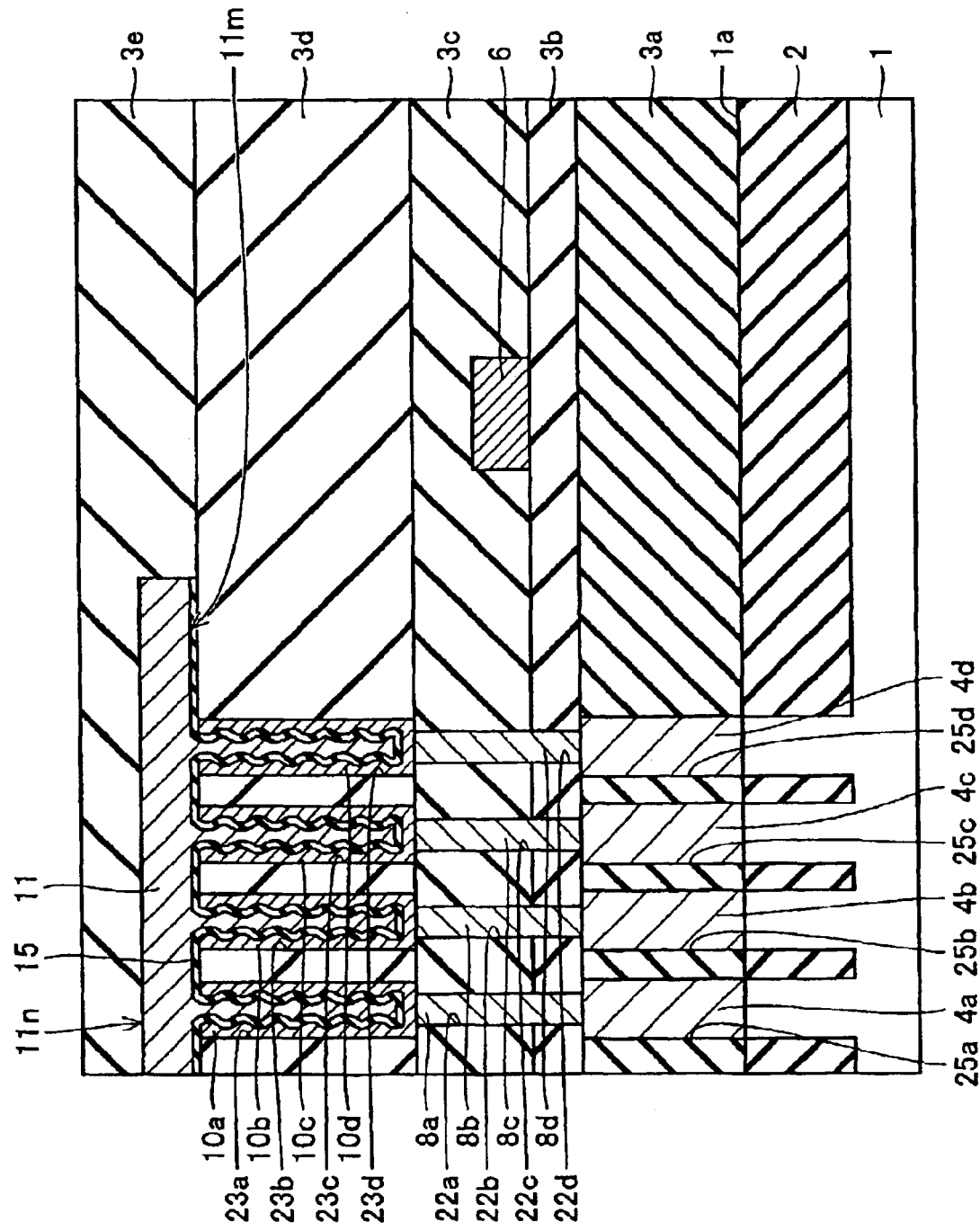
FIGS. 4 to 9 show cross sectional views showing the steps of a manufacturing method for the semiconductor device shown in FIG. 1.

With reference to FIG. 4, an annealing process is carried out on upper cell plate electrode 11 over a predetermined period of time after the formation of upper cell plate electrode 11. Thereby, ruthenium that forms upper cell plate electrode 11 is crystallized so that the crystal grains of ruthenium grow and the diameters thereof are increased. A silicon oxide film having a film thickness of approximately 500 nm is deposited over fourth interlayer insulating film 3d so as to cover upper cell plate electrode 11, and, thereby, fifth interlayer insulating film 3e is formed.

Figure 5:
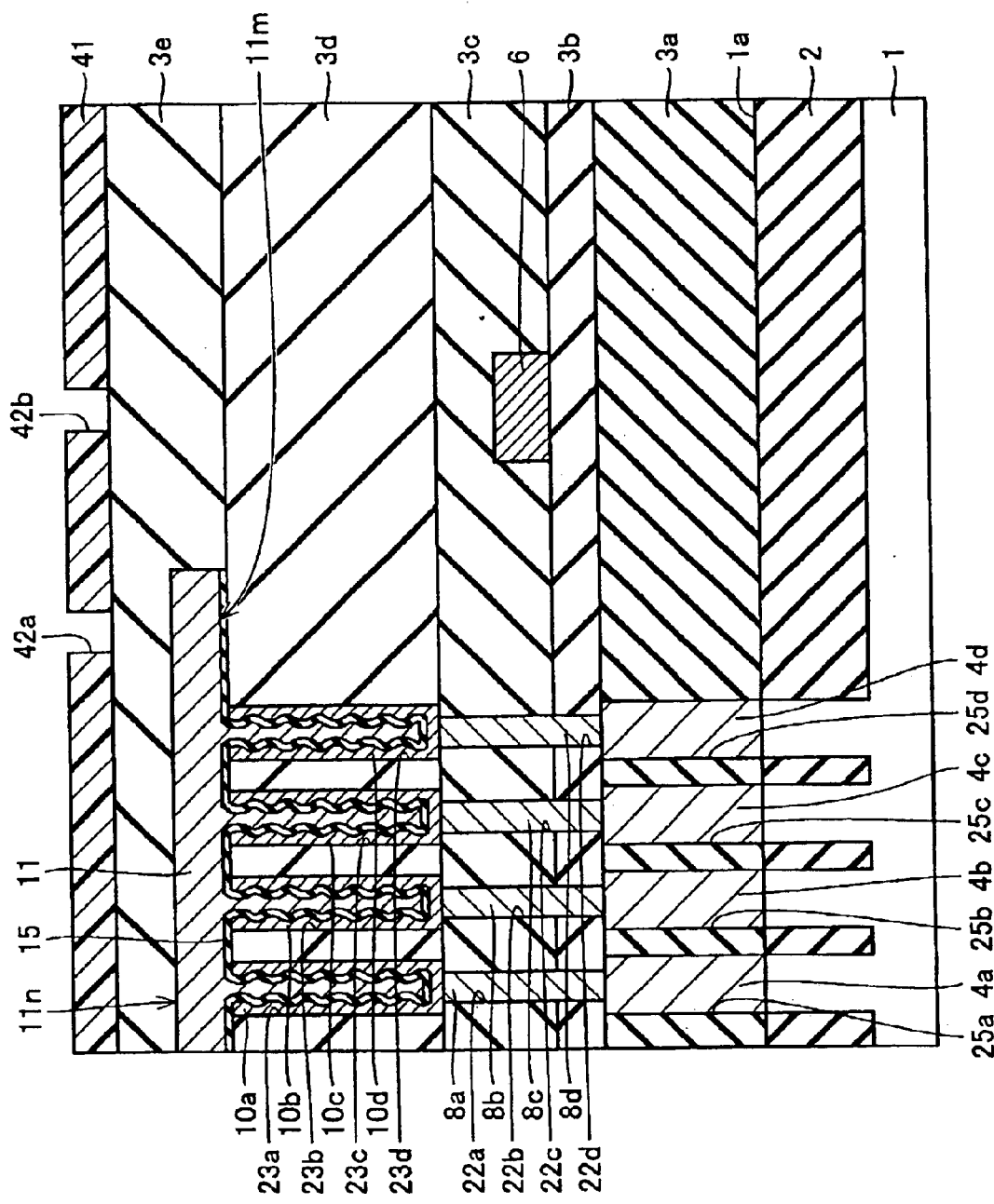

With reference to FIG. 5, a resist film 41 having openings 42a and 42b is formed on fifth interlayer insulating film 3e.

Figure 6:
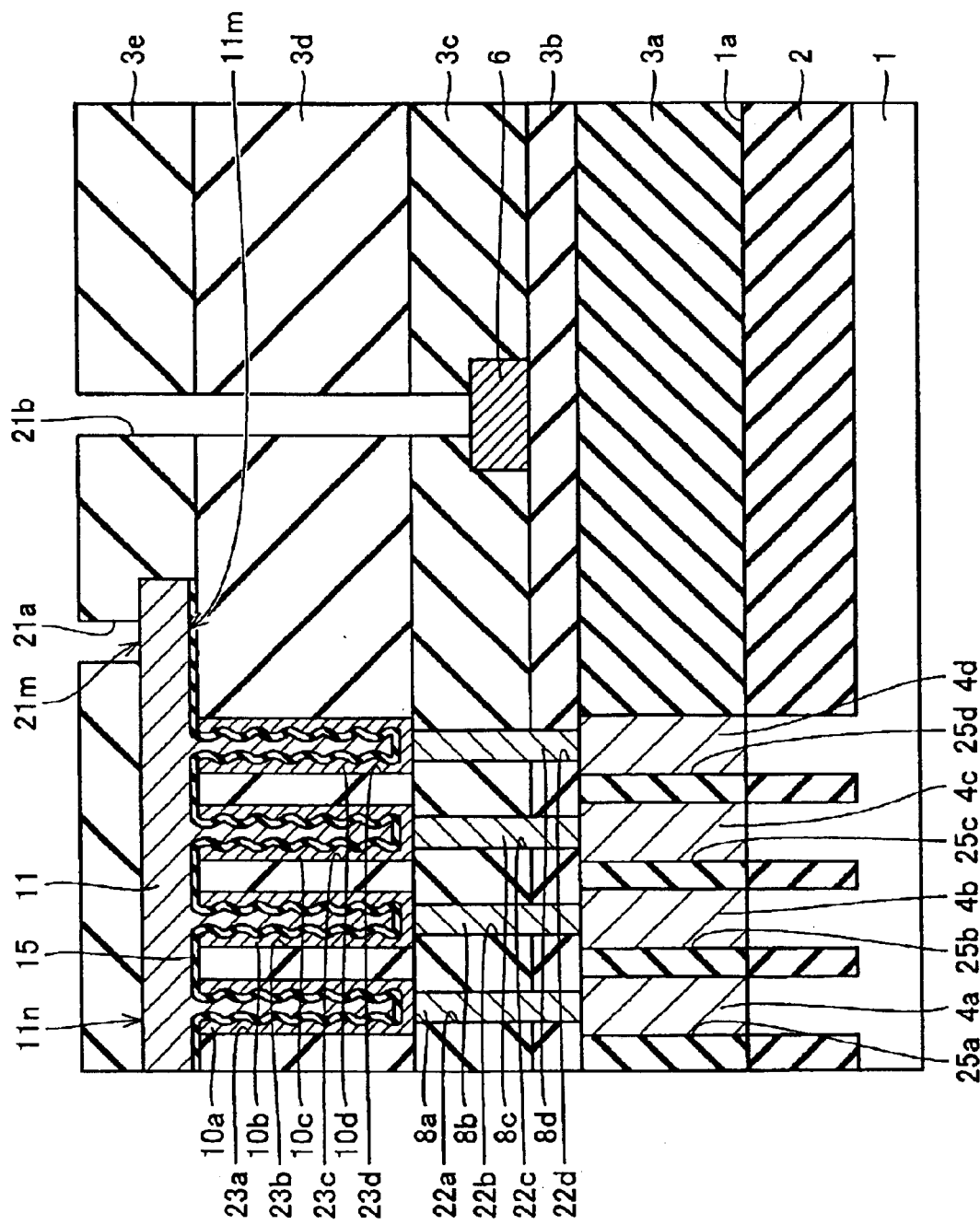

With reference to FIG. 6, etching is carried out on interlayer insulating film 3 using resist film 41 as a mask. A mixed gas of $C_4F_8$, Ar and $O_2$ is utilized as an etching gas. Interlayer insulating film 3 is partially removed through etching and contact hole 21a first reaches top face 1 in of upper cell plate electrode 11. After that, the etching carried out on interlayer insulating film 3 is continued until contact hole 21b reaches bit line wire 6. During this period of time upper cell plate electrode 11 continues to undergo etching in the vicinity of top face 11n. However, ruthenium that forms upper cell plate electrode 11 has a selection ratio of not less than a constant value with respect to etching carried out on interlayer insulating film 3, which is a silicon oxide film, and, therefore, the opening of contact hole 21a stops at top face 11n of upper cell plate electrode 11. Thereby, bottom 21m of contact hole 21a is defined by top face 1 in of upper cell plate electrode 11. After that, resist film 41 is removed.

Figure 7:
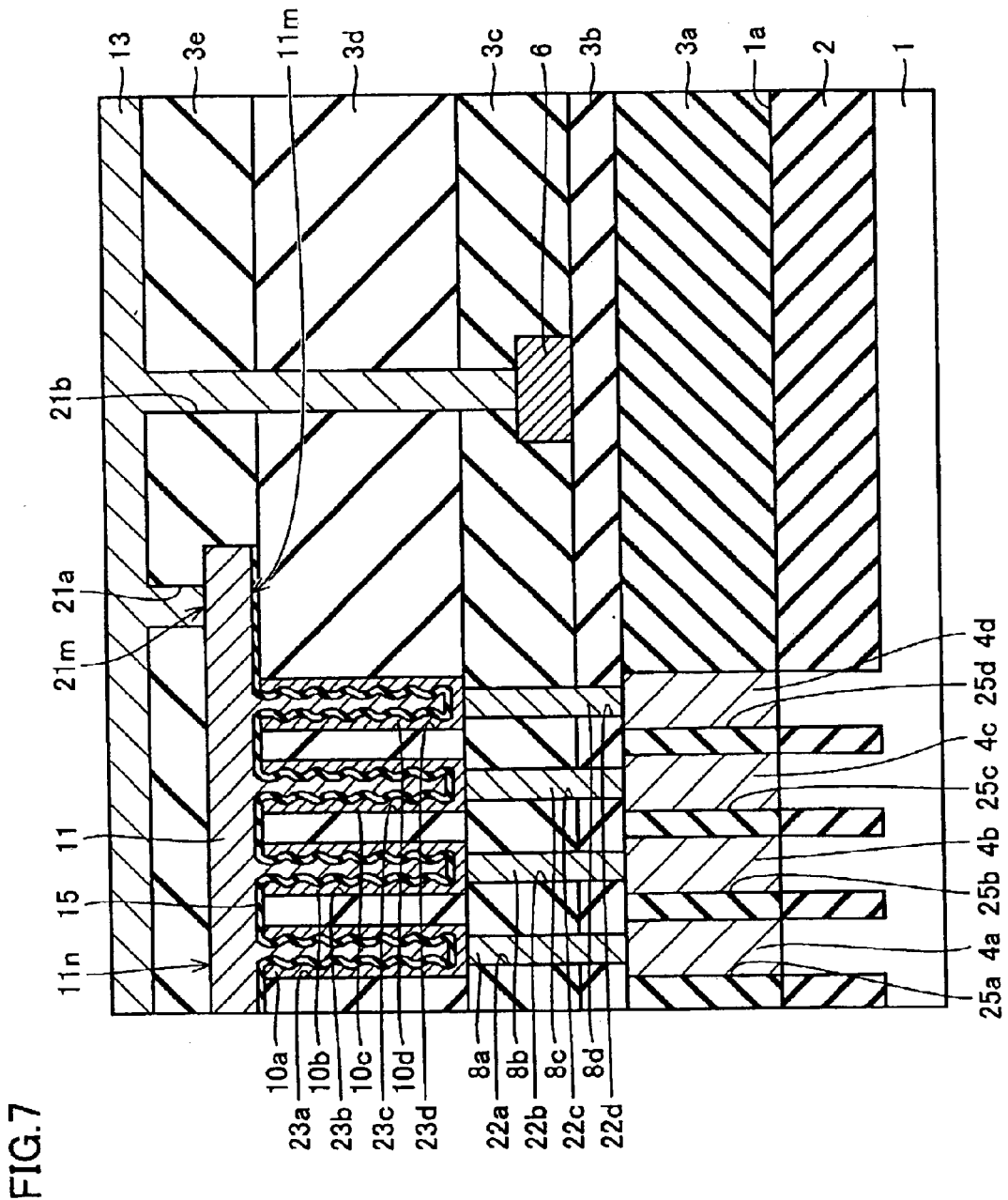

With reference to FIG. 7, a layered film of TiN (titanium nitride) and Ti (titanium), wherein each layer has a film thickness of approximately 10 nm, is deposited in contact holes 21a and 21b so that a barrier metal film, not shown, is formed. Furthermore, a metal film 13 made of tungsten having a film thickness of approximately 500 nm is deposited.

Figure 8:
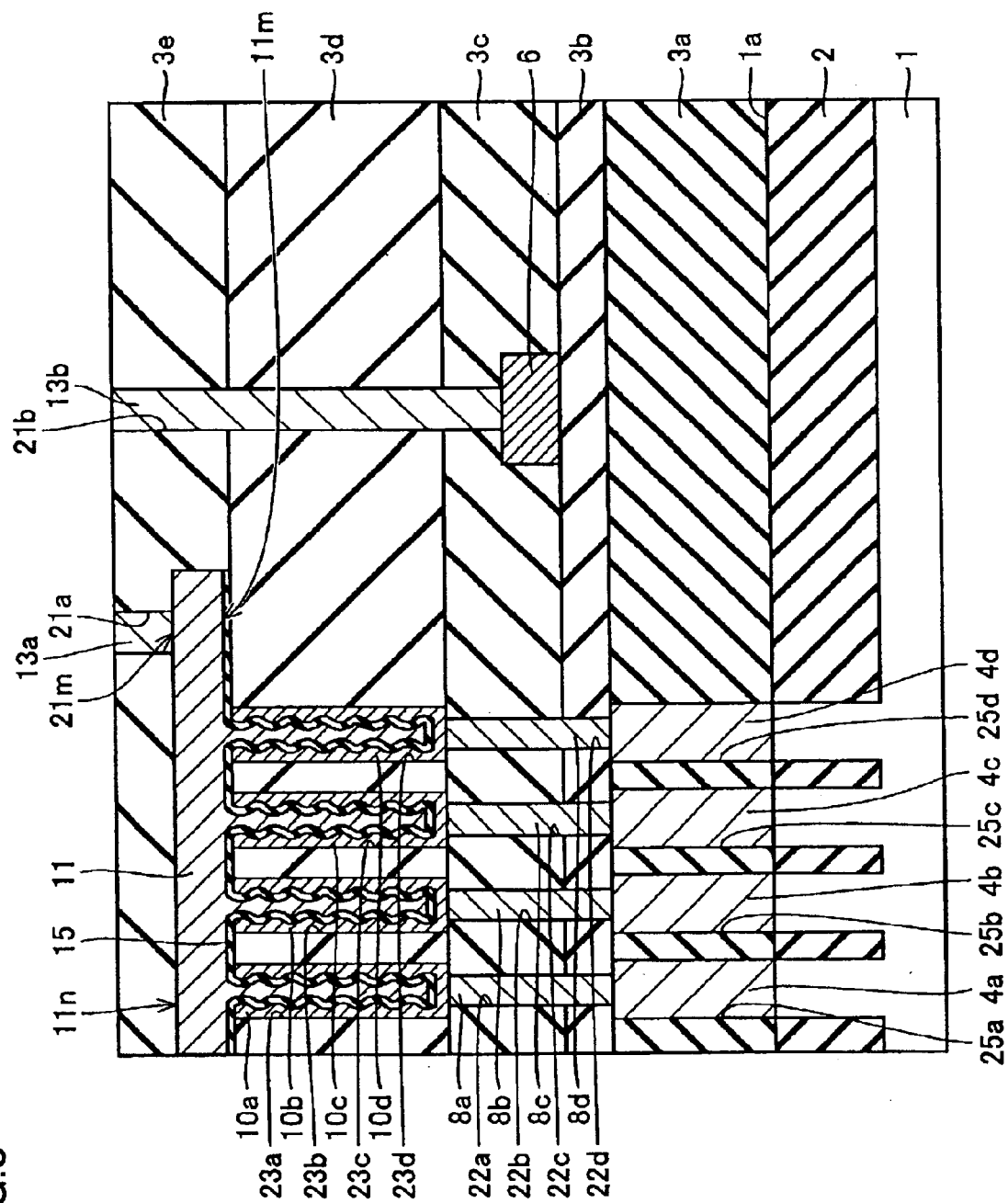

With reference to FIG. 8, metal film 13 is polished until the top face of fifth interlayer insulating film 3e is exposed using chemical mechanical polishing (CMP). Thereby, metal plugs 13a and 13b are formed inside of contact holes 21a and 21b.

Figure 9:
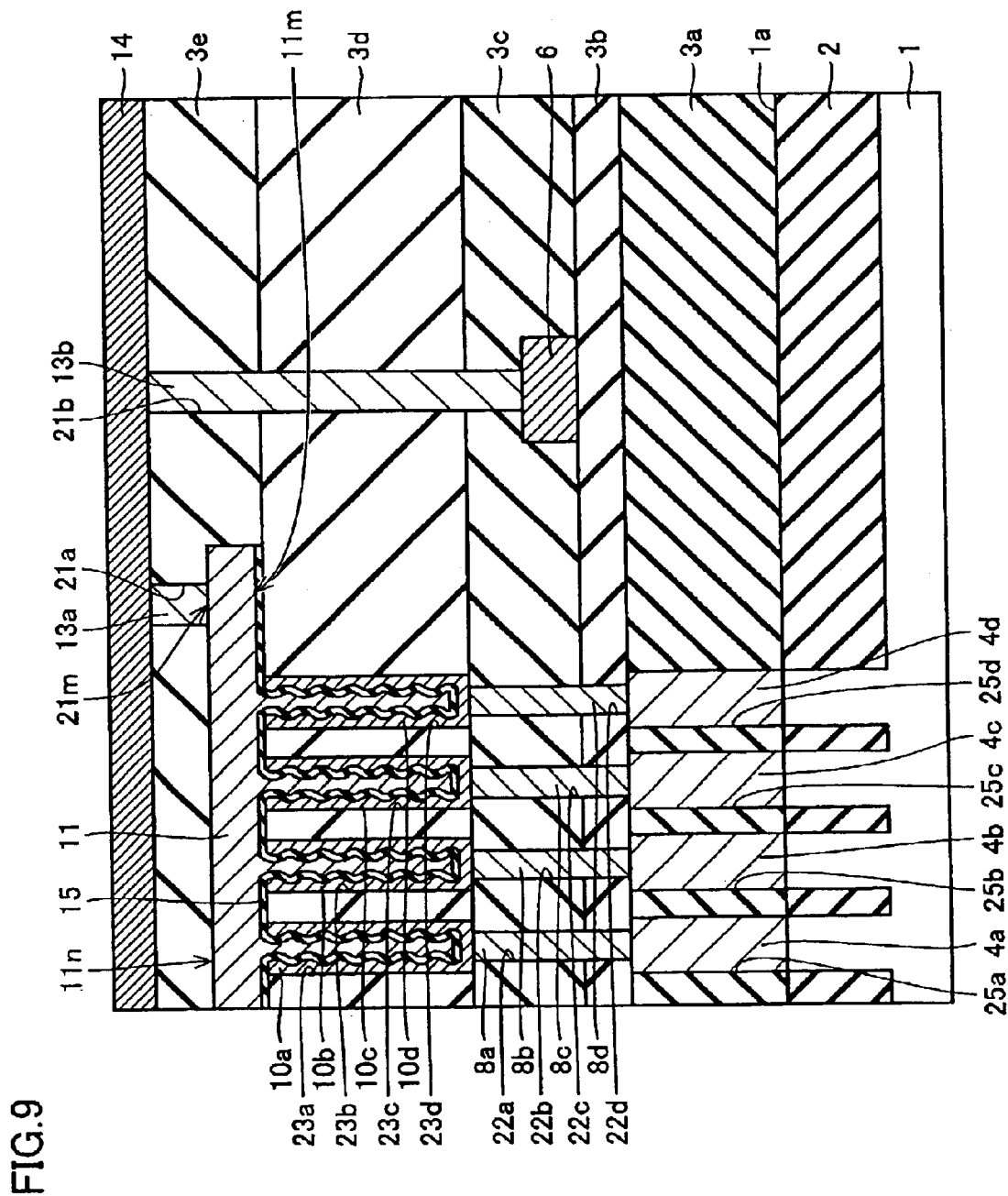

With reference to FIG. 9, an aluminum film 14 having a film thickness of approximately 300 nm is deposited on fifth interlayer insulating film 3e.

With reference to FIG. 1, a resist film, not shown, having an opening pattern in a predetermined form is formed on aluminum film 14. This is used as a mask so as to carry out etching on aluminum film 14 and aluminum wires 14a and 14b are formed in predetermined forms. After that, the resist film, not shown, is removed.

According to the semiconductor device having such a configuration, upper cell plate electrode 11 is formed of ruthenium and, thereby, as for the depth from the opening, contact hole 21a is stopped at top face 11n of upper cell plate electrode 11. Therefore, no specific structure for controlling the depth from the opening of contact hole 21a is required. Thereby, silicon substrate 1 receives no area penalty and, therefore, miniaturization of the semiconductor device can be implemented. In addition, ruthenium, which forms upper cell plate electrode 11, is strongly resistant to oxidation. Furthermore, oxides of ruthenium are conductive. Therefore, contact defects between upper cell plate electrode 11 and metal plug 13a due to oxidation of upper cell plate electrode 11 can be prevented. In addition, metal plug 13a is provided in a manner such that the entirety of the bottom of metal plug 13a makes contact with top face 11n of upper cell plate electrode 11. Therefore, contact defects due to small contact area can be prevented.

In addition, metal plug 13a is formed to have a predetermined depth in a manner that metal plug 13a does not penetrate in a downward direction beyond upper cell plate electrode 11. Therefore, metal plug 13a can be prevented from causing a short circuit by making contact with the conductive film positioned below upper cell plate electrode 11.

Second Embodiment

The contact structure of metal plug 13a and upper cell plate electrode 11 of the semiconductor device according to a second embodiment differs from that of the semiconductor device according to the first embodiment, and that is the only difference between the two. In the following, the same structures will not be described repeatedly.

Figure 10:
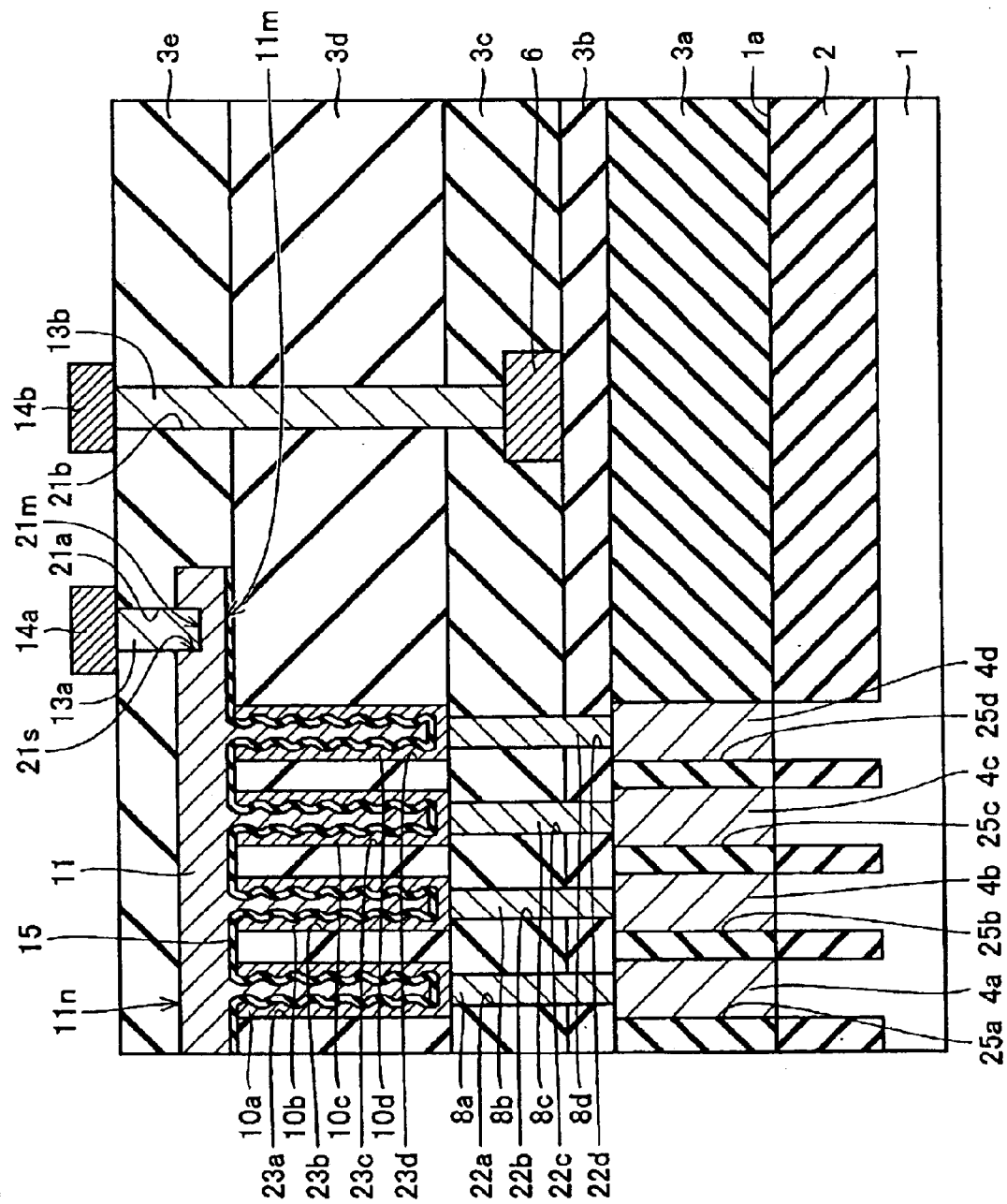
FIG. 10 is a cross sectional view showing a semiconductor device according to a second embodiment of the present invention.

With reference to FIG. 10, contact hole 21a reaching upper cell plate electrode 11 is formed in fifth interlayer insulating film 3e. Contact hole 21a reaches the inside of upper cell plate electrode 11, and side face 21s and bottom 21m of contact hole 21a are defined by upper cell plate electrode 11. Metal plug 13a made of tungsten is formed in contact hole 21a with a barrier metal film intervened there between, not shown.

In the semiconductor device according to the second embodiment of the present invention, at least either side face 21s or bottom 21m of contact hole 21a is defined by upper cell plate electrode 11.

The manufacturing process for the semiconductor device according to the second embodiment is not essentially different from the manufacturing process for the semiconductor device shown in FIG. 1 described in the first embodiment. The steps in the manufacturing process for the semiconductor device according to the second embodiment that differ from the manufacturing process for the semiconductor device according to the first embodiment will be described below. The same steps of the manufacturing processes will not be described repeatedly.

With reference to FIG. 6, etching is carried out on interlayer insulating film 3 using resist film 41 as a mask. A mixed gas of $C_4F_8$, Ar and $O_2$ is utilized as an etching gas. At this time, the amount of flow of $O_2$ is greater than the amount of flow of $O_2$ included in the etching gas utilized in the first embodiment. With reference to FIG. 10, contact hole 21a is formed so as to reach the inside of upper cell plate electrode 11 as a result of the above described process.

According to the semiconductor device having such a configuration, the same effects as the effects described in the first embodiment can be obtained. In addition, upper cell plate electrode 11 and metal plug 13a make contact at side face 21s as well as at bottom 21m of contact hole 21a. Thereby, that area of contact between upper cell plate electrode 11 and metal plug 13a is increased and, therefore, contact defects can further be prevented from generating in upper cell plate electrode 11.

Third Embodiment

The contact structure of metal plug 13a and upper cell plate electrode 11 of the semiconductor device according to a third embodiment differs from that of the semiconductor device according to the first embodiment, and that is the only difference between the two. In the following, the same structures will not be described repeatedly.

Figure 11:
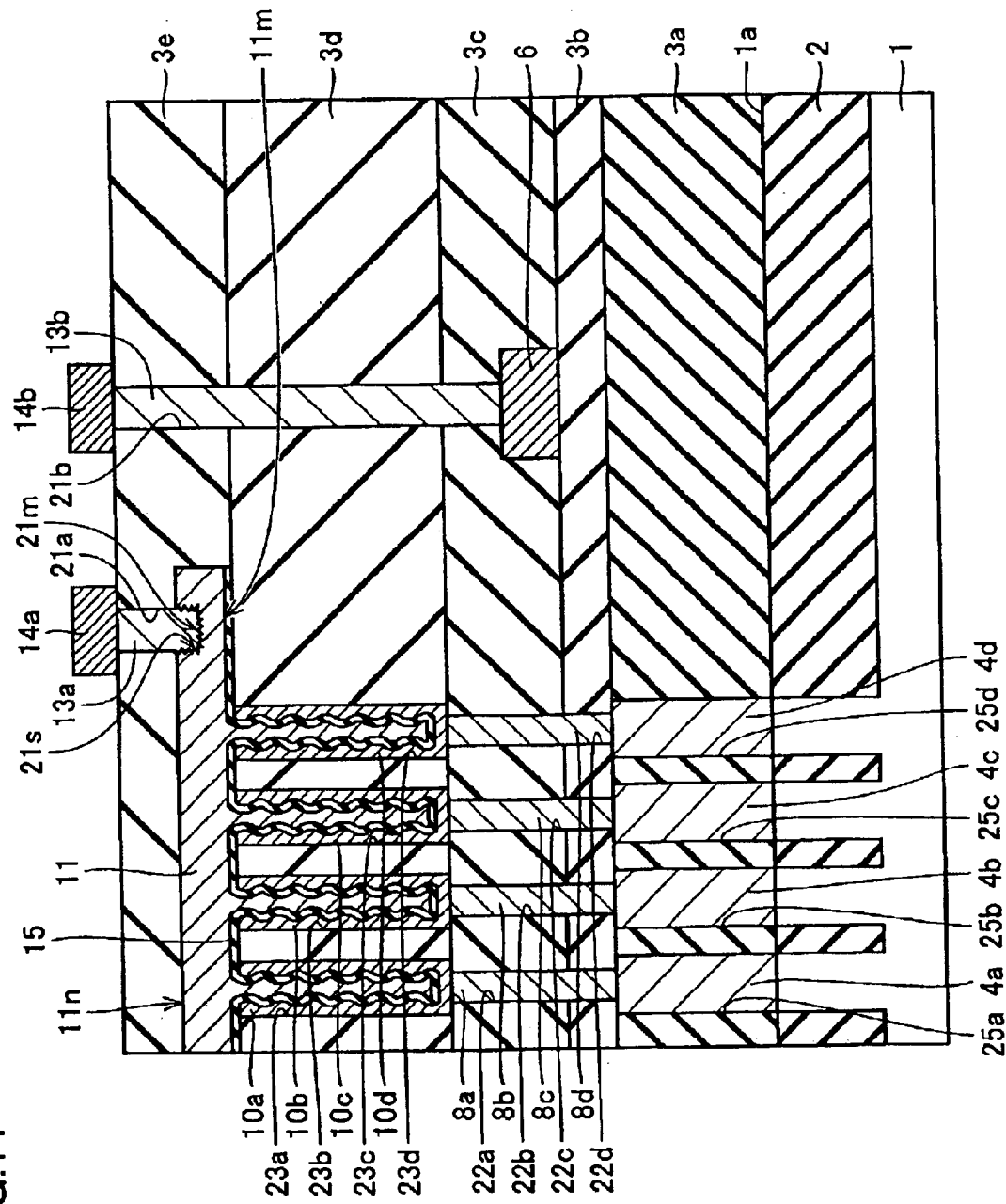
FIG. 11 is a cross sectional view showing a semiconductor device according to a third embodiment of the present invention.

With reference to FIG. 11, contact hole 21a reaching upper cell plate electrode 11 is formed in fifth interlayer insulating film 3e. Contact hole 21a reaches the inside of upper cell plate electrode 11, and side face 21s and bottom 21m of contact hole 21a are defined by upper cell plate electrode 11. Bottom 21m and side face 21s of contact hole 21a have uneven surfaces. Metal plug 13a made of tungsten is formed in contact hole 21a with a barrier metal film intervened there between, not shown.

In the semiconductor device according to the third embodiment of the present invention, the portion of upper cell plate electrode 11 that defines at least either side face 21s or bottom 21m of contact hole 21a has an uneven surface.

The manufacturing process for the semiconductor device according to the third embodiment is not essentially different from the manufacturing process for the semiconductor device shown in FIG. 10 described in the second embodiment. The steps in the manufacturing process for the semiconductor device according to the third embodiment that differ from the manufacturing process for the semiconductor device according to the second embodiment will be described below. The same steps of the manufacturing processes will not be described repeatedly.

With reference to FIG. 4, an annealing process is carried out on upper cell plate electrode 11 for a shorter period of time that the predetermined period of time described in the first embodiment after the formation of upper cell plate electrode 11. Thereby, ruthenium, which forms upper cell plate electrode 11, is crystallized so that the crystal grains of ruthenium grow and the diameters thereof become smaller than those of the crystal grains according to the first embodiment. With reference to FIG. 11, bottom 21m and side face 21s of contact hole 21a become uneven as a result of the above described process.

According to the semiconductor device having such a configuration, the same effects as of the effects according to the second embodiment can be obtained. In addition, bottom 21m and side face 21s of contact hole 21a, which are uneven, have surface areas greater than in the case wherein they are formed to be flat. Therefore, that area of contact between upper cell plate electrode 11 and metal plug 13a can be further increased. Thereby, contact resistance between upper cell plate electrode 11 and metal plug 13a becomes low and stable and, therefore, contact defects can further be prevented from generating in upper cell plate electrode 11.

Fourth Embodiment

The contact structure of metal plug 13a and upper cell plate electrode 11 of the semiconductor device according to a fourth embodiment differs from that of the semiconductor device according to the first embodiment, and that is the only difference between the two. In the following, the same structures will not be described repeatedly.

Figure 12:
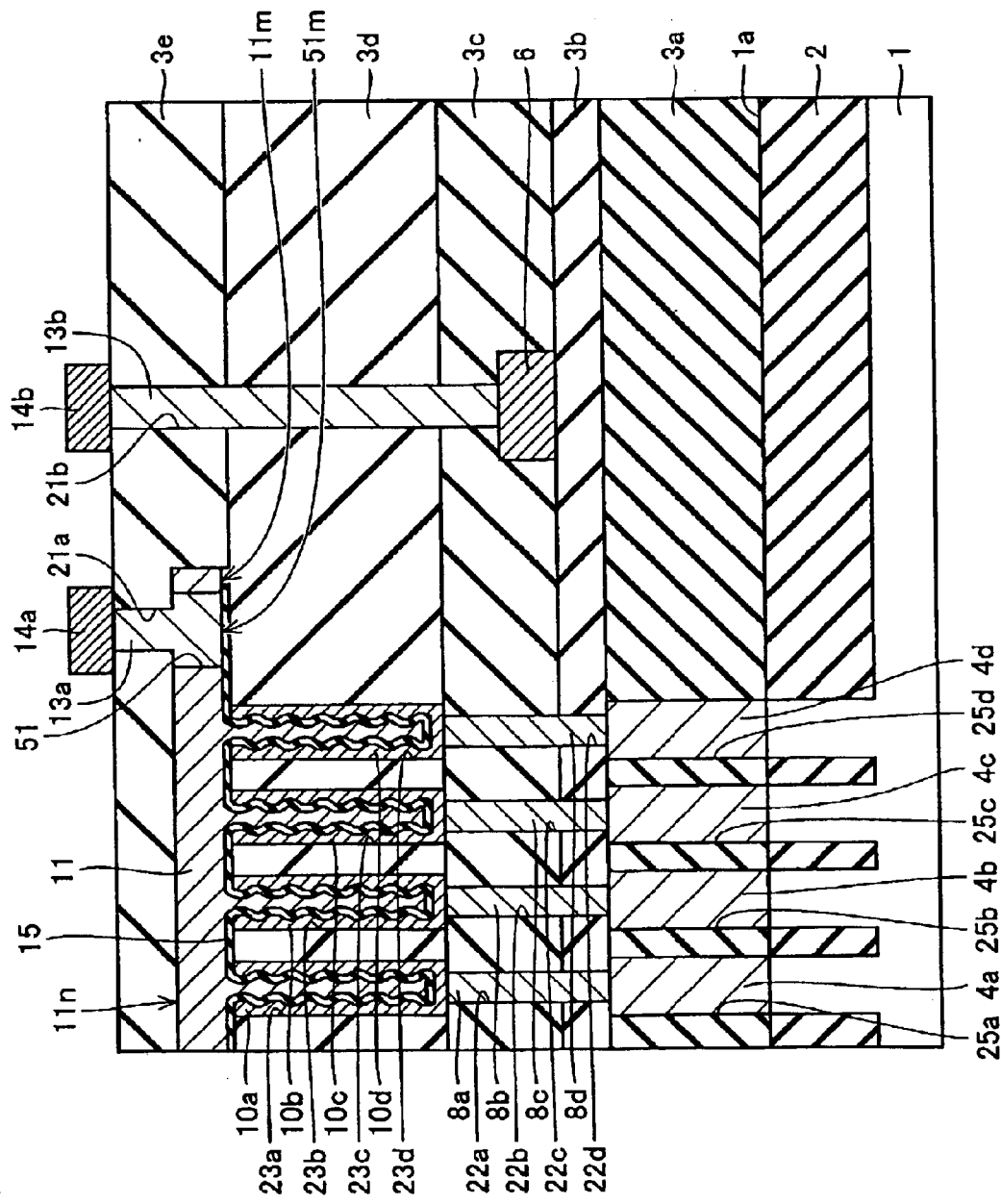
FIG. 12 is a cross sectional view showing a semiconductor device according to a fourth embodiment of the present invention.

With reference to FIG. 12, contact hole 21a reaching upper cell plate electrode 11 is formed in fifth interlayer insulating film 3e. A contact hole 51 that continues to contact hole 21a is formed in upper cell plate electrode 11. Contact hole 51 is formed so that bottom 51m of contact hole 51 has an area greater than that of the bottom of contact hole 21a. Contact hole 51 has an opening with the area of bottom 51m ranging from the bottom 11m side face to the top face 1 in side face in upper cell plate electrode 11. Metal plug 13a made of tungsten is formed in contact holes 21a and 51 with a barrier metal film intervened there between, not shown.

In the semiconductor device according to the fourth embodiment of the present invention, upper cell plate electrode 11 has contact hole 51 as a first recess. Contact hole 51 is connected to contact hole 21a and is formed so that the area of the opening in a plane parallel to main surface 1a of silicon substrate 1 becomes greater than the area of the opening at the bottom of contact hole 21a.

The manufacturing process for the semiconductor device according to the fourth embodiment is not essentially different from the manufacturing process for the semiconductor device shown in FIG. 1 described in the first embodiment. The steps in the manufacturing process for the semiconductor device according to the fourth embodiment that differ from the manufacturing process for the semiconductor device according to the first embodiment will be described below. The same steps of the manufacturing processes will not be described repeatedly.

With reference to FIG. 6, etching is carried out on interlayer insulating film 3 using resist film 41 as a mask. A mixed gas of $C_4F_8$, Ar and $O_2$ is utilized as an etching gas. Ruthenium that forms upper cell plate electrode 11 has a selection ratio of not less than a constant value with respect to etching carried out on interlayer insulating film 3, which is a silicon oxide film, and, therefore, the opening of contact hole 21a stops at top face 11n of upper cell plate electrode 11. However, upper cell plate electrode 11 continues to be etched from top face 11n and, therefore, receives considerable damage starting from top face 11n, which has been exposed from contact hole 21a, of upper cell plate electrode 11 to the inside of upper cell plate electrode 11. Under such a condition, plasma ashing is carried out on resist film 41 utilizing a mixed gas of $O_2$ and $N_2$. With reference to FIG. 12, the plasma ashing carried out on resist film 41 removes the damaged portion of upper cell plate electrode 11, in addition to resist film 41. Thereby, contact hole 51 is formed in upper cell plate electrode 11 reaching from the top face 11n side to the bottom 11m side.

According to the semiconductor device having such a configuration, the same effects as the effects according to the first embodiment can be obtained. In addition, contact hole 51 formed in upper cell plate electrode 11 increases the area of contact between upper cell plate electrode 11 and metal plug 13a. Thereby, the contact resistance of upper cell plate electrode 11 becomes low and stable, so that contact defects can be prevented from generating in upper cell plate electrode 11.

Fifth Embodiment

The contact structure of metal plug 13a and upper cell plate electrode 11 of the semiconductor device according to a fifth embodiment differs from that of the semiconductor device according to the first embodiment, and that is the only difference between the two. In the following, the same structures will not be described repeatedly.

Figure 13:
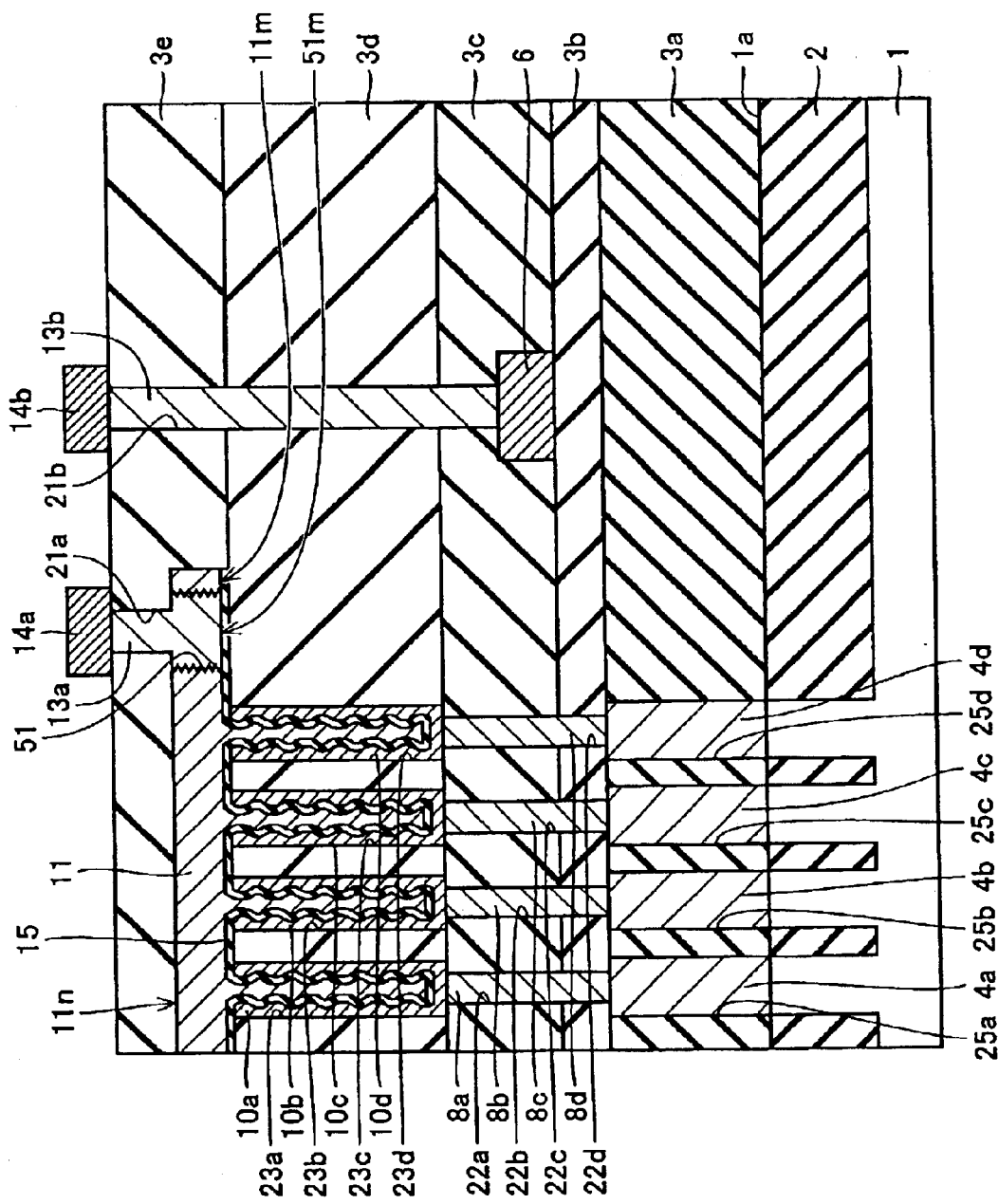
FIG. 13 is a cross sectional view showing a semiconductor device according to a fifth embodiment of the present invention.

With reference to FIG. 13, contact hole 21a reaching upper cell plate electrode 11 is formed in fifth interlayer insulating film 3e. A contact hole 51 that continues to contact hole 21a is formed in upper cell plate electrode 11. Contact hole 51 is formed so that bottom 51m of contact hole 51 has an area greater than that at the bottom of contact hole 21a. Contact hole 51 has an opening with the area of bottom 51m ranging from the bottom 11m side to the top face 11n side in upper cell plate electrode 11. The side face of contact hole 51 is formed so as to be uneven. Metal plug 13a made of tungsten is formed in contact holes 21a and 51 with a barrier metal film intervened there between, not shown.

In the semiconductor device according to the fifth embodiment of the present invention, the surface of contact hole 51 is formed so as to be uneven.

A manufacturing process for the semiconductor device according to the fifth embodiment is essentially the same as the manufacturing process for the semiconductor device shown in FIG. 12 described in the fourth embodiment. The portion of the manufacturing process for the semiconductor device according to the fifth embodiment that differs from the manufacturing process for the semiconductor device according to the fourth embodiment will be described below. The manufacturing process will not be described repeatedly.

With reference to FIG. 4, an annealing process is carried out, after the formation of upper cell plate electrode 11, on upper cell plate electrode 11 for a period of time that is shorter than the predetermined period of time described in the first embodiment. Thereby, ruthenium forming upper cell plate electrode 11 is crystallized so that the crystal grains of ruthenium grow to have diameters that are smaller than the diameters of the crystal grains described in the first embodiment. With reference to FIG. 13, the side face of contact hole 51 defined by upper cell plate electrode 11 is formed so as to be uneven according to the above described process.

The semiconductor device having such a configuration can obtain the same effects as the effects described in the fourth embodiment. In addition, the side face of contact hole 51, which has been formed to be uneven, has a surface area greater than that in the case wherein it is formed to be flat. Therefore, the area of contact between upper cell plate electrode 11 and metal plug 13a can be further increased. Thereby, the contact resistance between upper cell plate electrode 11 and metal plug 13a becomes low and stable so that contact defects can be further prevented from generating in upper cell plate electrode 11.

Sixth Embodiment

The contact structure of metal plug 13a and upper cell plate electrode 11 of the semiconductor device according to a sixth embodiment differs from that of the semiconductor device according to the first embodiment, and that is the only difference between the two. In the following, the same structures will not be described repeatedly.

Figure 14:
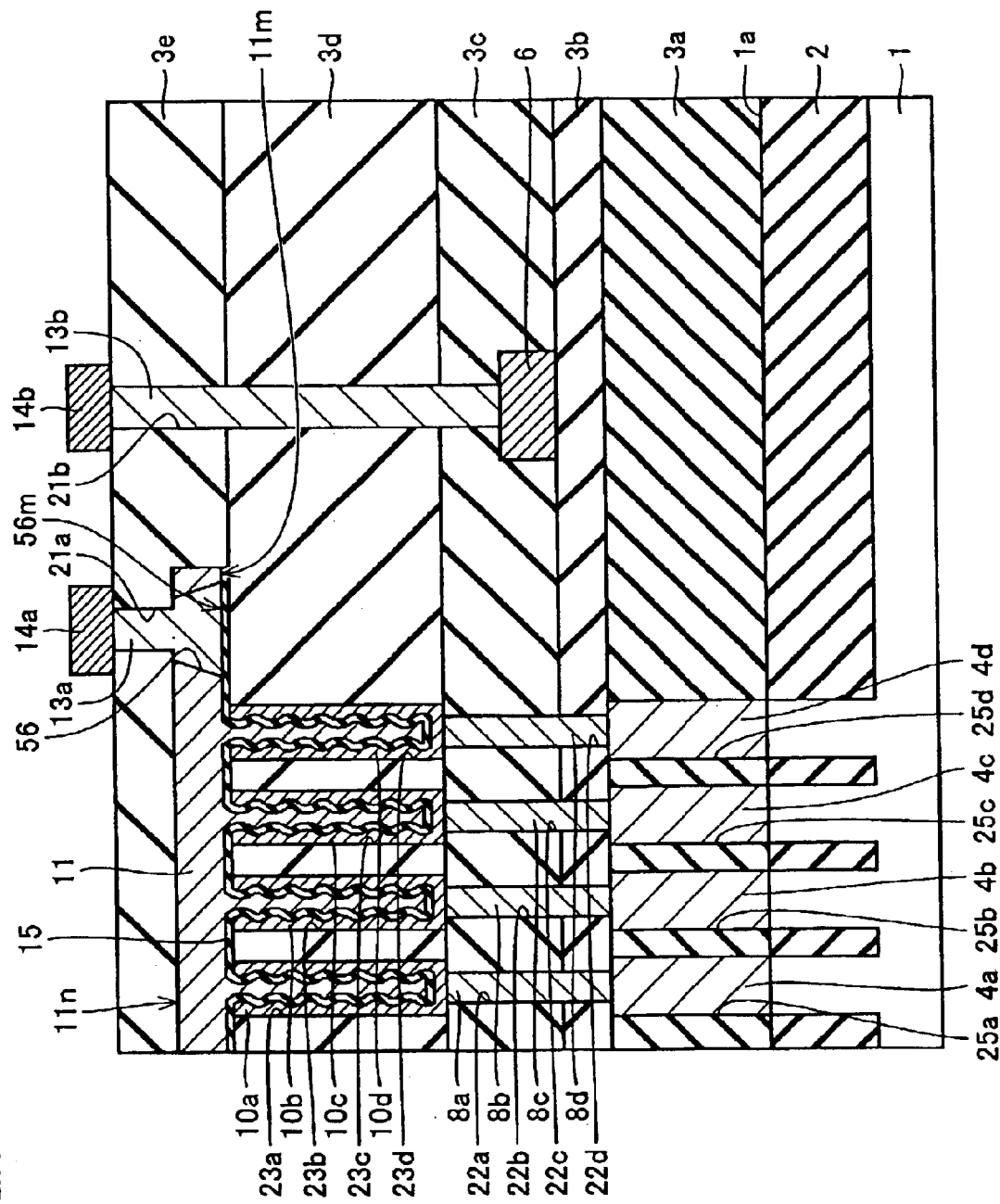
FIG. 14 is a cross sectional view showing a semiconductor device according to a sixth embodiment of the present invention.

With reference to FIG. 14, contact hole 21a reaching upper cell plate electrode 11 is formed in fifth interlayer insulating film 3e. A contact hole 56 that continues to contact hole 21a is formed in upper cell plate electrode 11, so as to extend from the top face 11n side through the bottom face 11m side of upper cell plate electrode 11. The area of the opening of contact hole 56 in a plane parallel to main surface 1a of silicon substrate 1 is always greater than the area at the bottom of contact hole 21a. Then, contact hole 56 is formed so that the farther the opening thereof is away from contact hole 21a, the greater becomes the area of the opening. Metal plug 13a made of tungsten is formed in contact holes 21a and 56 via a barrier metal film, not shown.

In the semiconductor device according to the sixth embodiment of the present invention, contact hole 56, as the first recess, is formed so that the area of the opening of contact hole 56 in a plane parallel to main surface 1a of silicon substrate 1 becomes greater as the position of the opening becomes closer to bottom face 11m from the top 1 in of upper cell plate electrode 11.

A manufacturing process for the semiconductor device according to the sixth embodiment is essentially the same as the manufacturing process for the semiconductor device shown in FIG. 1 described in the first embodiment. The portion of the manufacturing process for the semiconductor device according to the sixth embodiment that differs from the manufacturing process for the semiconductor device according to the first embodiment will be described below. The manufacturing process will not be described repeatedly.

With reference to FIG. 6, etching is carried out on interlayer insulating film 3 using resist film 41 as a mask. A mixed gas of $C_4F_8$, Ar and $O_2$ is utilized as an etching gas. Ruthenium that forms upper cell plate electrode 11 has a selection ratio of not less than a constant value with respect to etching carried out on interlayer insulating film 3, which is a silicon oxide film, and, therefore, the opening of contact hole 21a stops at top face 11n of upper cell plate electrode 11. However, upper cell plate electrode 11 continues to be etched from top face 11n and, therefore, receives considerable damage starting from top face 11n, which has been exposed from contact hole 21a, of upper cell plate electrode 11 to the inside of upper cell plate electrode 11. Then, plasma ashing is carried out on resist film 41 utilizing a mixed gas of $O_2$ and $N_2$ as enchants in a parallel-plate-type unit. At this time, the etchant having a weak directivity enters from the opening of contact hole 21a so as to spread to the outside by weakening the bias on the silicon substrate 1 side. With reference to FIG. 14, the plasma ashing carried out on resist film 41 removes the damaged portion of upper cell plate electrode 11, in addition to resist film 41. According to the above described process, contact hole 56 is formed in upper cell plate electrode 11 so as to spread, from the top face 11n side to the bottom face 11m side, in a tapered form.

According to the semiconductor device having such a configuration, the same effects as the effects according to the fourth embodiment can be obtained. In addition, contact hole 56 is formed in a tapered form and, therefore, increases the area of contact between upper cell plate electrode 11 and metal plug 13a. Thereby, the contact resistance of upper cell plate electrode 11 becomes low and stable, so that contact defects can be further prevented from generating in upper cell plate electrode 11.

Seventh Embodiment

The contact structure of metal plug 13a and upper cell plate electrode 11 of the semiconductor device according to a seventh embodiment differs from that of the semiconductor device according to the first embodiment, and that is the only difference between the two. In the following, the same structures will not be described repeatedly.

Figure 15:
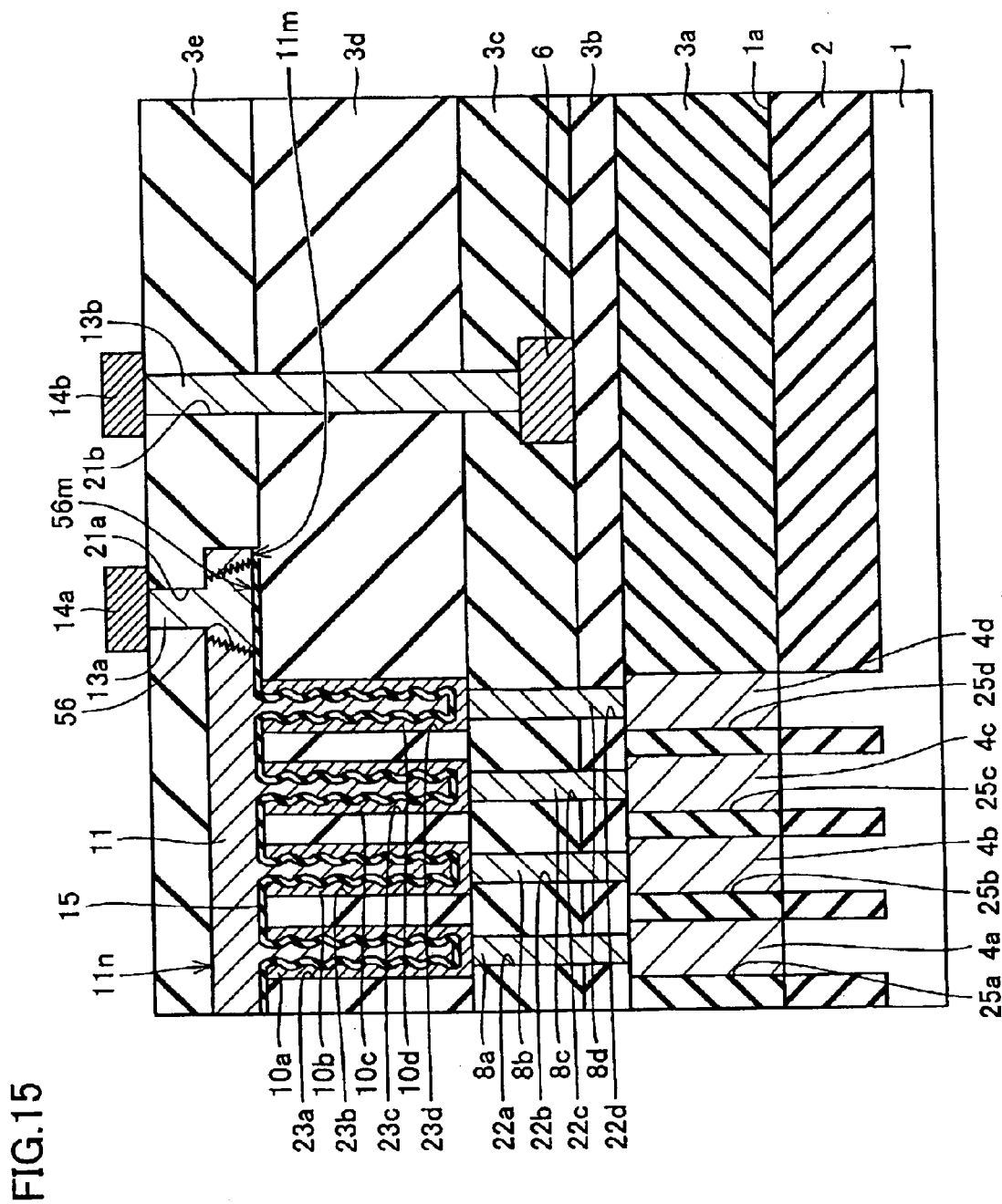
FIG. 15 is a cross sectional view showing a semiconductor device according to a seventh embodiment of the present invention.

With reference to FIG. 15, contact hole 21a reaching upper cell plate electrode 11 is formed in fifth interlayer insulating film 3e. A contact hole 56 that continues to contact hole 21a is formed in upper cell plate electrode 11, so as to extend from the top face 11n side through the bottom face 11m side of upper cell plate electrode 11. The area of the opening of contact hole 56 in a plane parallel to main surface 1a of silicon substrate 1 is always greater than the area at the bottom face of contact hole 21a. Then, contact hole 56 is formed so that the farther the opening thereof is away from contact hole 21a, the greater becomes the area of the opening. The side face of contact hole 56 has an uneven surface. Metal plug 13a made of tungsten is formed in contact holes 21a and 56 via a barrier metal film, not shown.

A manufacturing process for the semiconductor device according to the seventh embodiment is essentially the same as the manufacturing process for the semiconductor device shown in FIG. 14 described in the sixth embodiment. The portion of the manufacturing process for the semiconductor device according to the seventh embodiment that differs from the manufacturing process for the semiconductor device according to the sixth embodiment will be described below. The manufacturing process will not be described repeatedly.

With reference to FIG. 4, an annealing process is carried out, after the formation of upper cell plate electrode 11, on upper cell plate electrode 11 for a period of time that is shorter than the predetermined period of time described in the first embodiment. Thereby, ruthenium forming upper cell plate electrode 11 is crystallized so that the crystal grains of ruthenium grow to have diameters that are smaller than the diameters of the crystal grains described in the first embodiment. With reference to FIG. 15, the side face of contact hole 56 defined by upper cell plate electrode 11 is formed so as to be uneven according to the above described process.

The semiconductor device having such a configuration can obtain the same effects as the effects described in the sixth embodiment. In addition, the side face of contact hole 56, which has been formed to be uneven, has a surface area greater than that in the case wherein it is formed to be flat. Therefore, the area of contact between upper cell plate electrode 11 and metal plug 13a can be further increased. Thereby, the contact resistance between upper cell plate electrode 11 and metal plug 13a becomes low and stable so that contact defects can be further prevented from generating in upper cell plate electrode 11.

Eighth Embodiment

The contact structure of metal plug 13a and upper cell plate electrode 11 of the semiconductor device according to an eighth embodiment differs from that of the semiconductor device according to the first embodiment, and that is the only difference between the two. In the following, the same structures will not be described repeatedly.

Figure 16:
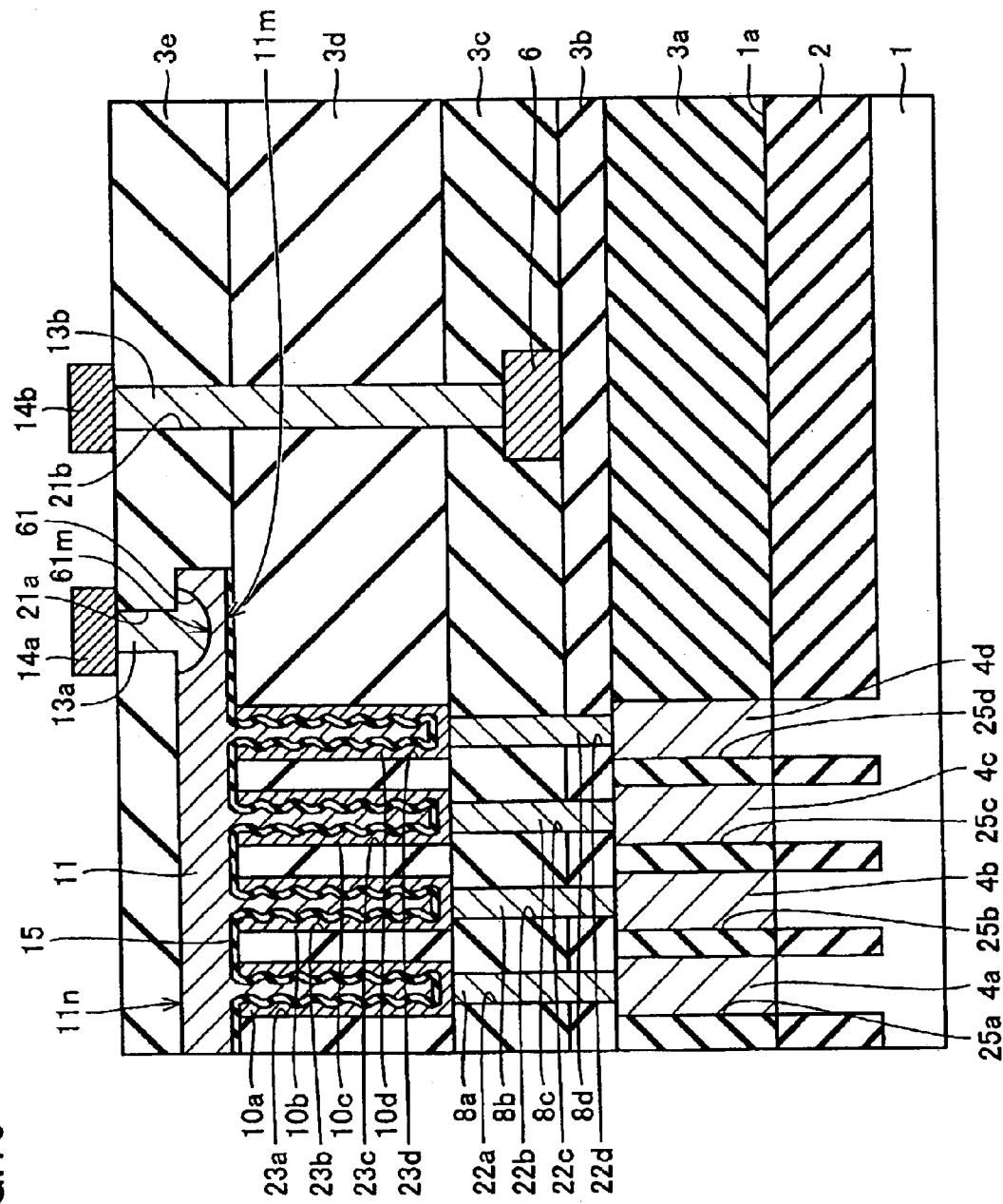
FIG. 16 is a cross sectional view showing a semiconductor device according to an eighth embodiment of the present invention.

With reference to FIG. 16, contact hole 21a reaching upper cell plate electrode 11 is formed in fifth interlayer insulating film 3e. A contact hole 61 that continues to contact hole 21a is formed in upper cell plate electrode 11. Contact hole 61 is formed so that the area of the opening in upper cell plate electrode 11 on the top face 11n side is greater than the area at the bottom face of contact hole 21a. Surface 61m of contact hole 61 defined by upper cell plate electrode 11 is a curved surface. Metal plug 13a made of tungsten is formed in contact holes 21a and 61 via a barrier metal film, not shown.

In the semiconductor device according to the eighth embodiment of the present invention, upper cell plate electrode 11 has contact hole 61 as a second recess. Contact hole 61 is connected to contact hole 21a and is formed so that the area of the opening at top face 11a of upper cell plate electrode 11 is greater than the area of the opening at the bottom of contact hole 21a. Contact hole 61 is defined by the curved surface of upper cell electrode 11.

A manufacturing process for the semiconductor device according to the eighth embodiment is essentially the same as the manufacturing process for the semiconductor device shown in FIG. 1 described in the first embodiment. The portion of the manufacturing process for the semiconductor device according to the eighth embodiment that differs from the manufacturing process for the semiconductor device according to the first embodiment will be described below. The manufacturing process will not be described repeatedly.

With reference to FIG. 6, etching is carried out on interlayer insulating film 3 using resist film 41 as a mask. A mixed gas of $C_4F_8$, Ar and $O_2$ is utilized as an etching gas. Ruthenium that forms upper cell plate electrode 11 has a selection ratio of not less than a constant value with respect to etching carried out on interlayer insulating film 3, which is a silicon oxide film, and, therefore, the opening of contact hole 21a stops at top face 11n of upper cell plate electrode 11. However, upper cell plate electrode 11 continues to be etched from top face 11n and, therefore, receives considerable damage starting from top face 11n, which has been exposed from contact hole 21a, of upper cell plate electrode 11 to the inside of upper cell plate electrode 11. Then, plasma ashing is carried out on resist film 41 utilizing a mixed gas of $O_2$. With reference to FIG. 12, the plasma ashing carried out on resist film 41 removes the damaged portion of upper cell plate electrode 11, in addition to resist film 41. According to the above described process, contact hole 61 defined by a curved surface is formed in upper cell plate electrode 11 so as to extend from the top face 11n side to the inside of upper cell plate electrode 11.

According to the semiconductor device having such a configuration, the same effects as the effects according to the first embodiment can be obtained. In addition, contact hole 61 formed in upper cell plate electrode 11 increases the area of contact between upper cell plate electrode 11 and metal plug 13a. Thereby, the contact resistance of upper cell plate electrode 11 becomes low and stable, so that contact defects can be further prevented from generating in upper cell plate electrode 11.

Ninth Embodiment

The contact structure of metal plug 13a and upper cell plate electrode 11 of the semiconductor device according to a ninth embodiment differs from that of the semiconductor device according to the first embodiment, and that is the only difference between the two. In the following, the same structures will not be described repeatedly.

Figure 17:
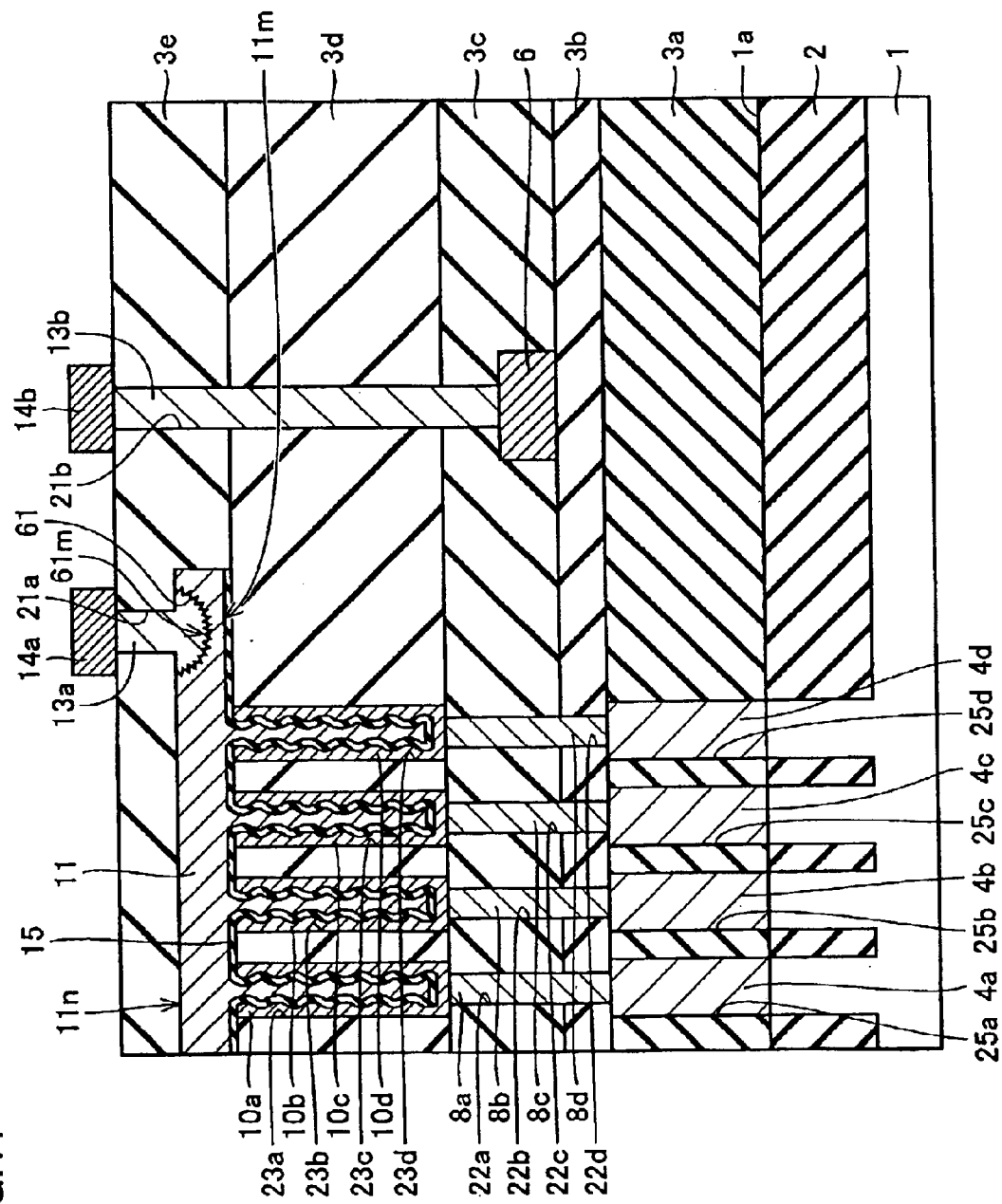
FIG. 17 is a cross sectional view showing a semiconductor device according to a ninth embodiment of the present invention.

With reference to FIG. 17, contact hole 21a reaching upper cell plate electrode 11 is formed in fifth interlayer insulating film 3e. A contact hole 61 that continues to contact hole 21a is formed in upper cell plate electrode 11. Contact hole 61 is formed so that the area of the opening in upper cell plate electrode 11 on the top face 11n side is greater than the area at the bottom of contact hole 21a. Surface 61m of contact hole 61 defined by upper cell plate electrode 11 is a curved surface. In addition, surface 61m of contact hole 61 is uneven. Metal plug 13a made of tungsten is formed in contact holes 21a and 61 via a barrier metal film, not shown.

In the semiconductor device according to the ninth embodiment of the present invention, the surface defining contact hole 61 is uneven.

A manufacturing process for the semiconductor device according to the ninth embodiment is essentially the same as the manufacturing process for the semiconductor device shown in FIG. 16 described in the eighth embodiment. The portion of the manufacturing process for the semiconductor device according to the ninth embodiment that differs from the manufacturing process for the semiconductor device according to the eighth embodiment will be described below. The manufacturing process will not be described repeatedly.

With reference to FIG. 4, an annealing process is carried out, after the formation of upper cell plate electrode 11, on upper cell plate electrode 11 for a period of time that is shorter than the predetermined period of time described in the first embodiment. Thereby, ruthenium forming upper cell plate electrode 11 is crystallized so that the crystal grains of ruthenium grow to have diameters that are smaller than the diameters of the crystal grains described in the first embodiment. With reference to FIG. 17, surface 61m of contact hole 61 defined by upper cell plate electrode 11 is formed so as to be uneven according to the above described process.

According to the semiconductor device having such a configuration, the same effects as the effects according to the eighth embodiment can be obtained. In addition, uneven surface 61m of contact hole 61 has the surface area greater than in the case wherein a contact hole is formed so as to have a flat surface. Accordingly, the area of contact between upper cell plate electrode 11 and metal plug 13a can be increased. Thereby, the contact resistance between upper cell plate electrode 11 and metal plug 13a becomes low and stable, so that contact defects can be further prevented from generating in upper cell plate electrode 11.

Tenth Embodiment

The capacitor structure of the semiconductor device according to a tenth embodiment differs from that of the semiconductor device according to the first embodiment, and that is the only difference between the two. In the following, the same structures will not be described repeatedly.

Figure 18:
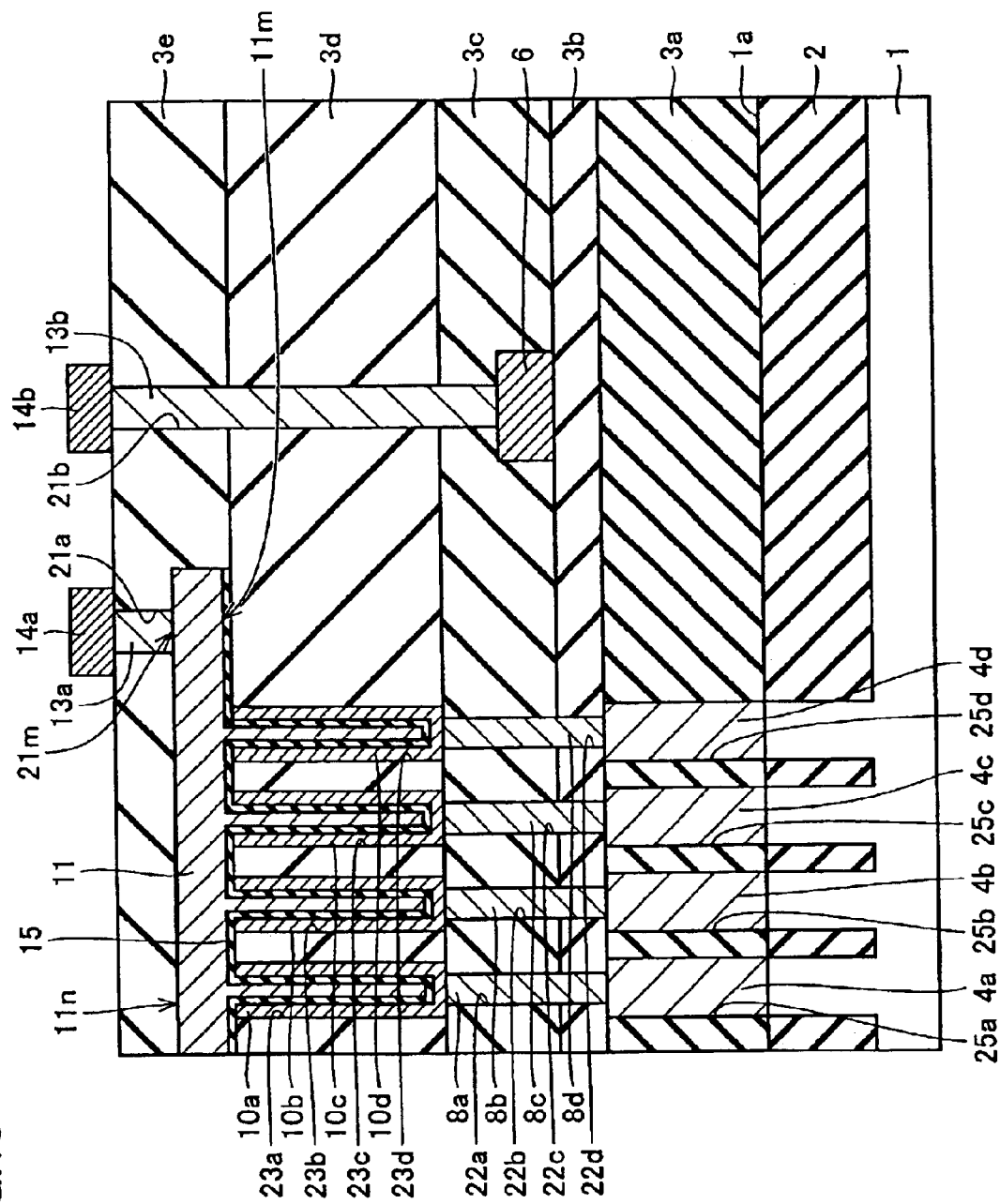
FIG. 18 is a cross sectional view showing a semiconductor device according to a tenth embodiment of the present invention.

With reference to FIG. 18 a semiconductor device has a concave MIM (metal-insulator-metal) capacitor. Holes 23a to 23d are formed in fourth interlayer insulating film 3d so as to reach the respective top faces of storage node contacts 8a to 8d. Lower storage node electrodes 10a to 10d made of ruthenium (Ru) are formed in holes 23a to 23d so as to cover the bottoms and the sidewalls of holes 23a to 23d. Furthermore, recesses are formed in lower storage node electrodes 10a to 10d, located in holes 23a to 23d, and the surfaces resulting from the formation of these recesses are flat.

A dielectric film 15 made of tantalum oxide ($Ta_2O_5$) or barium strontium tantalum oxide (BST) is formed so as to cover the recesses formed in lower storage node electrode 10a to 10d and a portion of the top face of fourth interlayer insulating film 3d. An upper cell plate electrode 11 made of ruthenium (Ru) is formed so as to cover dielectric film 15 and so as to completely fill in holes 23a to 23d. Lower storage node electrodes 10a to 10d, dielectric film 15 and upper cell plate electrode 11 form the concave MIM capacitor of the semiconductor device.

According to the semiconductor device having such a configuration, the same effects as the effects according to the first embodiment can be obtained.

Eleventh Embodiment

Figure 19:
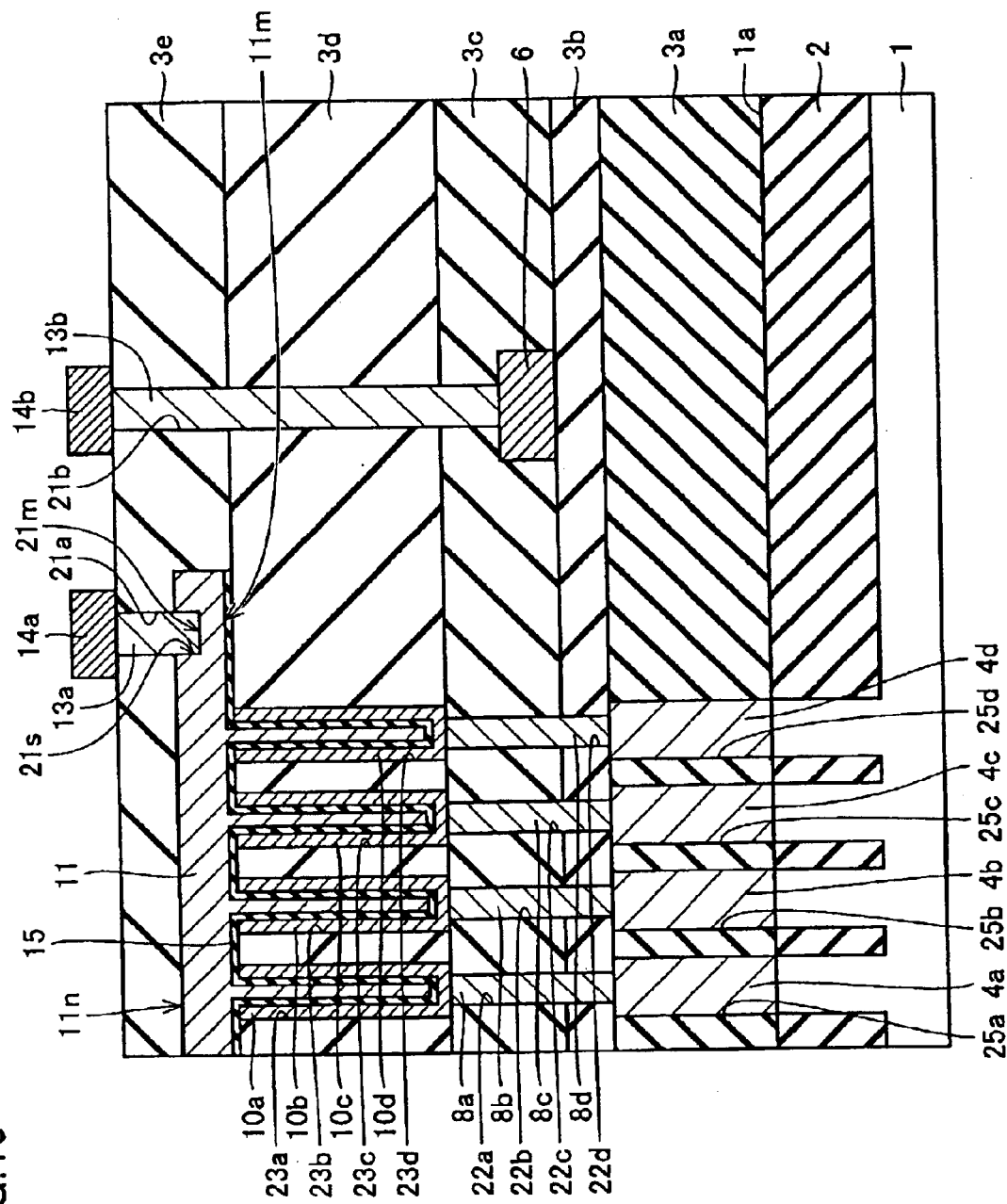
FIG. 19 is a cross sectional view showing a semiconductor device according to an eleventh embodiment of the present invention.

The capacitor structure of the semiconductor device according to an eleventh embodiment differs from that of the semiconductor device according to the second embodiment, and that is the only difference between the two. With reference to FIG. 19 the semiconductor device has a concave MIM (metal-insulator-metal) capacitor as described in the tenth embodiment.

According to the semiconductor device having such a configuration, the same effects as the effects according to the second embodiment can be obtained.

Twelfth Embodiment

Figure 20:
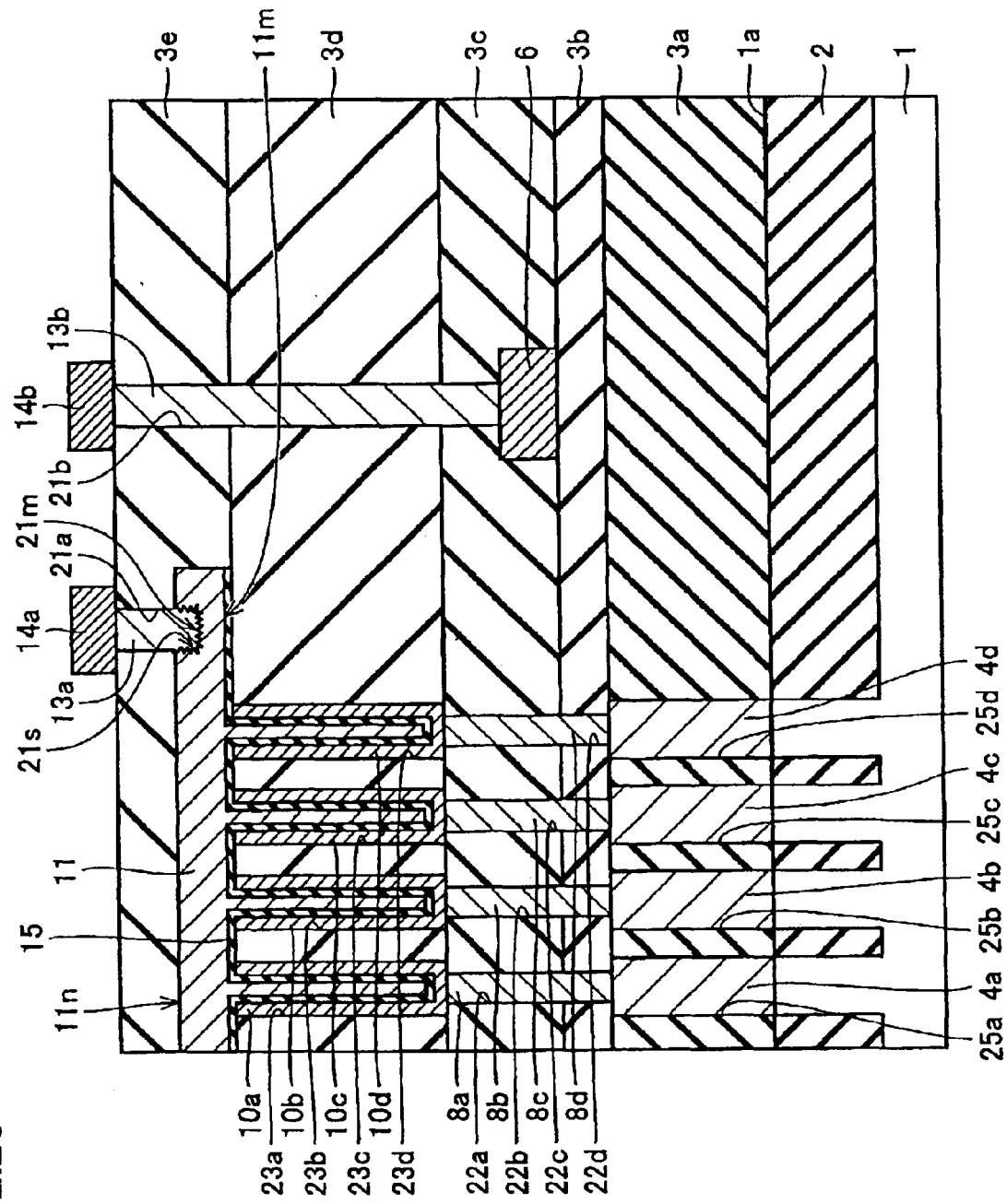
FIG. 20 is a cross sectional view showing a semiconductor device according to a twelfth embodiment of the present invention.

The capacitor structure of the semiconductor device according to a twelfth embodiment differs from that of the semiconductor device according to the third embodiment, and that is the only difference between the two. With reference to FIG. 20 the semiconductor device has a concave MIM (metal-insulator-metal) capacitor as described in the tenth embodiment.

According to the semiconductor device having such a configuration, the same effects as the effects according to the third embodiment can be obtained.

Thirteenth Embodiment

Figure 21:
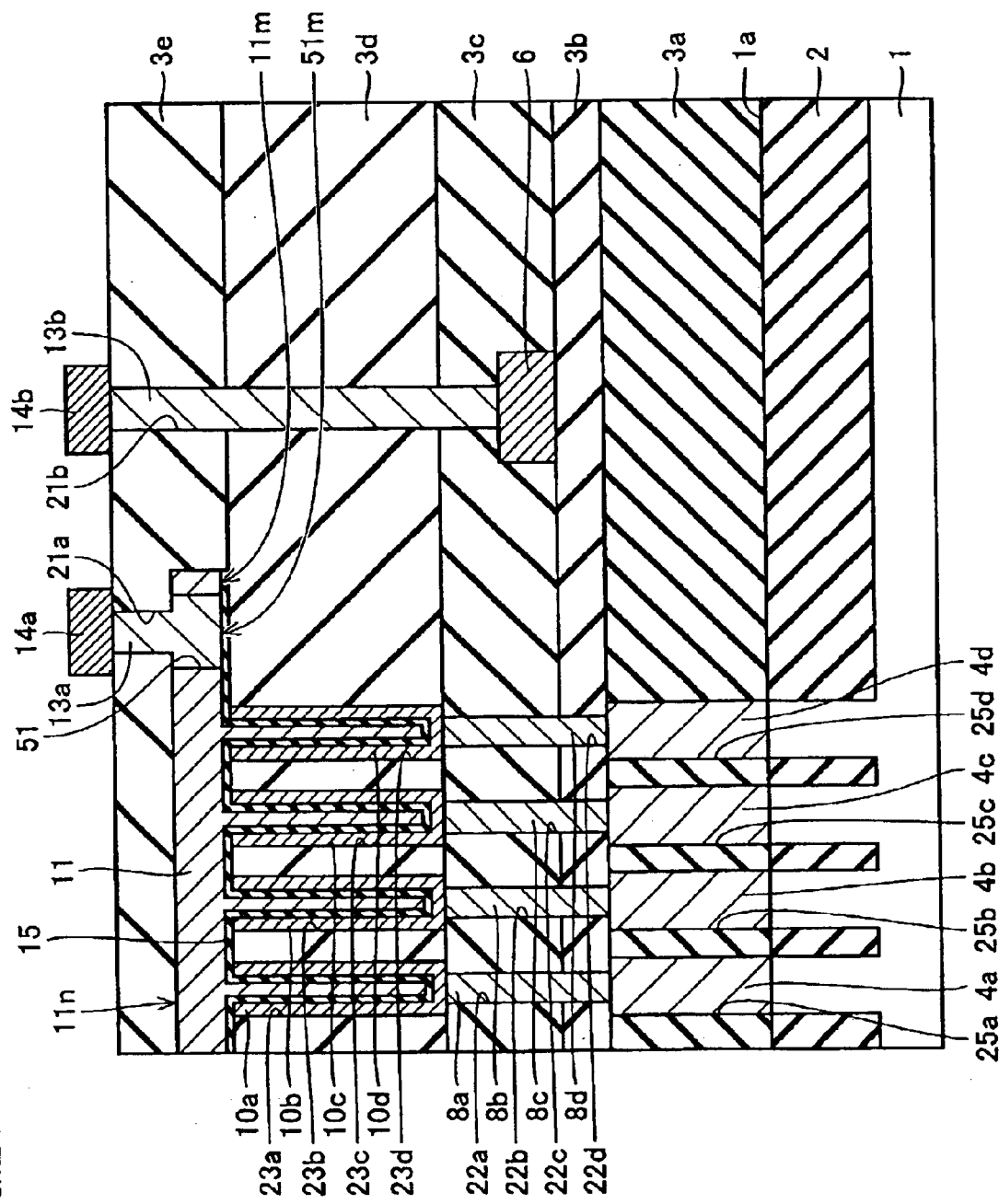
FIG. 21 is a cross sectional view showing a semiconductor device according to a thirteenth embodiment of the present invention.

The capacitor structure of the semiconductor device according to a thirteenth embodiment differs from that of the semiconductor device according to the fourth embodiment, and that is the only difference between the two. With reference to FIG. 21 the semiconductor device has a concave MIM (metal-insulator-metal) capacitor as described in the tenth embodiment.

According to the semiconductor device having such a configuration, the same effects as the effects according to the fourth embodiment can be obtained.

Fourteenth Embodiment

Figure 22:
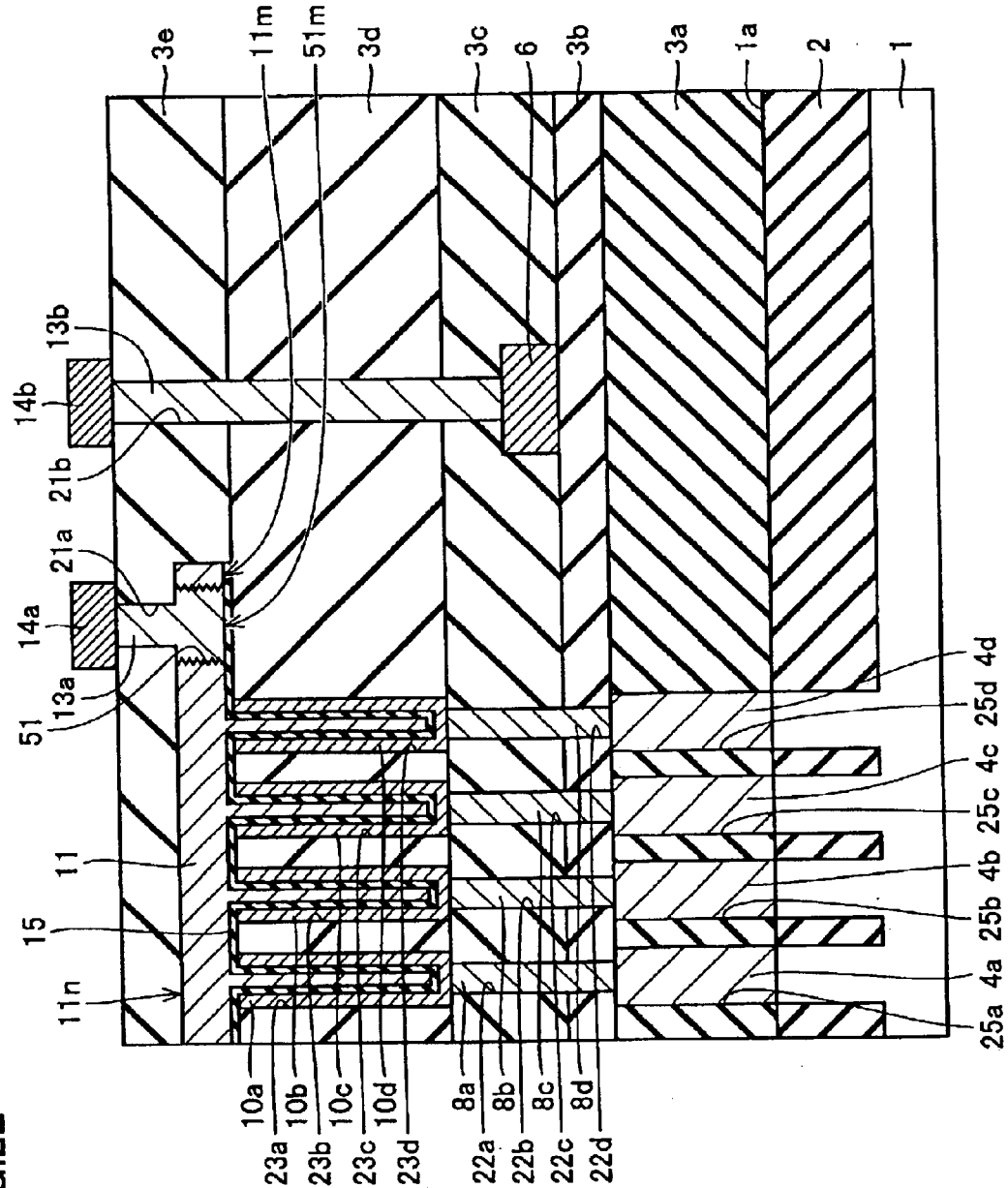
FIG. 22 is a cross sectional view showing a semiconductor device according to a fourteenth embodiment of the present invention.

The capacitor structure of the semiconductor device according to a fourteenth embodiment differs from that of the semiconductor device according to the fifth embodiment, and that is the only difference between the two. With reference to FIG. 22 the semiconductor device has a concave MIM (metal-insulator-metal) capacitor as described in the tenth embodiment.

According to the semiconductor device having such a configuration, the same effects as the effects according to the fifth embodiment can be obtained.

Fifteenth Embodiment

Figure 23:
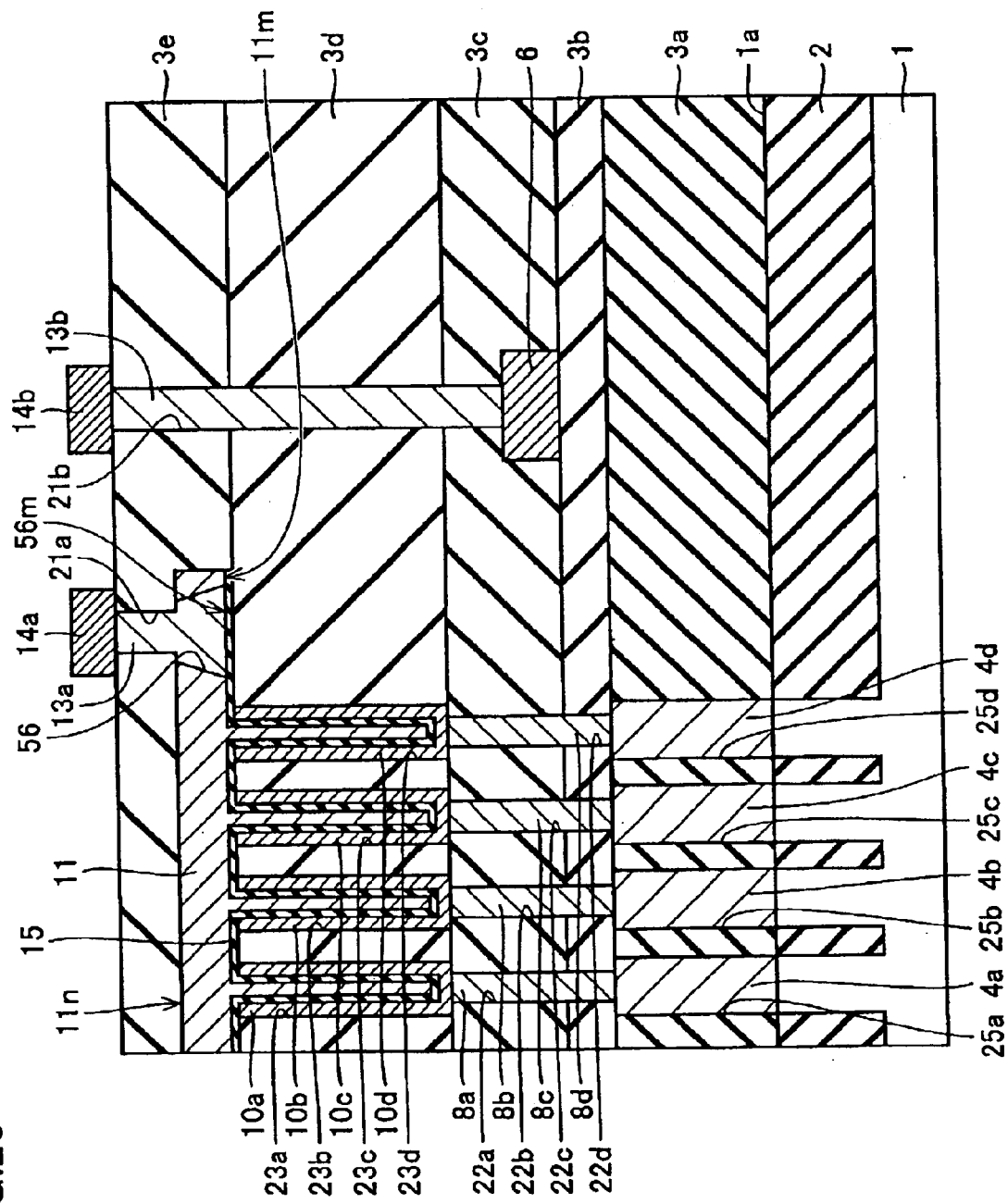
FIG. 23 is a cross sectional view showing a semiconductor device according to a fifteenth embodiment of the present invention.

The capacitor structure of the semiconductor device according to a fifteenth embodiment differs from that of the semiconductor device according to the sixth embodiment, and that is the only difference between the two. With reference to FIG. 23 the semiconductor device has a concave MIM (metal-insulator-metal) capacitor as described in the tenth embodiment.

According to the semiconductor device having such a configuration, the same effects as the effects according to the sixth embodiment can be obtained.

Sixteenth Embodiment

Figure 24:
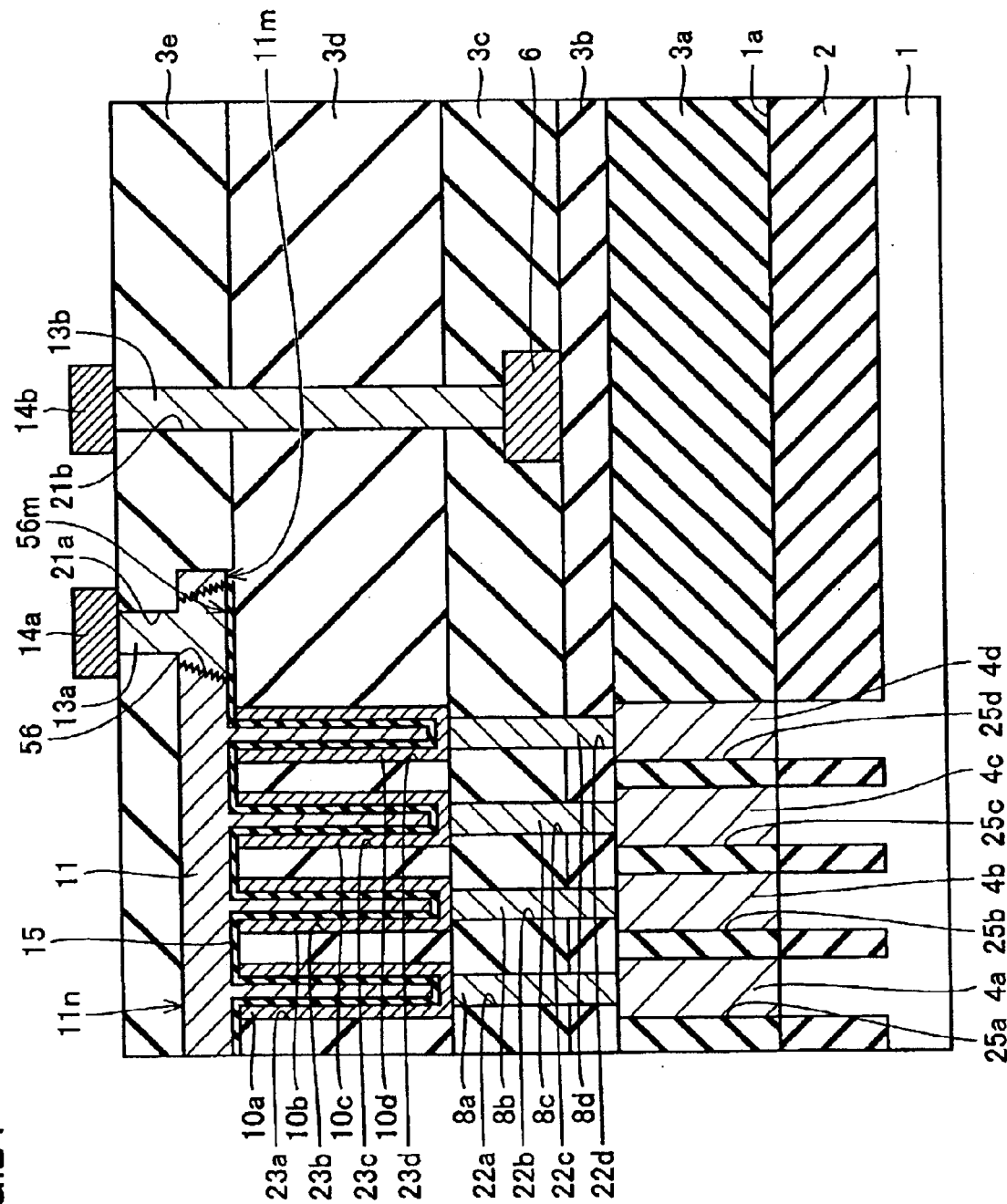
FIG. 24 is a cross sectional view showing a semiconductor device according to a sixteenth embodiment of the present invention.

The capacitor structure of the semiconductor device according to a sixteenth embodiment differs from that of the semiconductor device according to the seventh embodiment, and that is the only difference between the two. With reference to FIG. 24 the semiconductor device has a concave MIM (metal-insulator-metal) capacitor as described in the tenth embodiment.

According to the semiconductor device having such a configuration, the same effects as the effects according to the seventh embodiment can be obtained.

Seventeenth Embodiment

Figure 25:
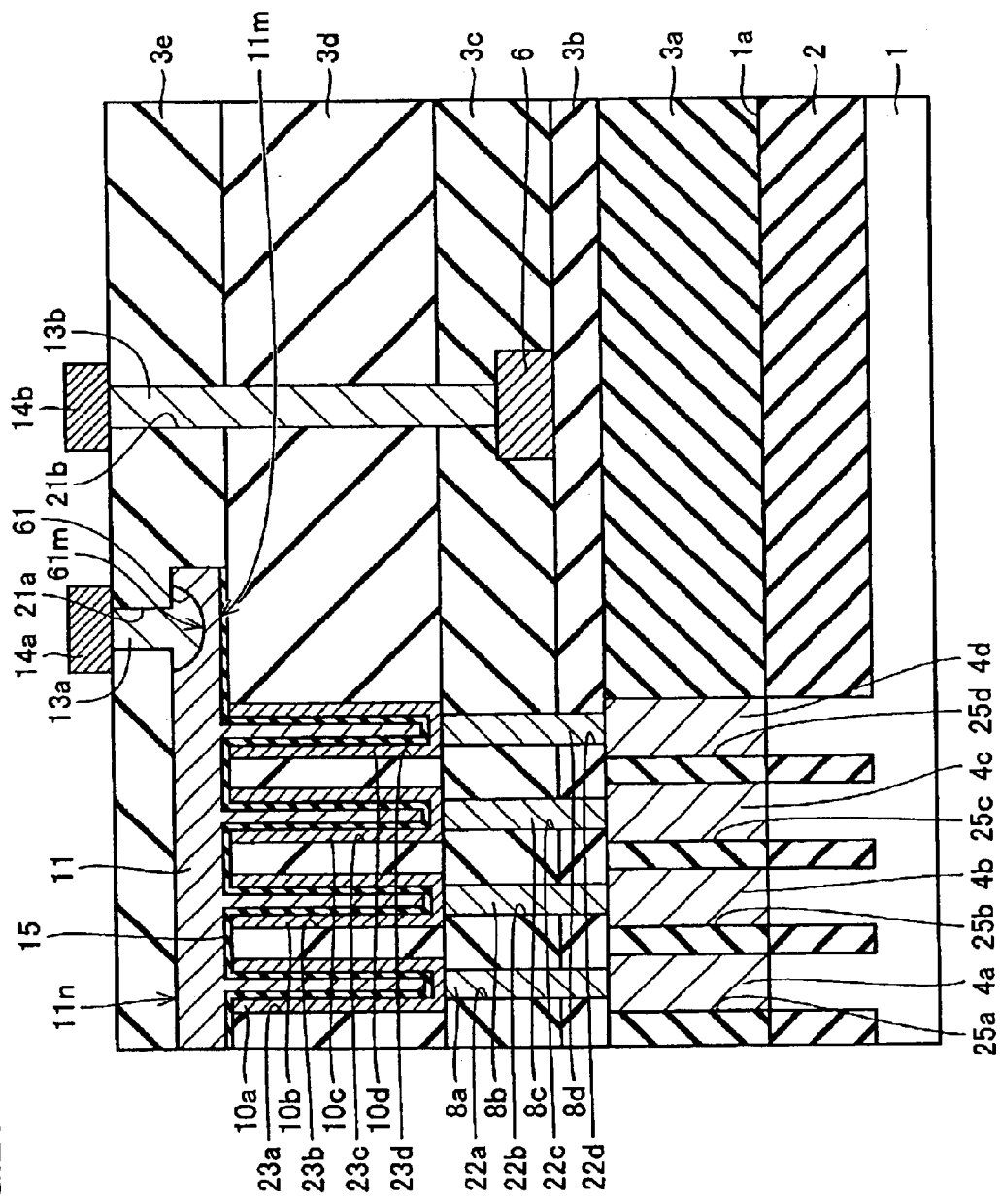
FIG. 25 is a cross sectional view showing a semiconductor device according to a seventeenth embodiment of the present invention.

The capacitor structure of the semiconductor device according to a seventeenth embodiment differs from that of the semiconductor device according to the eighth embodiment, and that is the only difference between the two. With reference to FIG. 25 the semiconductor device has a concave MIM (metal-insulator-metal) capacitor as described in the tenth embodiment.

According to the semiconductor device having such a configuration, the same effects as the effects according to the eighth embodiment can be obtained.

Eighteenth Embodiment

Figure 26:
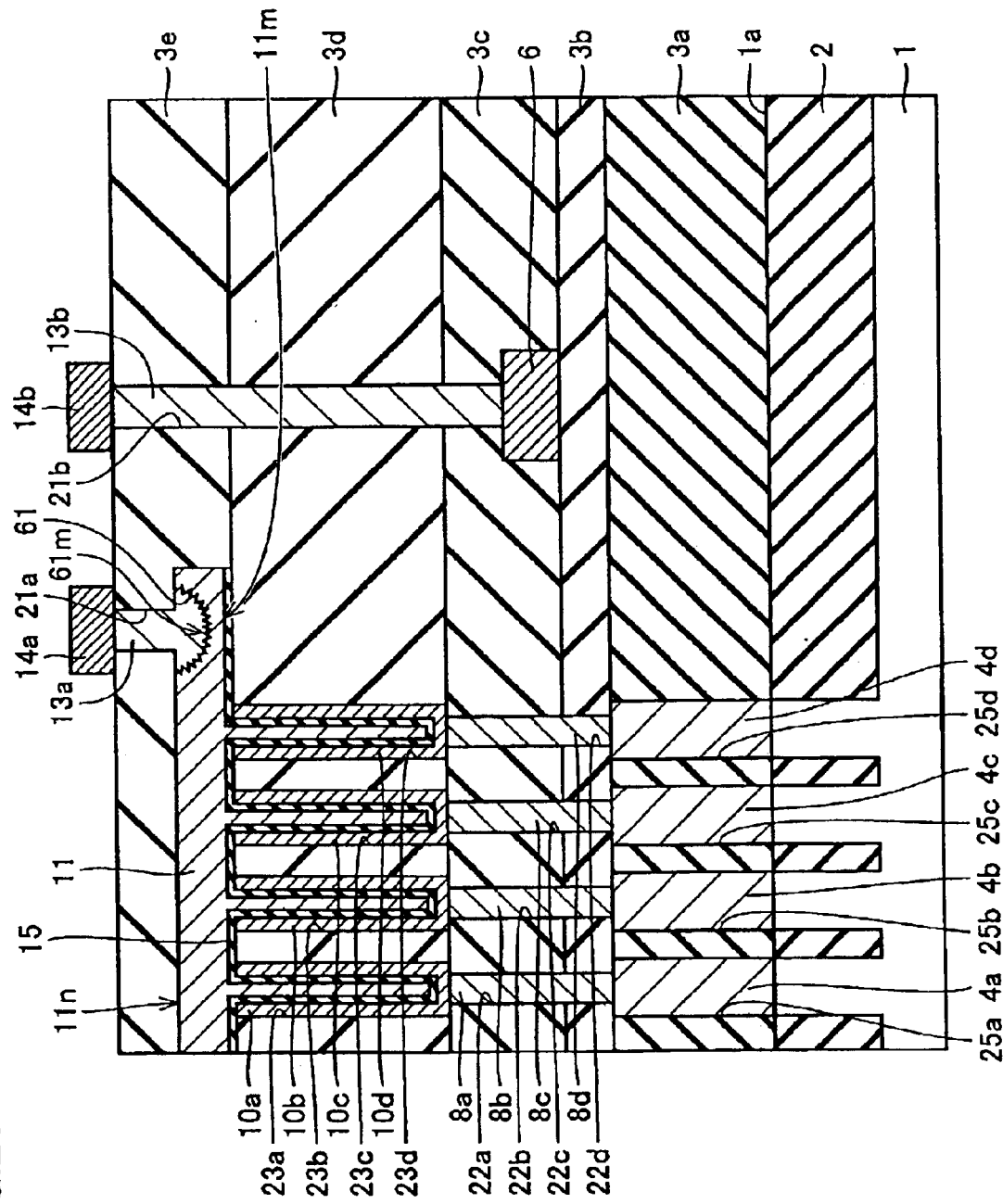
FIG. 26 is a cross sectional view showing a semiconductor device according to an eighteenth embodiment of the present invention.

The capacitor structure of the semiconductor device according to an eighteenth embodiment differs from that of the semiconductor device according to the ninth embodiment, and that is the only difference between the two. With reference to FIG. 26 the semiconductor device has a concave MIM (metal-insulator-metal) capacitor as described in the tenth embodiment.

According to the semiconductor device having such a configuration, the same effects as the effects according to the ninth embodiment can be obtained.

Nineteenth Embodiment

The capacitor structure of the semiconductor device according to a nineteenth embodiment differs from that of the semiconductor device according to the first embodiment, and that is the only difference between the two. In the following, the same structures will not be described repeatedly.

Figure 27:
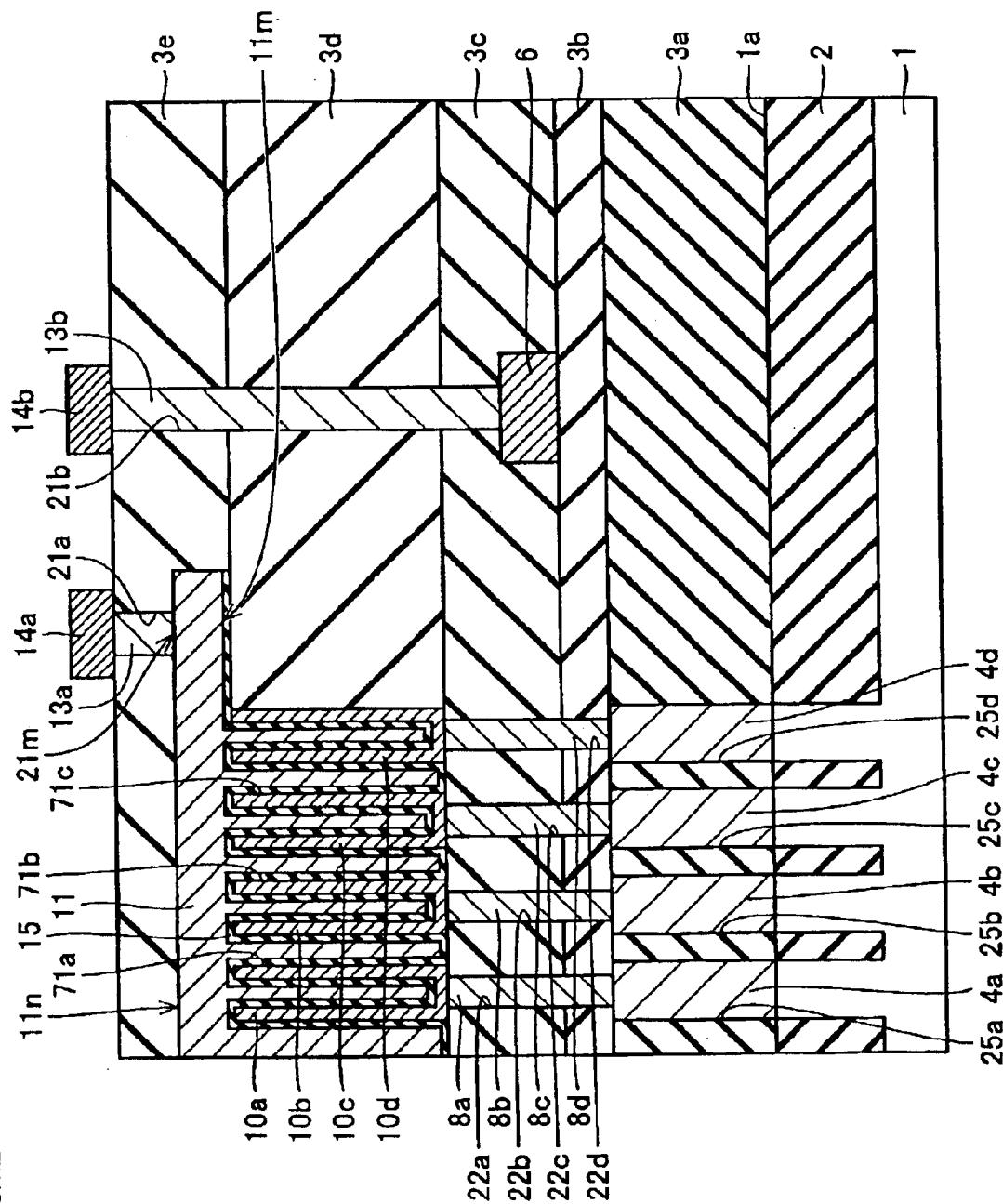
FIG. 27 is a cross sectional view showing a semiconductor device according to a nineteenth embodiment of the present invention.

With reference to FIG. 27 a semiconductor device has a cylindrical MIM (metal-insulator-metal) capacitor. Lower storage node electrodes 10a to 10d made of ruthenium (Ru) are formed in the layer wherein fourth interlayer insulating film 3d is located so as to contact the respective top faces of storage node contacts 8a to 8d. Recesses 71a to 71c reaching the top face of third interlayer insulating film 3c are formed between lower storage node electrodes 10a to 10d, respectively. In addition, lower storage node electrodes 10a to 10d are in cylindrical forms wherein recesses having openings on the top face sides, respectively, are formed.

A dielectric film 15 made of tantalum oxide ($Ta_2O_5$) or barium strontium titanium oxide (BST) is formed so as to cover the above recesses, recesses 71a to 71c and a portion of the top face of fourth interlayer insulating film 3d. An upper cell plate electrode 11 made of ruthenium (Ru) is formed so as to completely cover dielectric film 15. Lower storage node electrodes 10a to 10d, dielectric film 15 and upper cell plate electrode 11 form the cylindrical MIM capacitor of the semiconductor device. In the cylindrical MIM capacitor, dielectric film 15 is formed on the sidewalls located around the external periphery of lower storage node electrodes 10a to 10d and, therefore, the storage capacitance of the capacitor can be increased.

According to the semiconductor device having such a configuration, the same effects as the effects according to the first embodiment can be obtained.

Twentieth Embodiment

Figure 28:
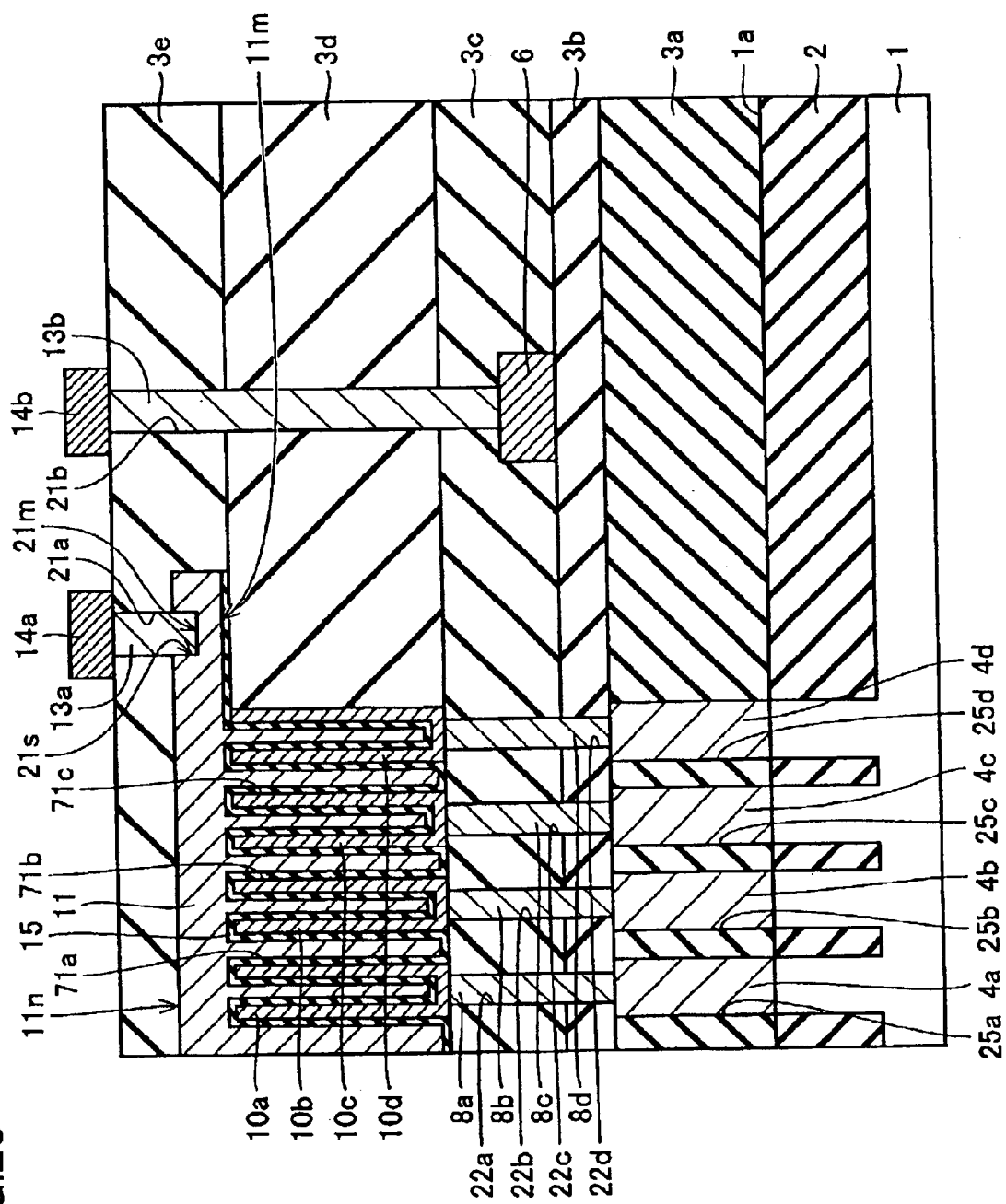
FIG. 28 is a cross sectional view showing a semiconductor device according to a twentieth embodiment of the present invention.

The capacitor structure of the semiconductor device according to a twentieth embodiment differs from that of the semiconductor device according to the second embodiment, and that is the only difference between the two. With reference to FIG. 28 the semiconductor device has a cylindrical MIM (metal-insulator-metal) capacitor as described in the nineteenth embodiment.

According to the semiconductor device having such a configuration, the same effects as the effects according to the second embodiment can be obtained.

Twenty-First Embodiment

Figure 29:
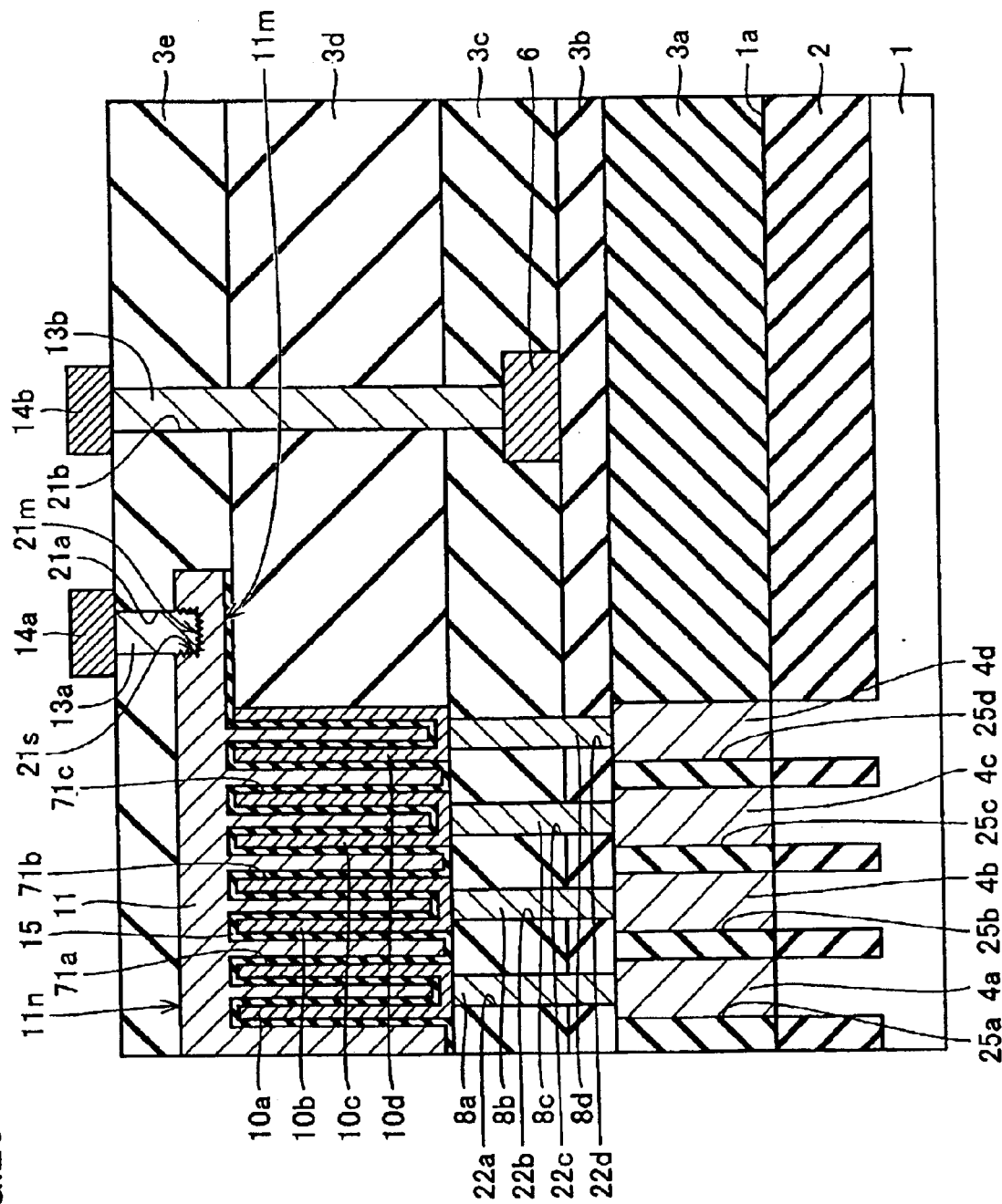
FIG. 29 is a cross sectional view showing a semiconductor device according to a twenty-first embodiment of the present invention.

The capacitor structure of the semiconductor device according to a twenty-first embodiment differs from that of the semiconductor device according to the third embodiment, and that is the only difference between the two. With reference to FIG. 29 the semiconductor device has a cylindrical MIM (metal-insulator-metal) capacitor as described in the nineteenth embodiment.

According to the semiconductor device having such a configuration, the same effects as the effects according to the third embodiment can be obtained.

Twenty-Second Embodiment

Figure 30:
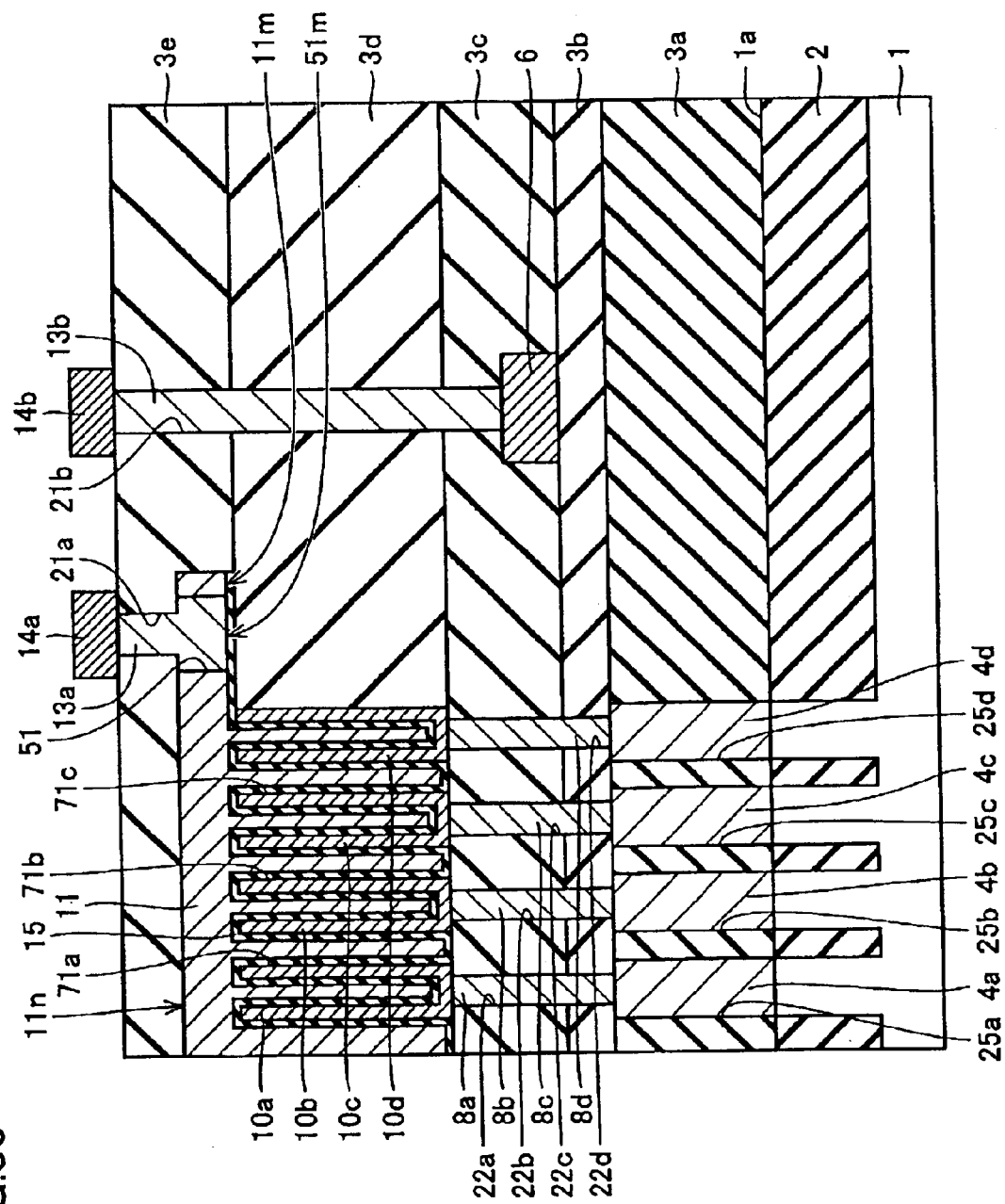
FIG. 30 is a cross sectional view showing a semiconductor device according to a twenty-second embodiment of the present invention.

The capacitor structure of the semiconductor device according to a twenty-second embodiment differs from that of the semiconductor device according to the fourth embodiment, and that is the only difference between the two. With reference to FIG. 30 the semiconductor device has a cylindrical MIM (metal-insulator-metal) capacitor as described in the nineteenth embodiment.

According to the semiconductor device having such a configuration, the same effects as the effects according to the fourth embodiment can be obtained.

Twenty-Third Embodiment

Figure 31:
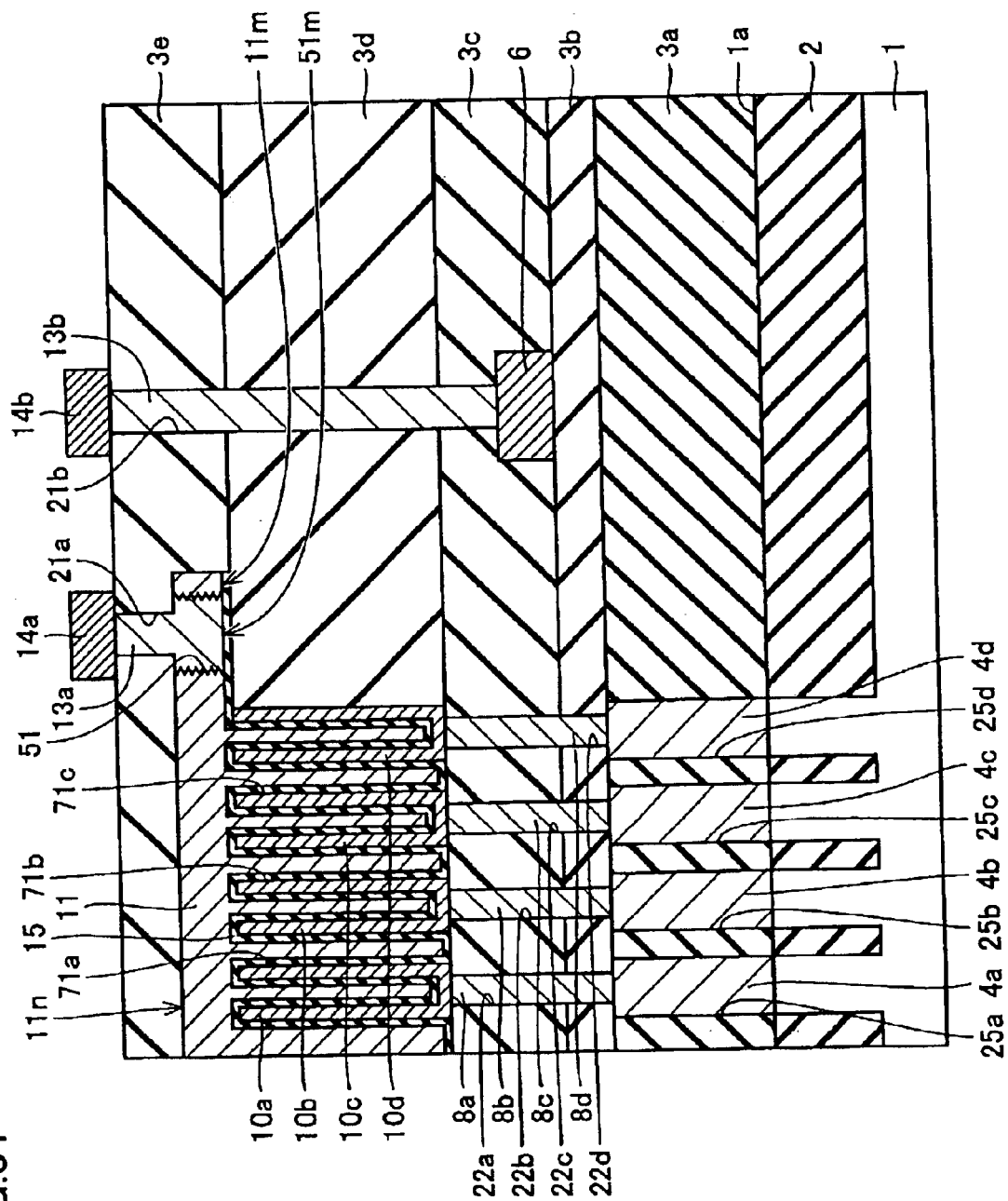
FIG. 31 is a cross sectional view showing a semiconductor device according to a twenty-third embodiment of the present invention.

The capacitor structure of the semiconductor device according to a twenty-third embodiment differs from that of the semiconductor device according to the fifth embodiment, and that is the only difference between the two. With reference to FIG. 31 the semiconductor device has a cylindrical MIM (metal-insulator-metal) capacitor as described in the nineteenth embodiment.

According to the semiconductor device having such a configuration, the same effects as the effects according to the fifth embodiment can be obtained.

Twenty-Fourth Embodiment

Figure 32:
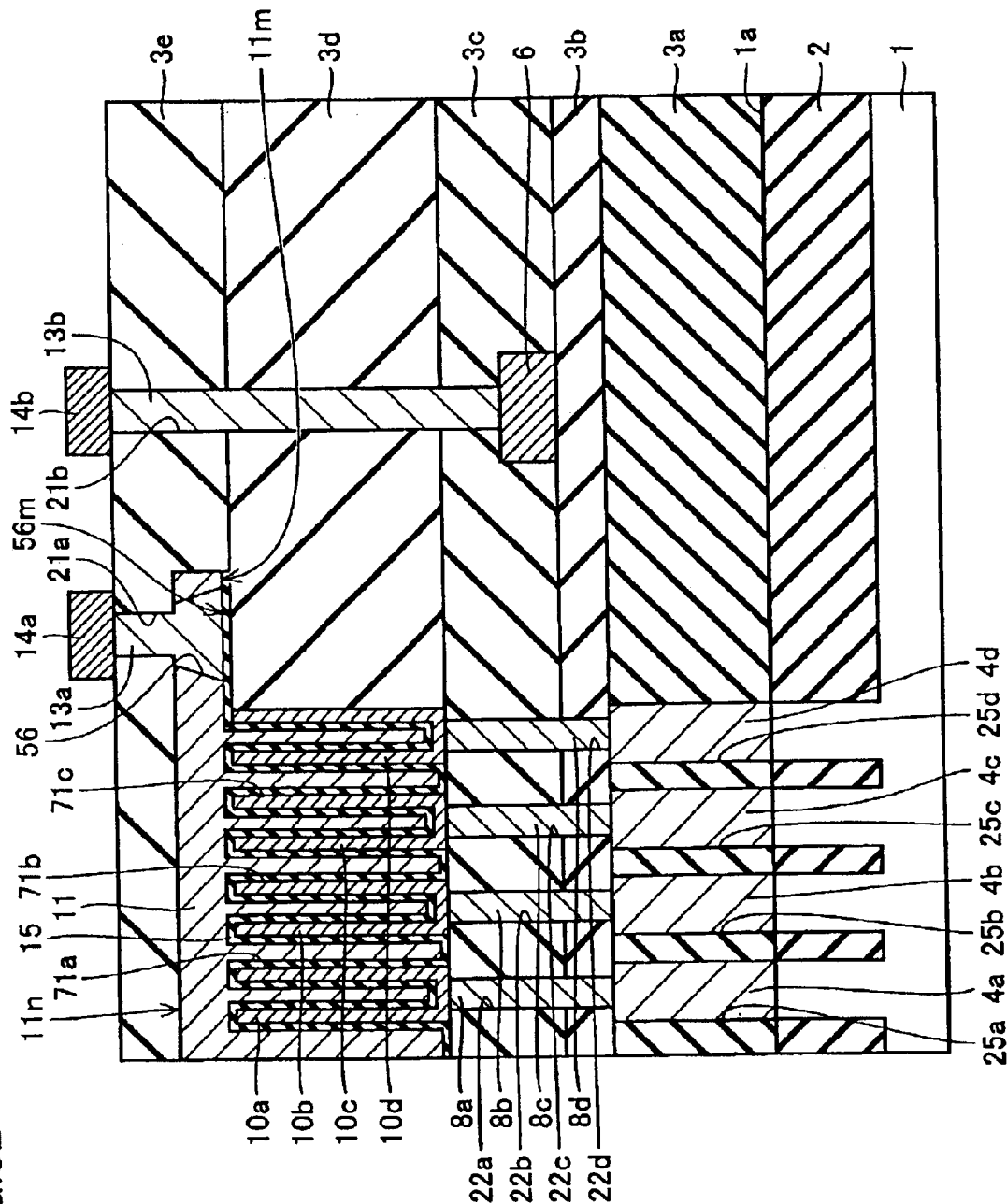
FIG. 32 is a cross sectional view showing a semiconductor device according to a twenty-fourth embodiment of the present invention.

The capacitor structure of the semiconductor device according to a twenty-fourth embodiment differs from that of the semiconductor device according to the sixth embodiment, and that is the only difference between the two. With reference to FIG. 32 the semiconductor device has a cylindrical MIM (metal-insulator-metal) capacitor as described in the nineteenth embodiment.

According to the semiconductor device having such a configuration, the same effects as the effects according to the sixth embodiment can be obtained.

Twenty-Fifth Embodiment

Figure 33:
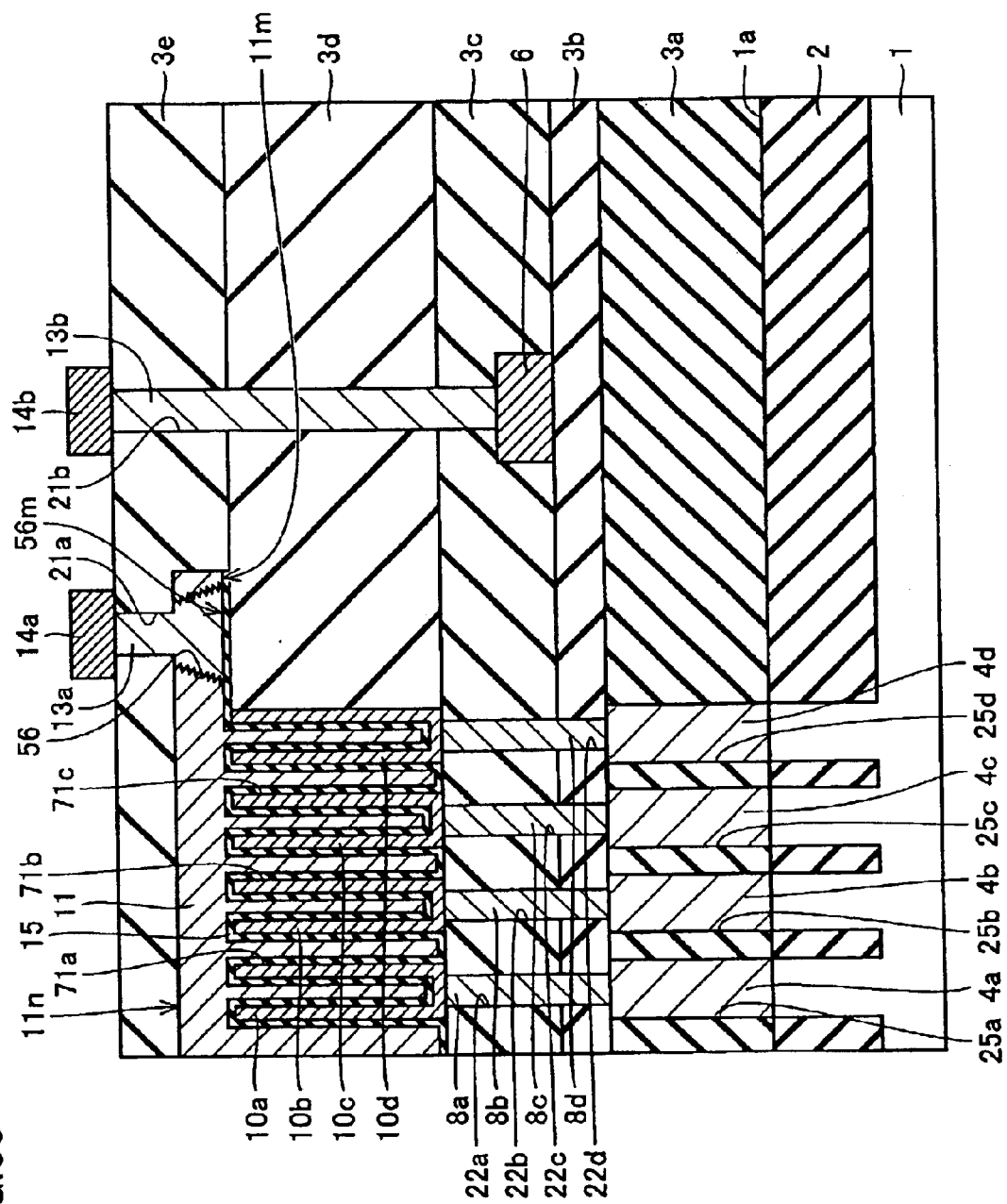
FIG. 33 is a cross sectional view showing a semiconductor device according to a twenty-fifth embodiment of the present invention.

The capacitor structure of the semiconductor device according to a twenty-fifth embodiment differs from that of the semiconductor device according to the seventh embodiment, and that is the only difference between the two. With reference to FIG. 33 the semiconductor device has a cylindrical MIM (metal-insulator-metal) capacitor as described in the nineteenth embodiment.

According to the semiconductor device having such a configuration, the same effects as the effects according to the seventh embodiment can be obtained.

Twenty-Sixth Embodiment

Figure 34:
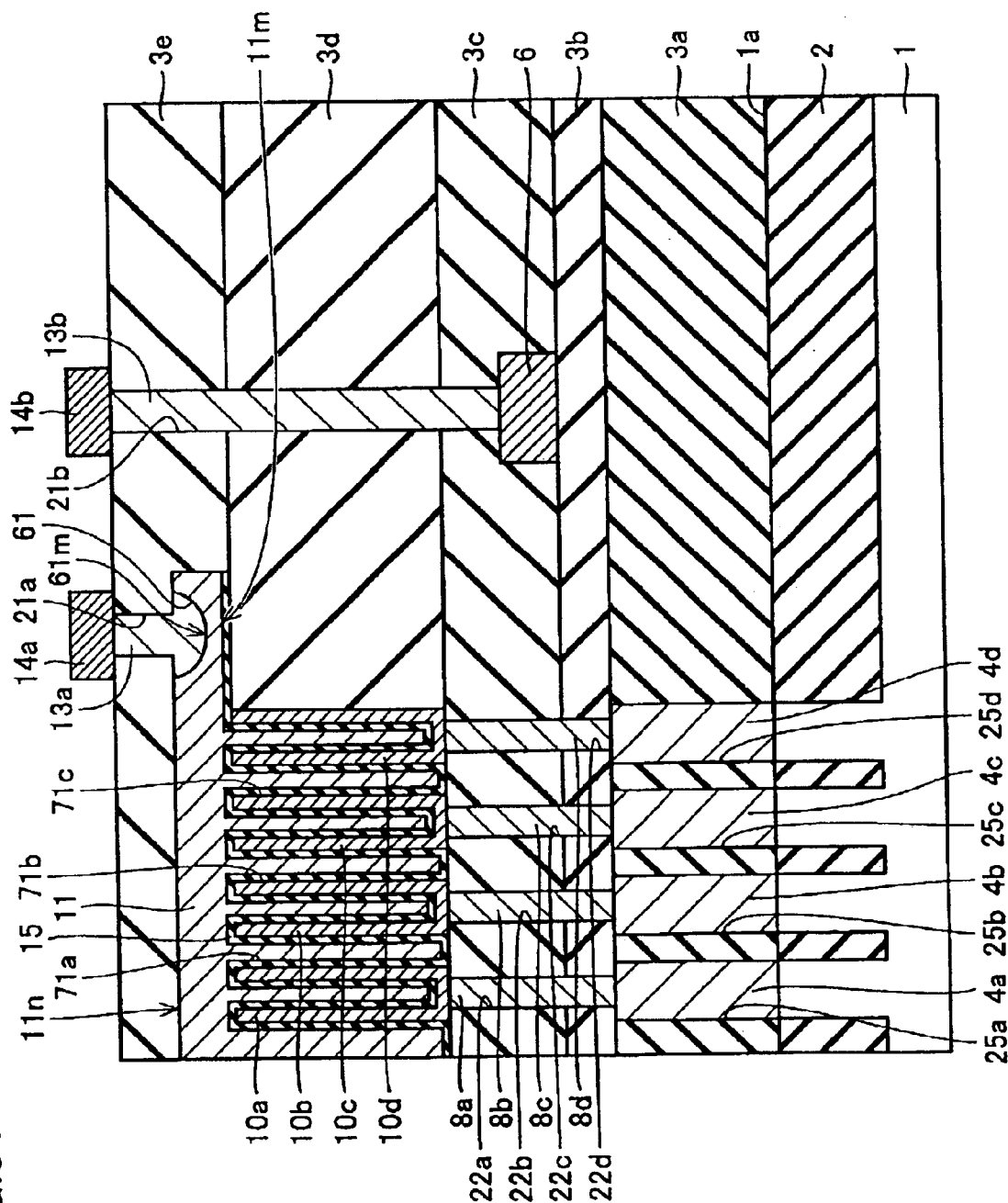
FIG. 34 is a cross sectional view showing a semiconductor device according to a twenty-sixth embodiment of the present invention.

The capacitor structure of the semiconductor device according to a twenty-sixth embodiment differs from that of the semiconductor device according to the eighth embodiment, and that is the only difference between the two. With reference to FIG. 34 the semiconductor device has a cylindrical MIM (metal-insulator-metal) capacitor as described in the nineteenth embodiment.

According to the semiconductor device having such a configuration, the same effects as the effects according to the eighth embodiment can be obtained.

Twenty-Seventh Embodiment

Figure 35:
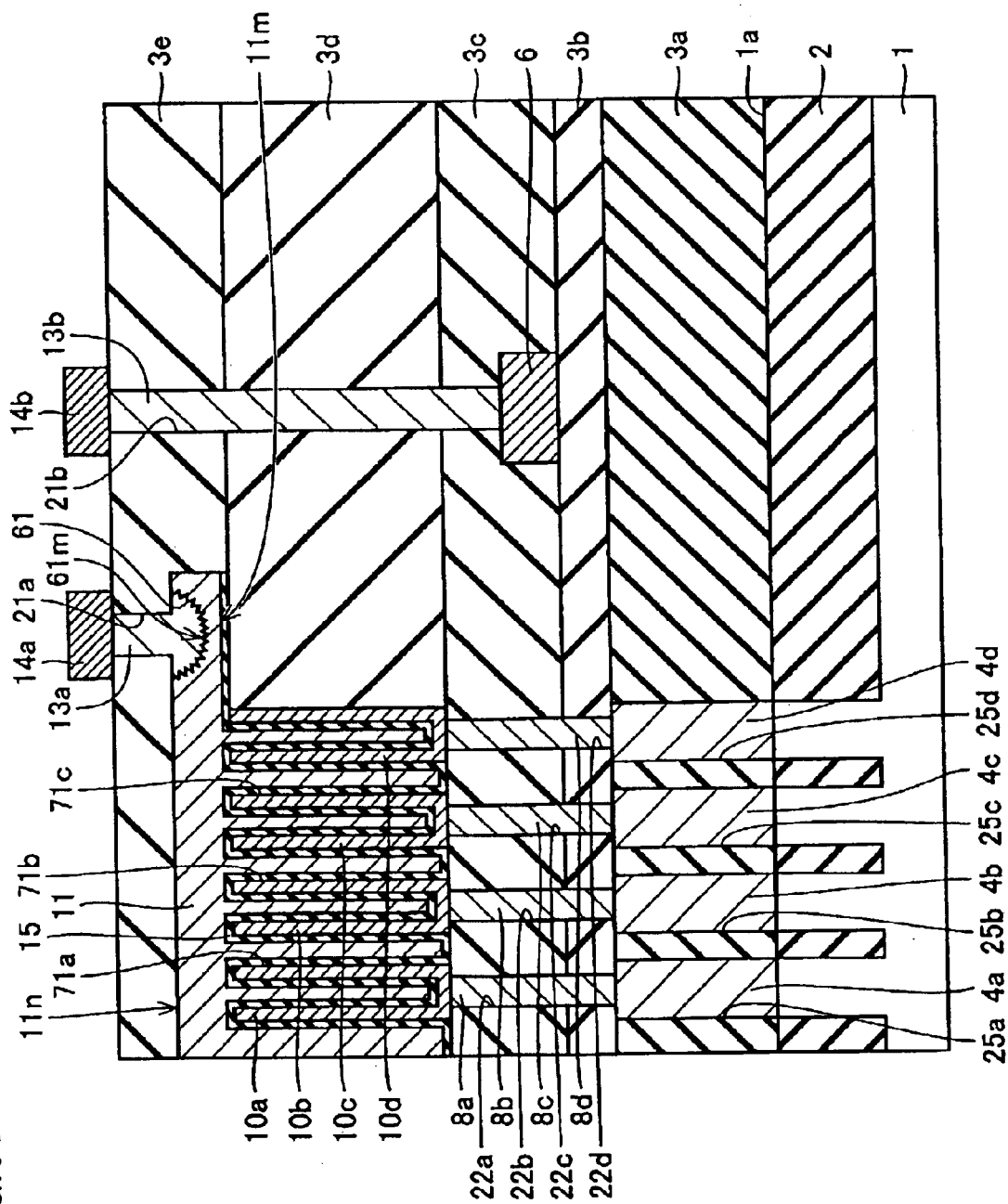
FIG. 35 is a cross sectional view showing a semiconductor device according to a twenty-seventh embodiment of the present invention.
Figure 36:
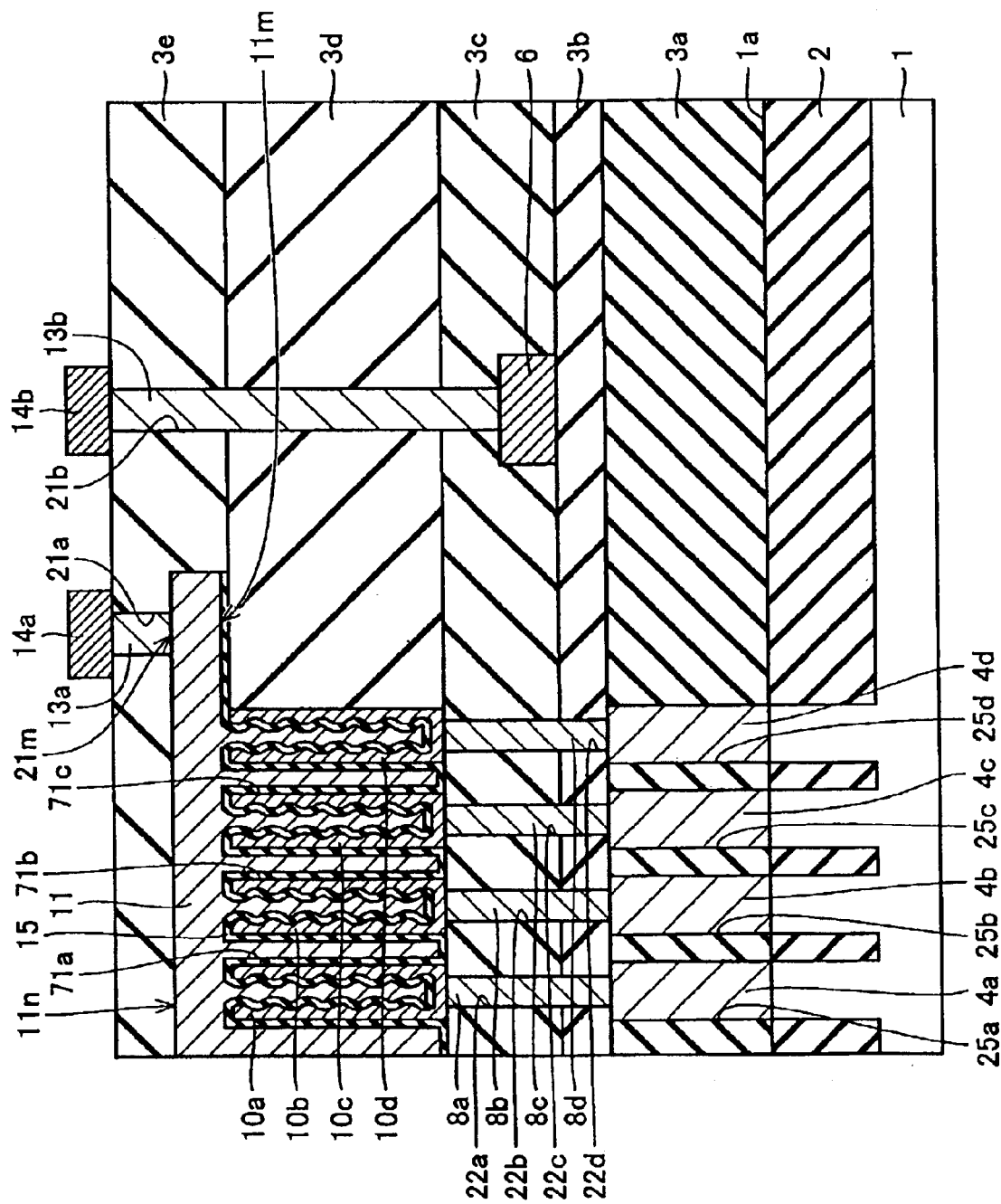
FIG. 36 is a cross sectional view showing a semiconductor device according to a twenty-eighth embodiment of the present invention.

The capacitor structure of the semiconductor device according to a twenty-seventh embodiment differs from that of the semiconductor device according to the ninth embodiment, and that is the only difference between the two. With reference to FIG. 35 the semiconductor device has a cylindrical MIM (metal-insulator-metal) capacitor as described in the nineteenth embodiment.

According to the semiconductor device having such a configuration, the same effects as the effects according to the ninth embodiment can be obtained.

Twenty-Eighth Embodiment

The capacitor structure of the semiconductor device according to a twenty-eighth embodiment differs from that of the semiconductor device according to the first embodiment, and that is the only difference between the two. In the following, the same structures will not be described repeatedly.

With reference to FIG. 27, a semiconductor device has a cylindrical MIS (metal-insulator-silicon) capacitor with a coarse surface. Lower storage node electrodes 10a to 10d made of doped polysilicon are formed in the layer wherein fourth interlayer insulating film 3d is located so as to make contact with the respective top faces of storage node contacts 8a to 8d. Recesses 71a to 71c reaching the top face of third interlayer insulating film 3c are formed between lower storage node electrodes 10a to 10d, respectively. In addition, lower storage node electrodes 10a to 10d are in cylindrical forms wherein recesses having openings on the top face sides, respectively, are formed. The surfaces resulting from the formation of these recesses are uneven.

A dielectric film 15 made of tantalum oxide ($Ta_2O_5$) or barium strontium titanium oxide (BST) is formed so as to cover the above recesses, recesses 71a to 71c and a portion of the top face of fourth interlayer insulating film 3d. An upper cell plate electrode 11 made of ruthenium (Ru) is formed so as to completely cover dielectric film 15. Lower storage node electrodes 10a to 10d, dielectric film 15 and upper cell plate electrode 11 form the cylindrical MIS capacitor having coarse surfaces of the semiconductor device. In the cylindrical MIS capacitor having coarse surfaces, dielectric film 15 is formed on the sidewalls located around the external periphery of lower storage node electrodes 10a to 10d and, in addition, the surfaces on the inner periphery sides of lower storage node electrodes 10a to 10d in cylindrical forms are uneven and, therefore, the storage capacitance of the capacitor can be increased.

According to the semiconductor device having such a configuration, the same effects as the effects according to the first embodiment can be obtained.

Twenty-Ninth Embodiment

Figure 37:
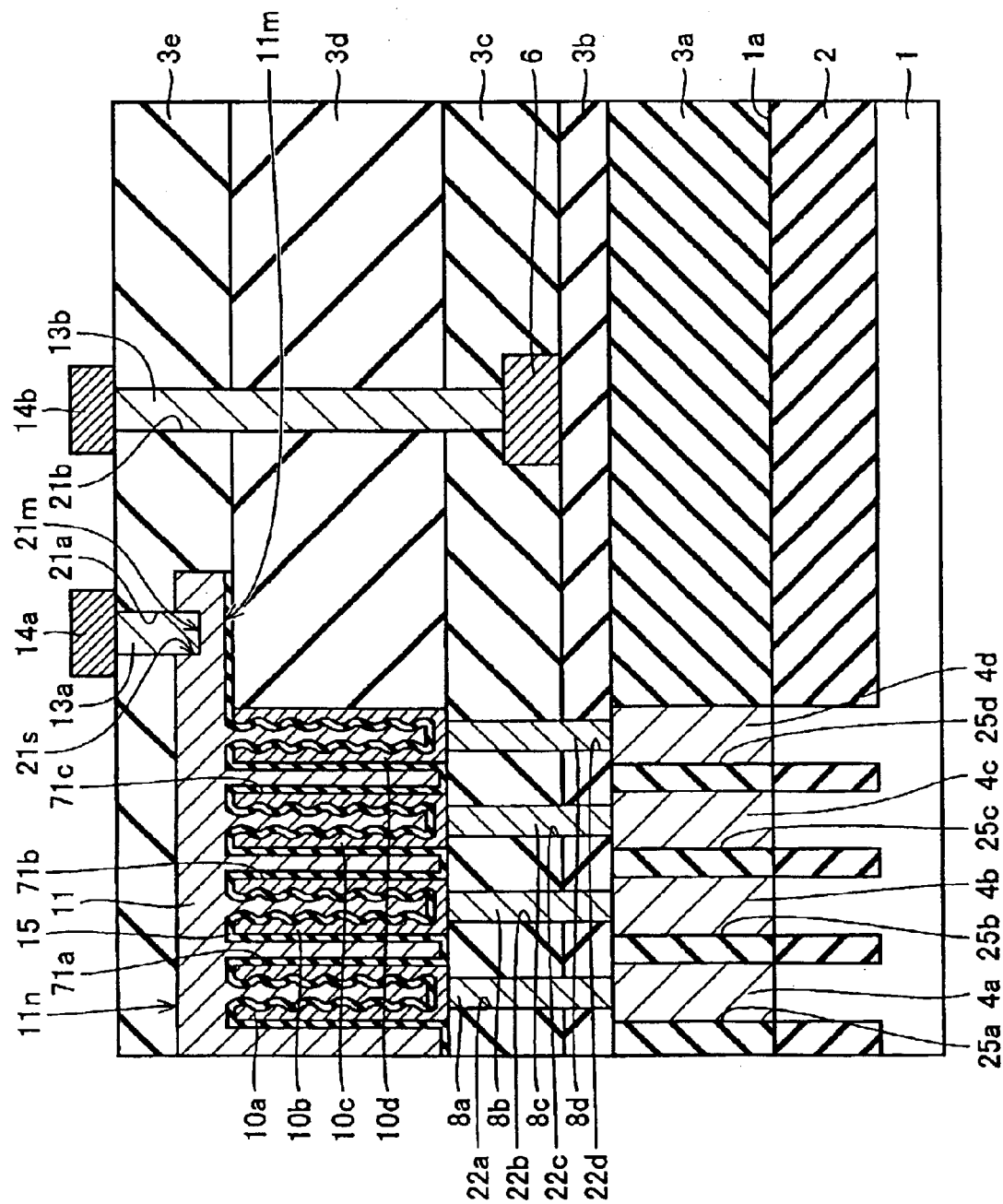
FIG. 37 is a cross sectional view showing a semiconductor device according to a twenty-ninth embodiment of the present invention.

The capacitor structure of the semiconductor device according to a twenty-ninth embodiment differs from that of the semiconductor device according to the second embodiment, and that is the only difference between the two. With reference to FIG. 37, the semiconductor device has a cylindrical MIS (metal-insulator-silicon) capacitor having coarse surfaces as described in the twenty-eighth embodiment.

According to the semiconductor device having such a configuration, the same effects as the effects according to the second embodiment can be obtained.

Thirtieth Embodiment

Figure 38:
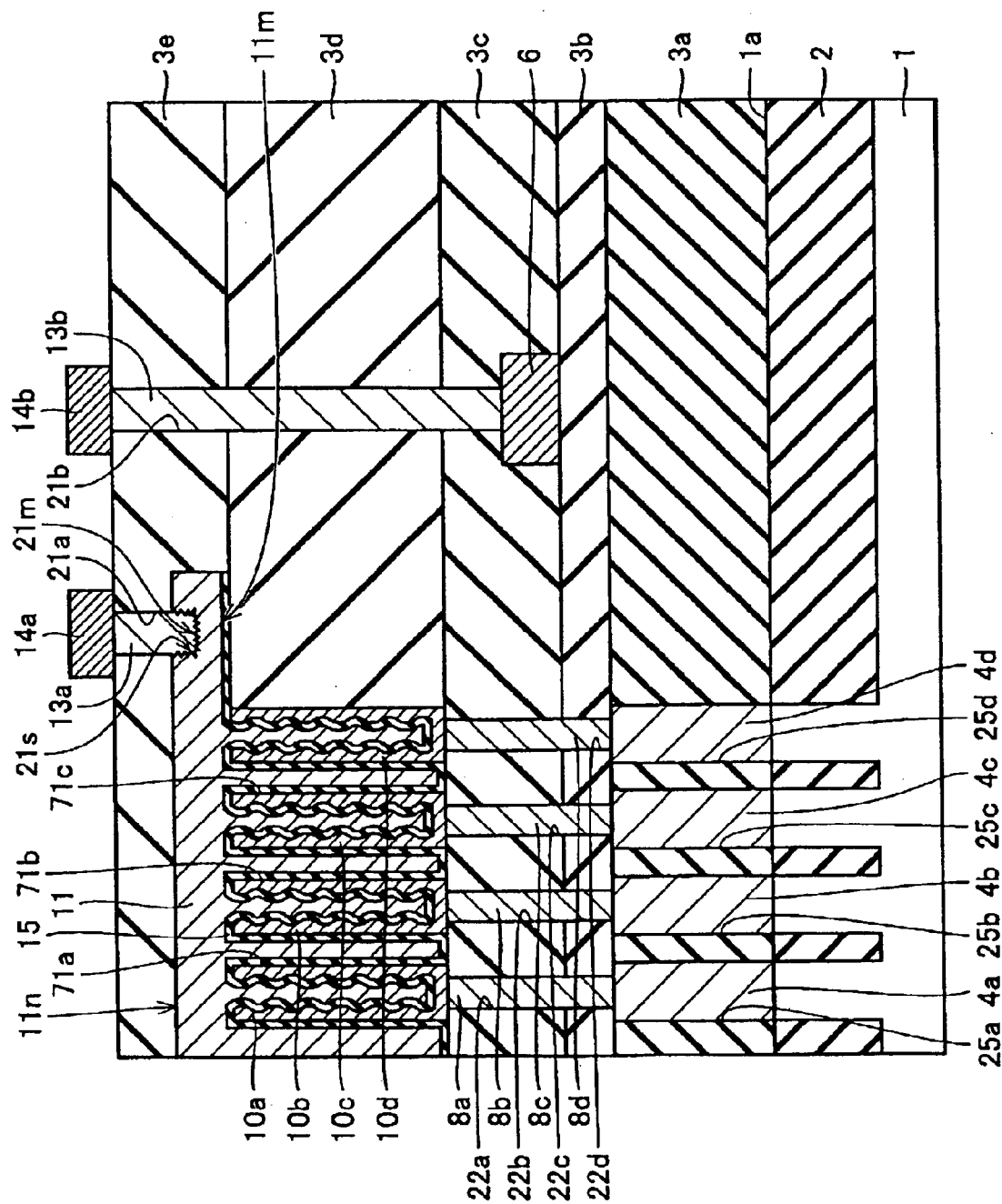
FIG. 38 is a cross sectional view showing a semiconductor device according to a thirtieth embodiment of the present invention.

The capacitor structure of the semiconductor device according to a thirtieth embodiment differs from that of the semiconductor device according to the third embodiment, and that is the only difference between the two. With reference to FIG. 38, the semiconductor device has a cylindrical MIS (metal-insulator-silicon) capacitor having coarse surfaces as described in the twenty-eighth embodiment.

According to the semiconductor device having such a configuration, the same effects as the effects according to the third embodiment can be obtained.

Thirty-First Embodiment

Figure 39:
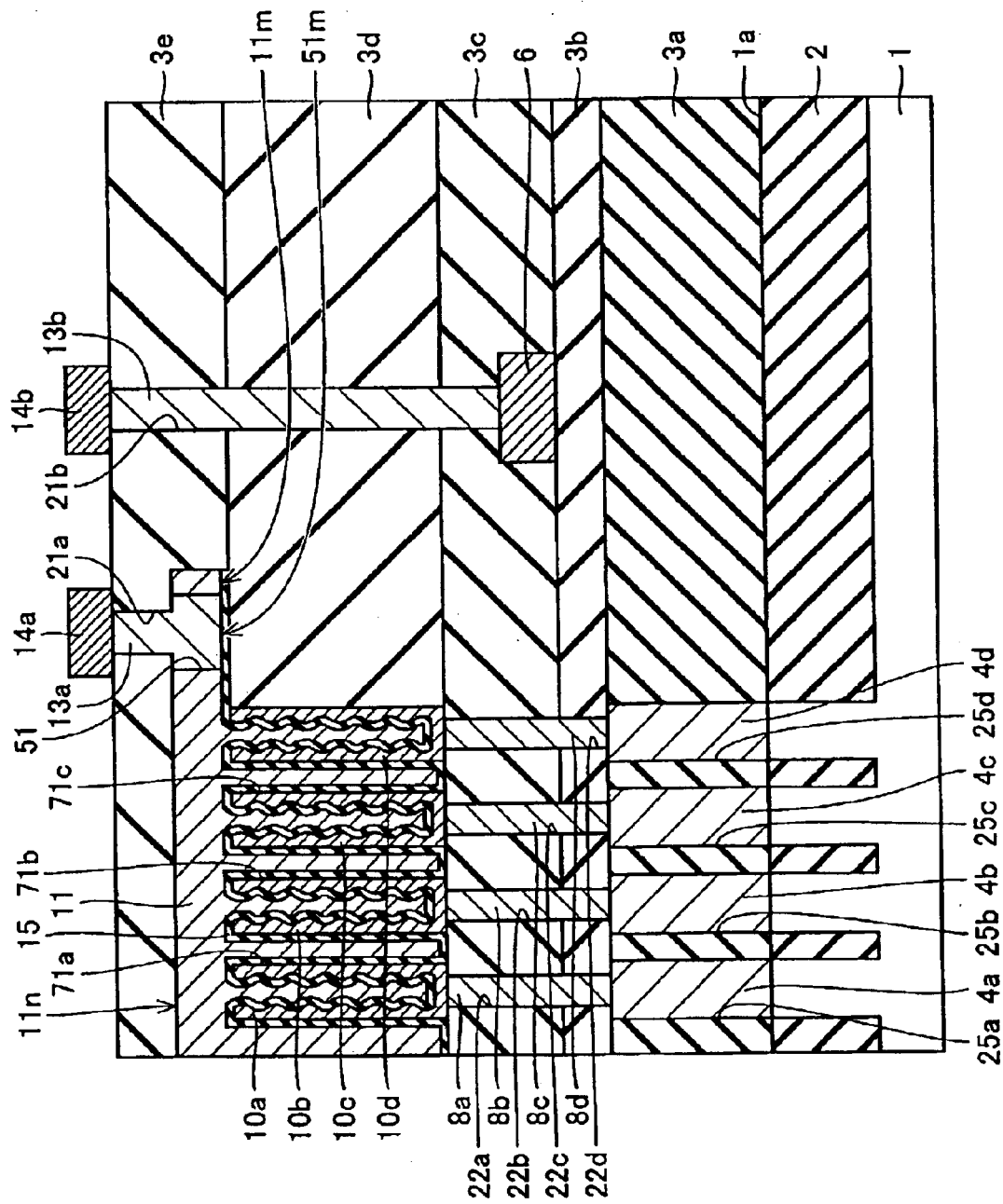
FIG. 39 is a cross sectional view showing a semiconductor device according to a thirty-first embodiment of the present invention.

The capacitor structure of the semiconductor device according to a thirty-first embodiment differs from that of the semiconductor device according to the fourth embodiment, and that is the only difference between the two. With reference to FIG. 39, the semiconductor device has a cylindrical MIS (metal-insulator-silicon) capacitor having coarse surfaces as described in the twenty-eighth embodiment.

According to the semiconductor device having such a configuration, the same effects as the effects according to the fourth embodiment can be obtained.

Thirty-Second Embodiment

Figure 40:
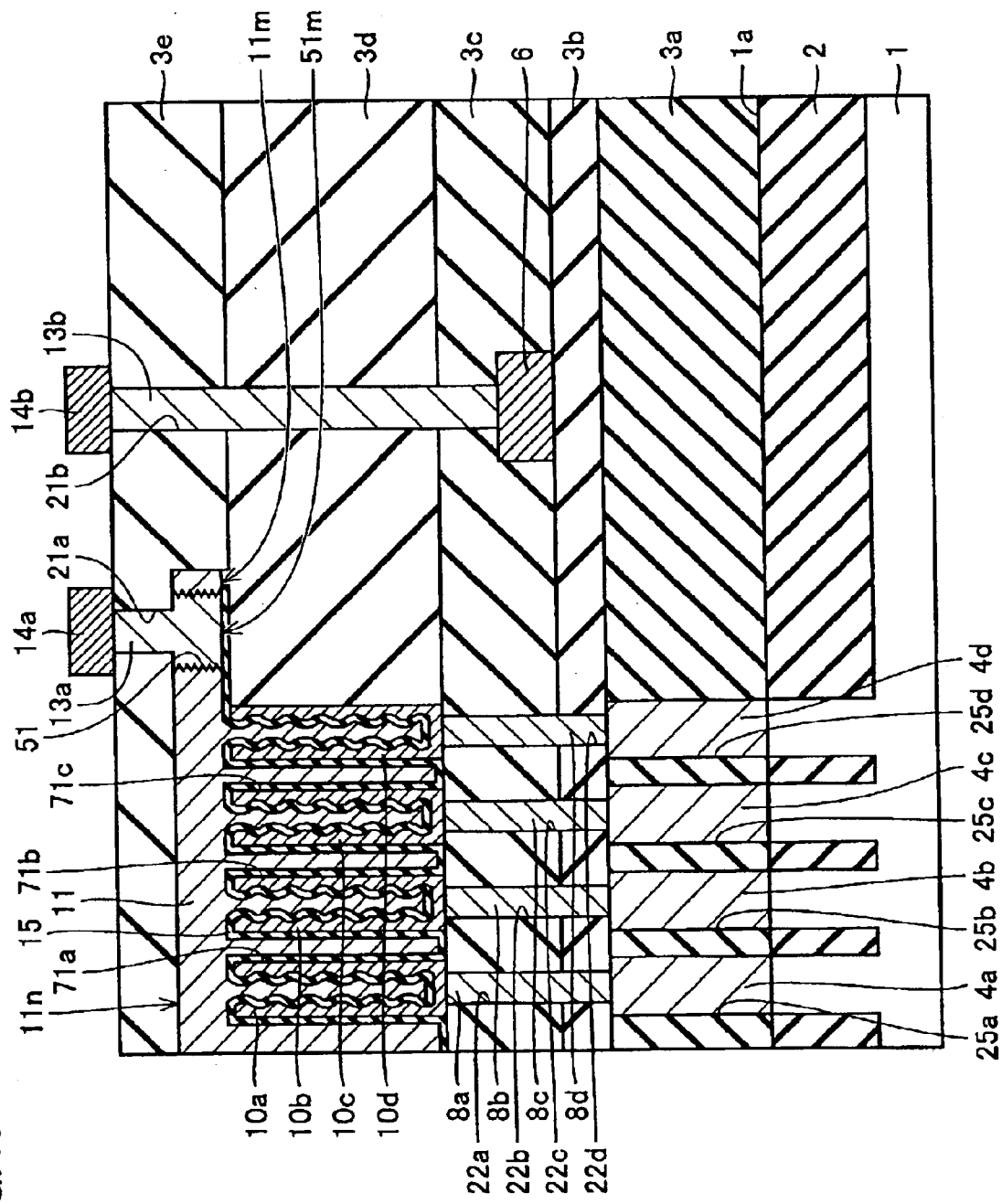
FIG. 40 is a cross sectional view showing a semiconductor device according to a thirty-second embodiment of the present invention.

The capacitor structure of the semiconductor device according to a thirty-second embodiment differs from that of the semiconductor device according to the fifth embodiment, and that is the only difference between the two. With reference to FIG. 40, the semiconductor device has a cylindrical MIS (metal-insulator-silicon) capacitor having coarse surfaces as described in the twenty-eighth embodiment.

According to the semiconductor device having such a configuration, the same effects as the effects according to the fifth embodiment can be obtained.

Thirty-Third Embodiment

The capacitor structure of the semiconductor device according to a thirty-third embodiment differs from that of the semiconductor device according to the sixth embodiment, and that is the only difference between the two.

Figure 41:
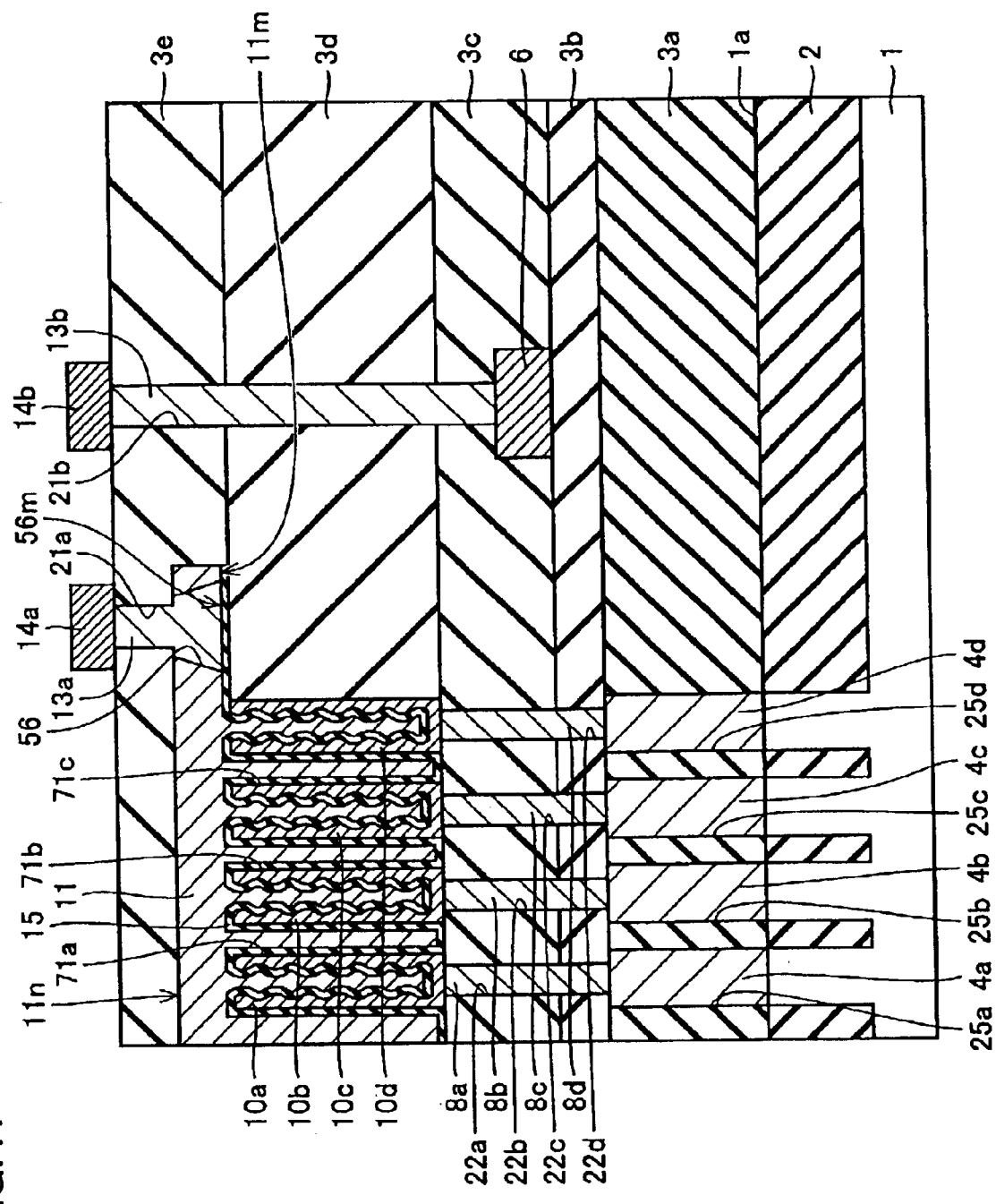
FIG. 41 is a cross sectional view showing a semiconductor device according to a thirty-third embodiment of the present invention.

With reference to FIG. 41, the semiconductor device has a cylindrical MIS (metal-insulator-silicon) capacitor having coarse surfaces as described in the twenty-eighth embodiment.

According to the semiconductor device having such a configuration, the same effects as the effects according to the sixth embodiment can be obtained.

Thirty-Fourth Embodiment

Figure 42:
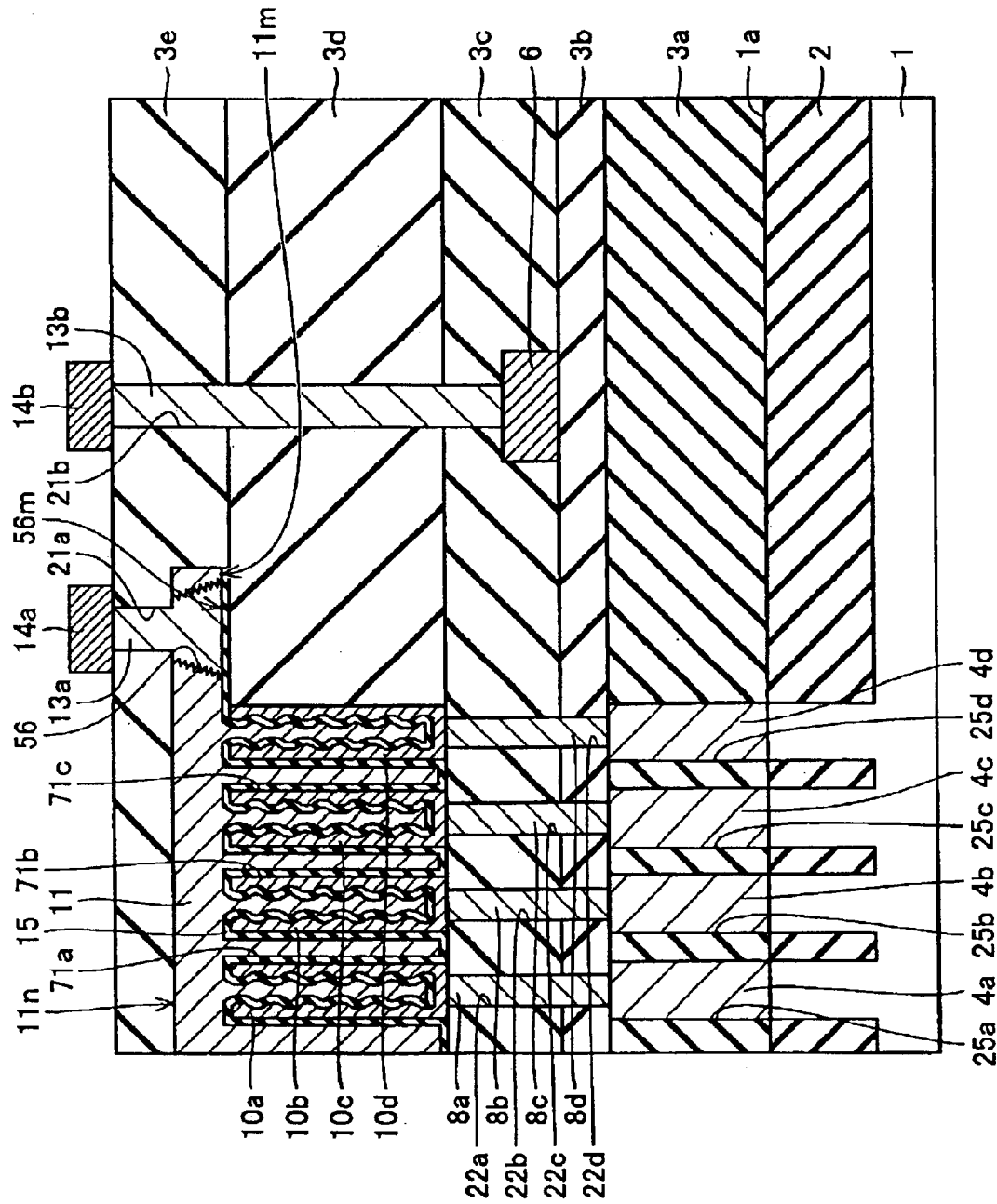
FIG. 42 is a cross sectional view showing a semiconductor device according to a thirty-fourth embodiment of the present invention.

The capacitor structure of the semiconductor device according to a thirty-fourth embodiment differs from that of the semiconductor device according to the seventh embodiment, and that is the only difference between the two. With reference to FIG. 42, the semiconductor device has a cylindrical MIS (metal-insulator-silicon) capacitor having coarse surfaces as described in the twenty-eighth embodiment.

According to the semiconductor device having such a configuration, the same effects as the effects according to the seventh embodiment can be obtained.

Thirty-Fifth Embodiment

Figure 43:
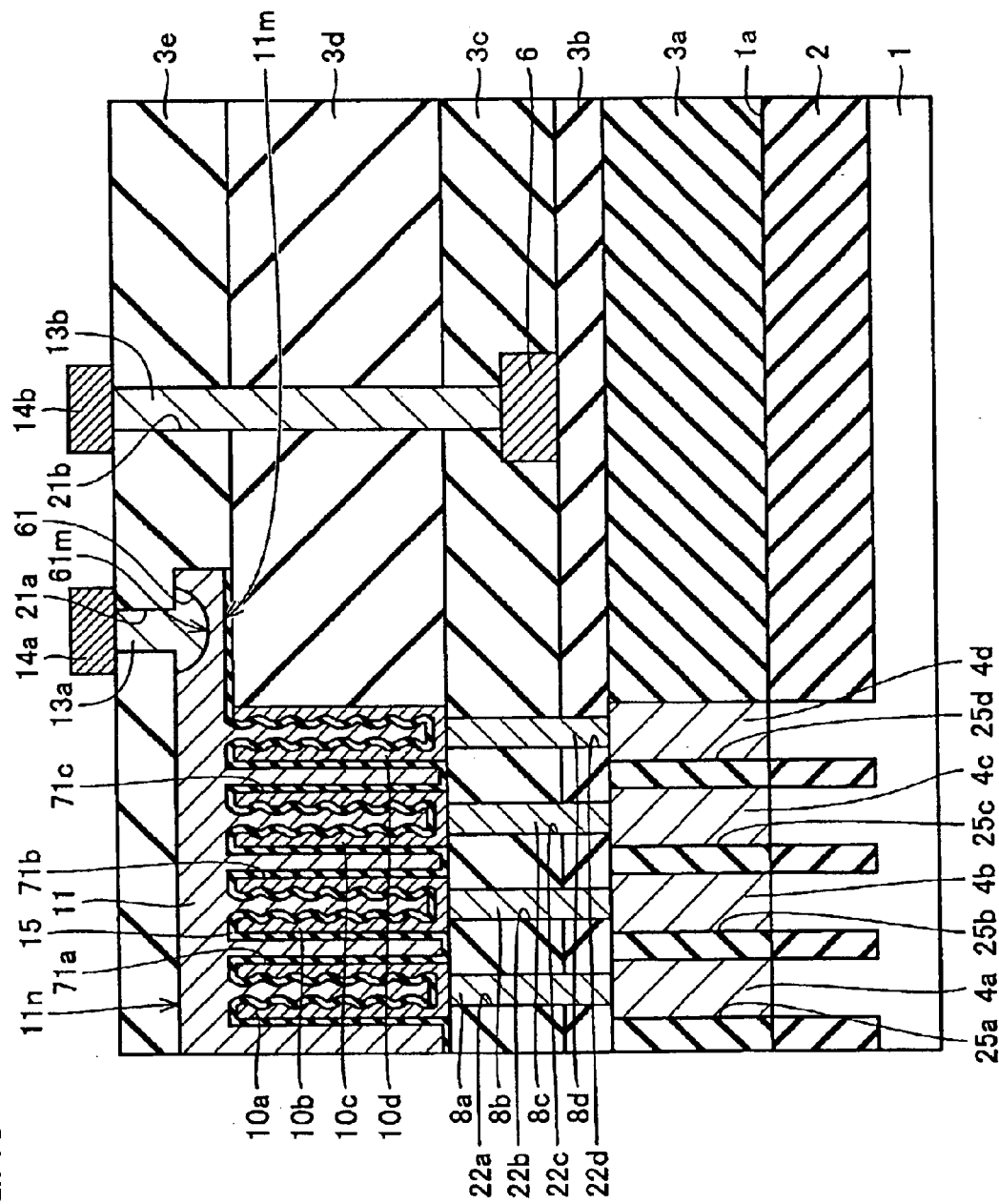
FIG. 43 is a cross sectional view showing a semiconductor device according to a thirty-fifth embodiment of the present invention.

The capacitor structure of the semiconductor device according to a thirty-fifth embodiment differs from that of the semiconductor device according to the eighth embodiment, and that is the only difference between the two. With reference to FIG. 43, the semiconductor device has a cylindrical MIS (metal-insulator-silicon) capacitor having coarse surfaces as described in the twenty-eighth embodiment.

According to the semiconductor device having such a configuration, the same effects as the effects according to the eighth embodiment can be obtained.

Thirty-Sixth Embodiment

Figure 44:
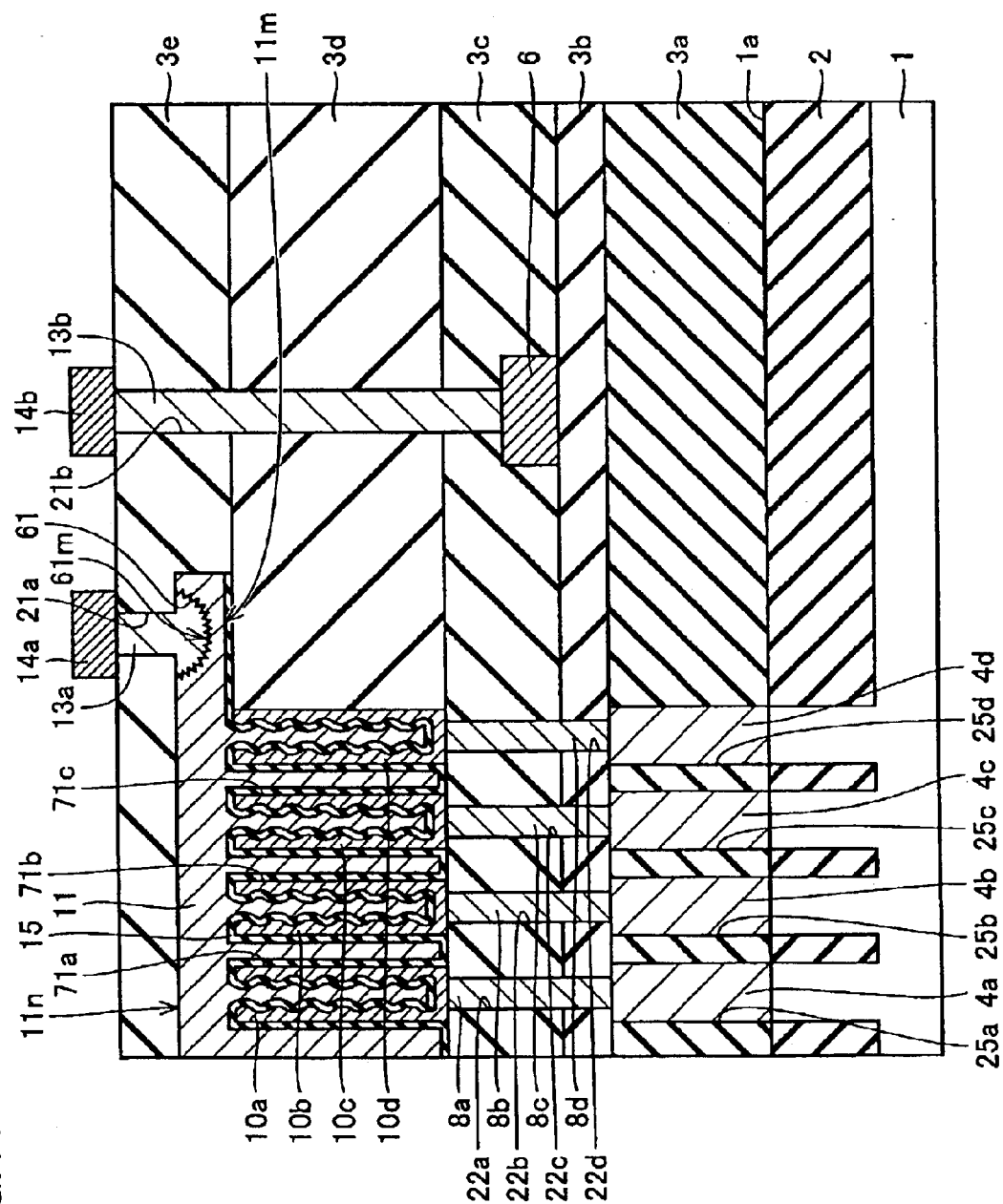
FIG. 44 is a cross sectional view showing a semiconductor device according to a thirty-sixth embodiment of the present invention.

The capacitor structure of the semiconductor device according to a thirty-sixth embodiment differs from that of the semiconductor device according to the ninth embodiment, and that is the only difference between the two. With reference to FIG. 44, the semiconductor device has a cylindrical MIS (metal-insulator-silicon) capacitor having coarse surfaces as described in the twenty-eighth embodiment.

According to the semiconductor device having such a configuration, the same effects as the effects according to the ninth embodiment can be obtained.

Thirty-Seventh Embodiment

The capacitor structure of the semiconductor device according to a thirty-seventh embodiment differs from that of the semiconductor device according to the first embodiment, and that is the only difference between the two. In the following, the same structures will not be described repeatedly.

Figure 45:
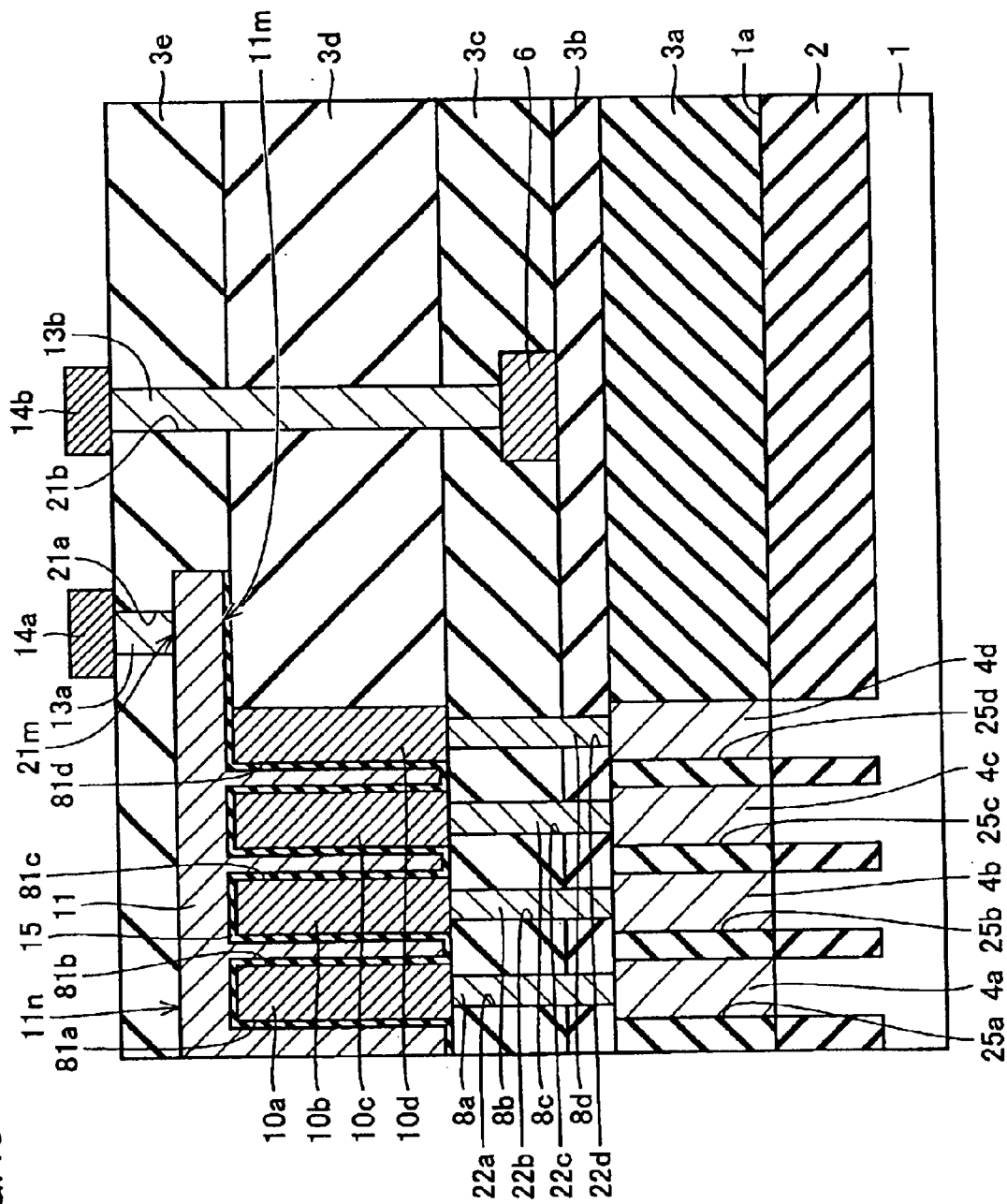
FIG. 45 is a cross sectional view showing a semiconductor device according to a thirty-seventh embodiment of the present invention.

With reference to FIG. 45, a semiconductor device has a pillar-like MIM (metal-insulator-metal) capacitor. Lower storage node electrodes 10a to 10d in columnar forms made of ruthenium (Ru) are formed in the layer wherein fourth interlayer insulating film 3d is located so as to make contact with the respective top faces of storage node contacts 8a to 8d. Recesses 81a to 81d reaching the top face of third interlayer insulating film 3c are formed between lower storage node electrodes 10a to 10d, respectively.

A dielectric film 15 made of tantalum oxide ($Ta_2O_5$) or barium strontium titanium oxide (BST) is formed so as to cover recesses 81a to 81d and a portion of the top face of fourth interlayer insulating film 3d. An upper cell plate electrode 11 made of ruthenium (Ru) is formed so as to cover dielectric film 15 and so as to completely fill in recesses 81a to 81d. Lower storage node electrodes 10a to 10d, dielectric film 15 and upper cell plate electrode 11 form the pillar-like MIM capacitor of the semiconductor device.

In a concave capacitor as well as in a cylindrical capacitor there is a risk wherein coverage over dielectric film deteriorates at the bottoms of recesses formed in lower storage node electrodes of cylindrical form leading to the generation of leak defects. In the case of a pillar-like MIM capacitor, however, there is no risk of generation of such a disadvantage because no recesses are formed in the lower storage node electrodes.

According to the semiconductor device having such a configuration, the same effects as the effects according to the first embodiment can be obtained.

Thirty-Eighth Embodiment

Figure 46:
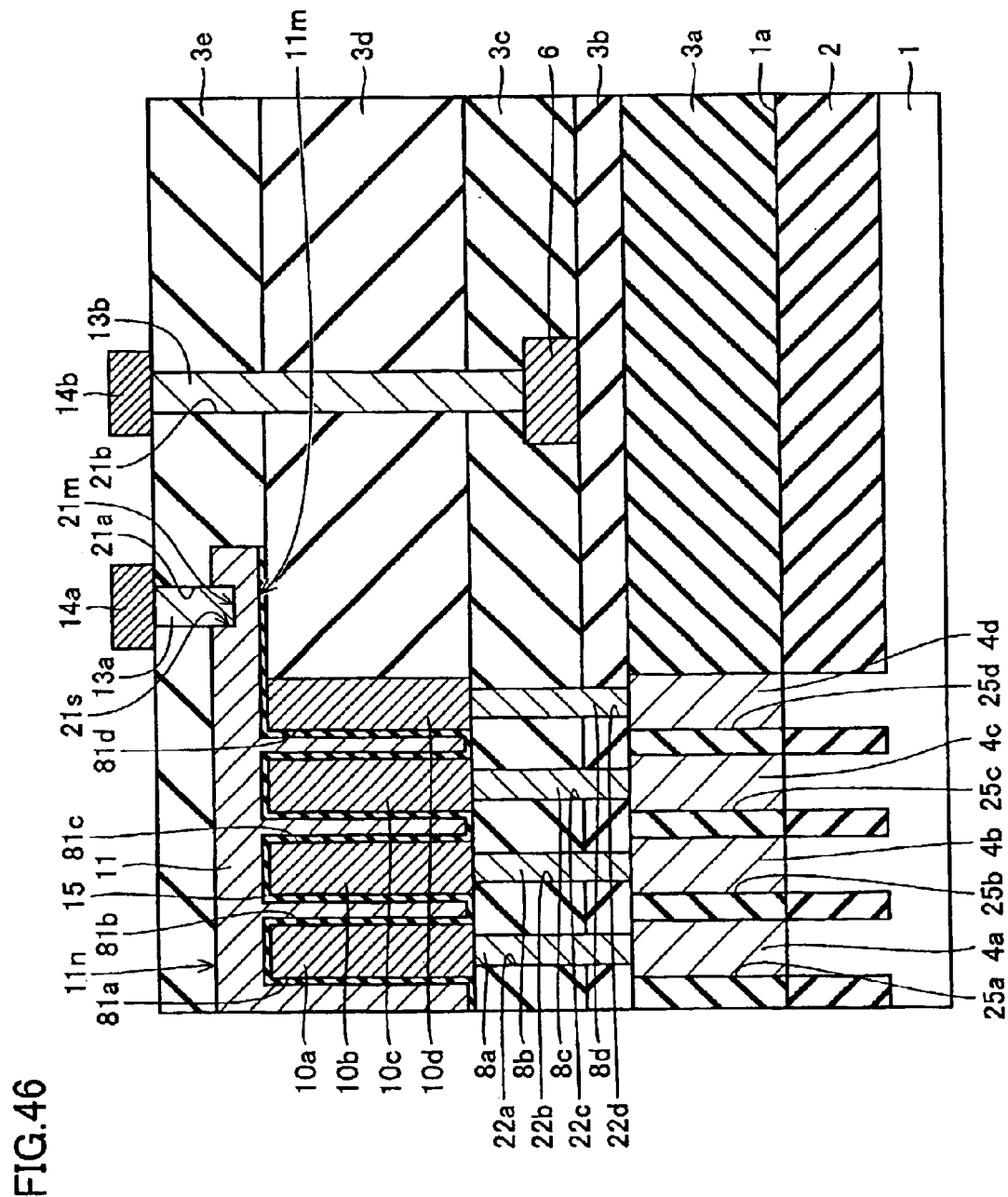
FIG. 46 is a cross sectional view showing a semiconductor device according to a thirty-eighth embodiment of the present invention.

The capacitor structure of the semiconductor device according to a thirty-eighth embodiment differs from that of the semiconductor device according to the second embodiment, and that is the only difference between the two. With reference to FIG. 46, the semiconductor device has a pillar-like MIM (metal-insulator-metal) capacitor as described in the thirty-seventh embodiment.

According to the semiconductor device having such a configuration, the same effects as the effects according to the second embodiment can be obtained.

Thirty-Ninth Embodiment

Figure 47:
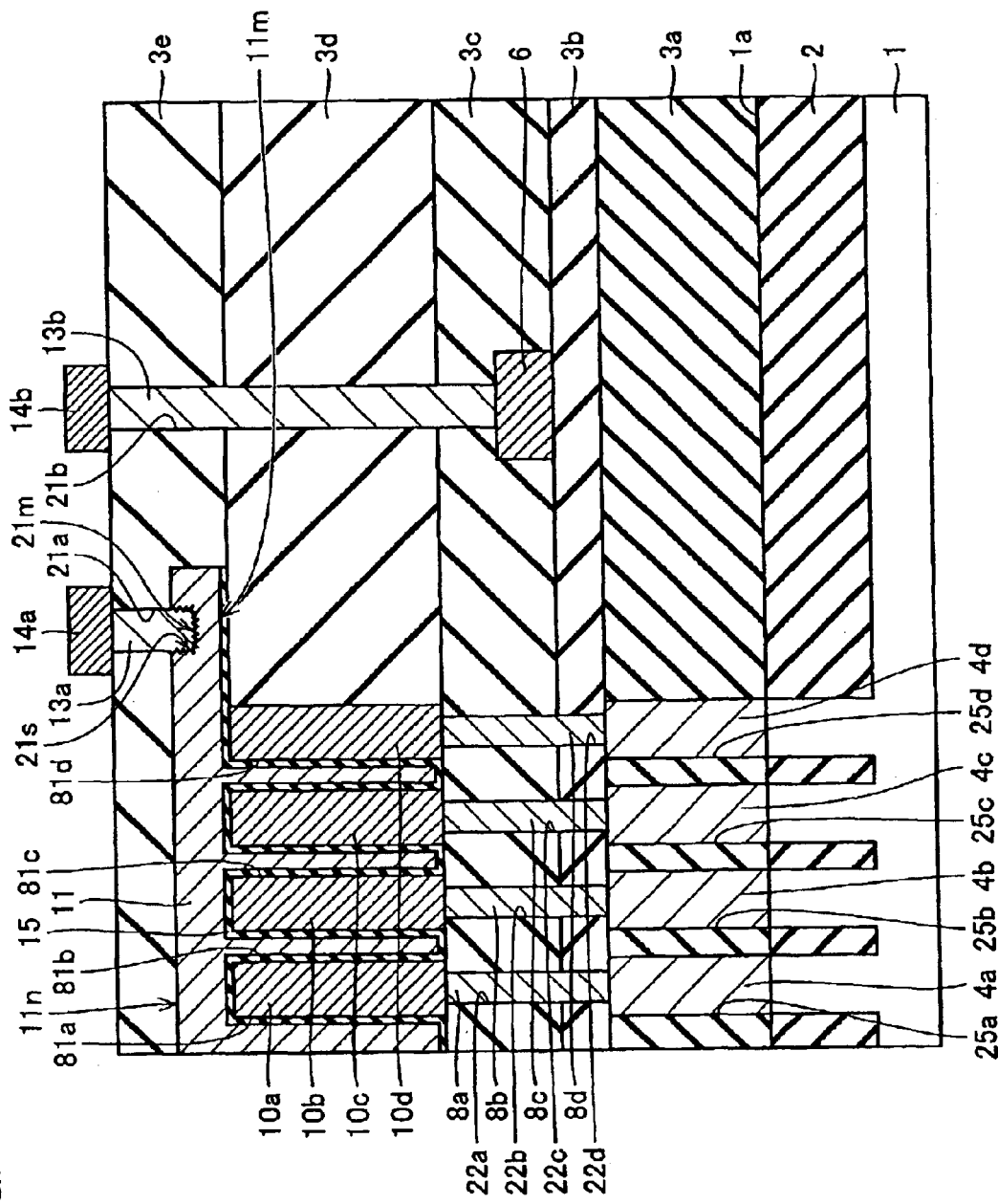
FIG. 47 is a cross sectional view showing a semiconductor device according to a thirty-ninth embodiment of the present invention.

The capacitor structure of the semiconductor device according to a thirty-ninth embodiment differs from that of the semiconductor device according to the third embodiment, and that is the only difference between the two. With reference to FIG. 47, the semiconductor device has a pillar-like MIM (metal-insulator-metal) capacitor as described in the thirty seventh embodiment.

According to the semiconductor device having such a configuration, the same effects as the effects according to the third embodiment can be obtained.

Fortieth Embodiment

Figure 48:
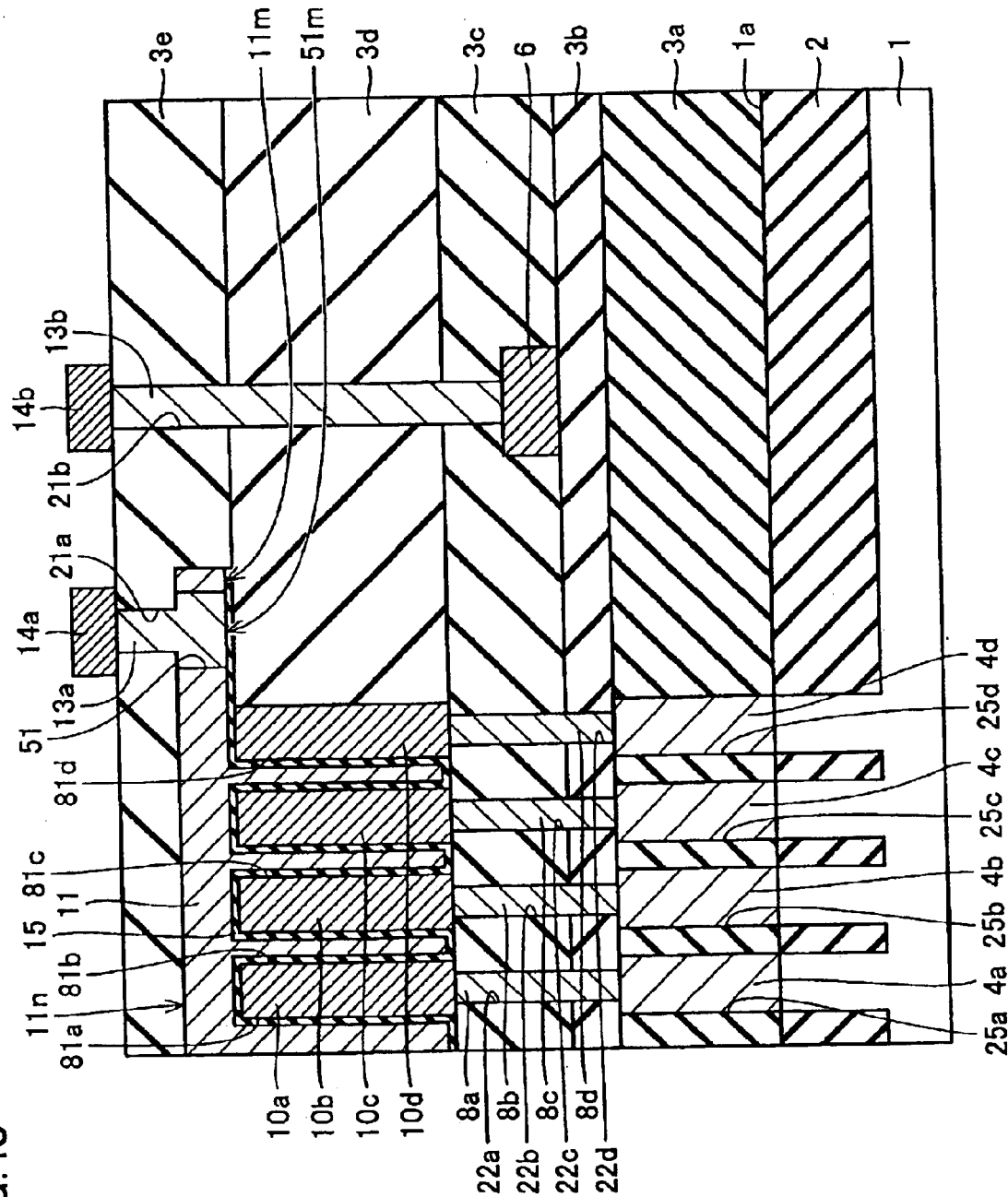
FIG. 48 is a cross sectional view showing a semiconductor device according to a fortieth embodiment of the present invention.

The capacitor structure of the semiconductor device according to a fortieth embodiment differs from that of the semiconductor device according to the fourth embodiment, and that is the only difference between the two. With reference to FIG. 48, the semiconductor device has a pillar-like MIM (metal-insulator-metal) capacitor as described in the thirty-seventh embodiment.

According to the semiconductor device having such a configuration, the same effects as the effects according to the fourth embodiment can be obtained.

Forty-First Embodiment

Figure 49:
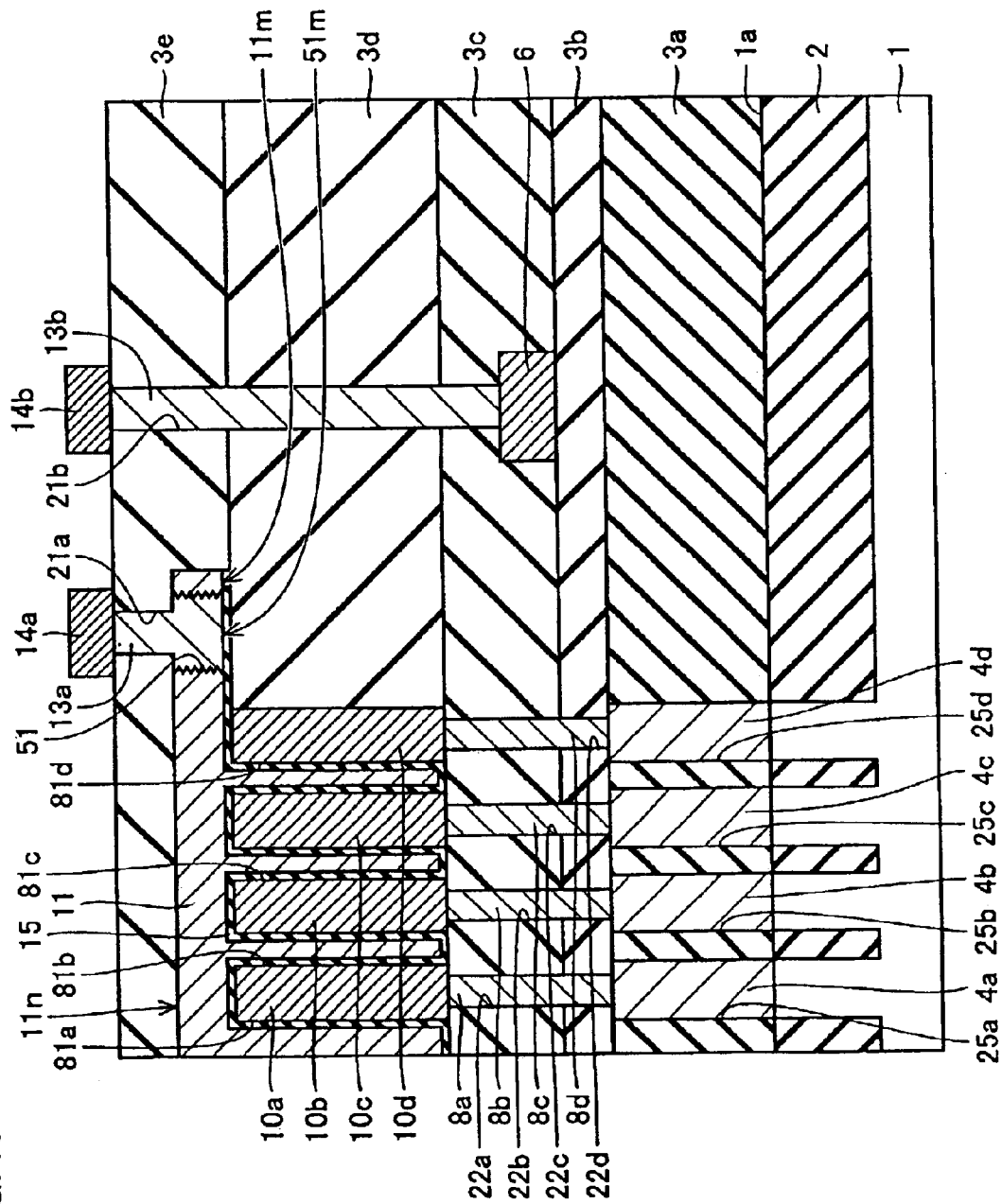
FIG. 49 is a cross sectional view showing a semiconductor device according to a forty-first embodiment of the present invention.

The capacitor structure of the semiconductor device according to a forty-first embodiment differs from that of the semiconductor device according to the fifth embodiment, and that is the only difference between the two. With reference to FIG. 49, the semiconductor device has a pillar-like MIM (metal-insulator-metal) capacitor as described in the thirty-seventh embodiment.

According to the semiconductor device having such a configuration, the same effects as the effects according to the fifth embodiment can be obtained.

Forty-Second Embodiment

Figure 50:
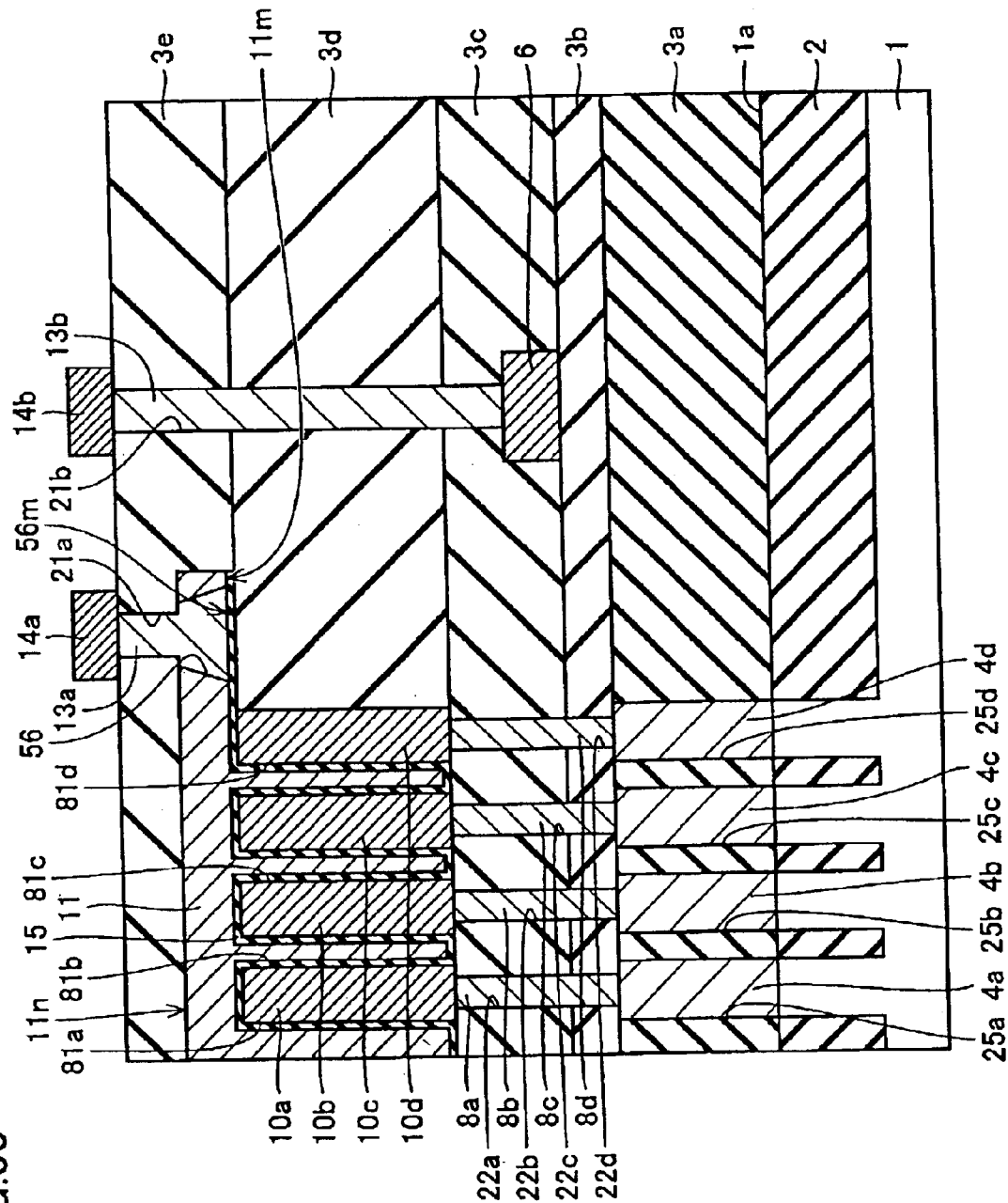
FIG. 50 is a cross sectional view showing a semiconductor device according to a forty-second embodiment of the present invention.

The capacitor structure of the semiconductor device according to a forty-second embodiment differs from that of the semiconductor device according to the sixth embodiment, and that is the only difference between the two. With reference to FIG. 50, the semiconductor device has a pillar-like MIM (metal-insulator-metal) capacitor as described in the thirty-seventh embodiment.

According to the semiconductor device having such a configuration, the same effects as the effects according to the sixth embodiment can be obtained.

Forty-Third Embodiment

Figure 51:
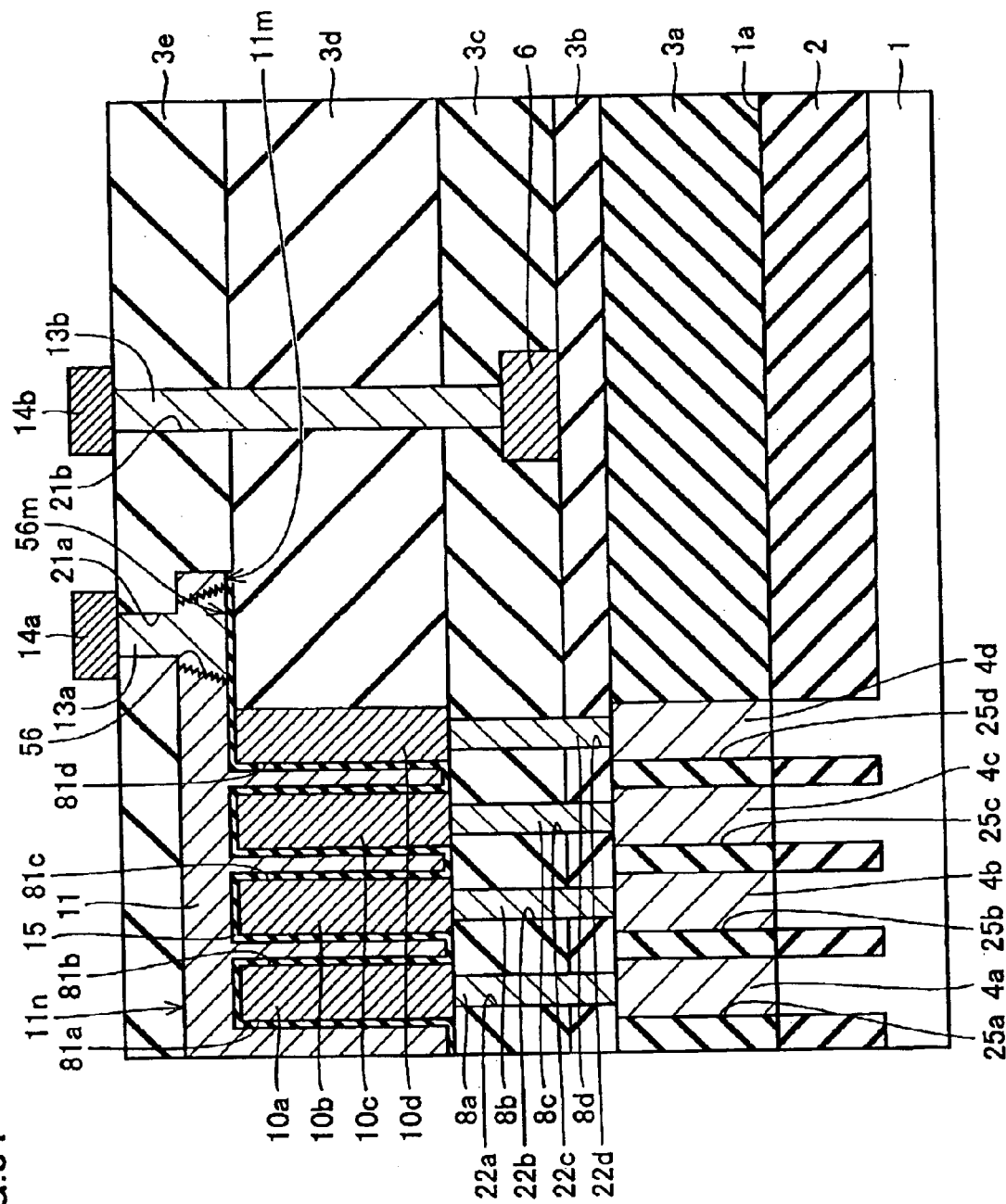
FIG. 51 is a cross sectional view showing a semiconductor device according to a forty-third embodiment of the present invention.

The capacitor structure of the semiconductor device according to a forty-third embodiment differs from that of the semiconductor device according to the seventh embodiment, and that is the only difference between the two. With reference to FIG. 51, the semiconductor device has a pillar-like MIM (metal-insulator-metal) capacitor as described in the thirty-seventh embodiment.

According to the semiconductor device having such a configuration, the same effects as the effects according to the seventh embodiment can be obtained.

Forty-Fourth Embodiment

Figure 52:
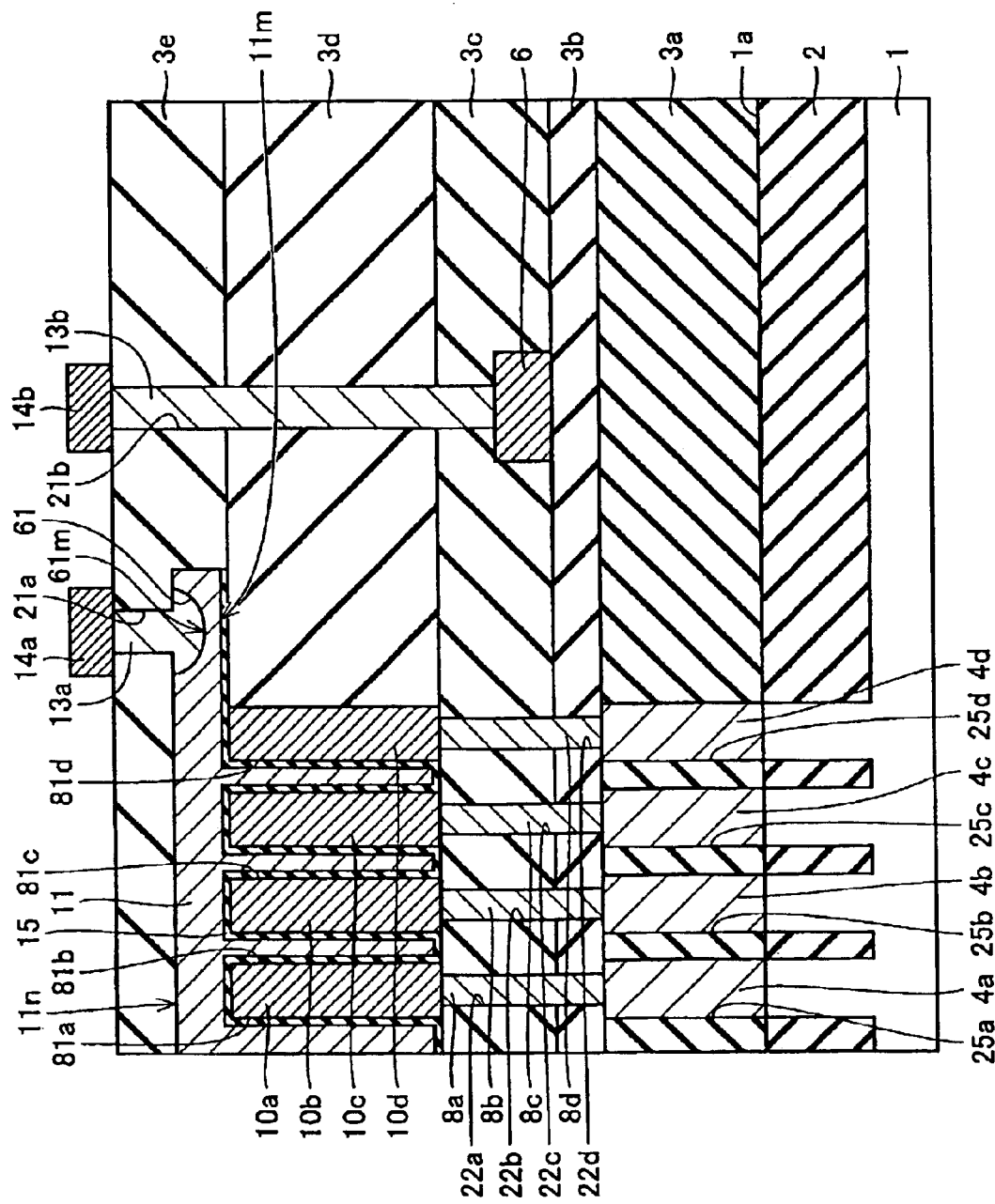
FIG. 52 is a cross sectional view showing a semiconductor device according to a forty-fourth embodiment of the present invention.

The capacitor structure of the semiconductor device according to a forty-fourth embodiment differs from that of the semiconductor device according to the eighth embodiment, and that is the only difference between the two. With reference to FIG. 52, the semiconductor device has a pillar-like MIM (metal-insulator-metal) capacitor as described in the thirty-seventh embodiment.

According to the semiconductor device having such a configuration, the same effects as the effects according to the eighth embodiment can be obtained.

Forty-Fifth Embodiment

Figure 53:
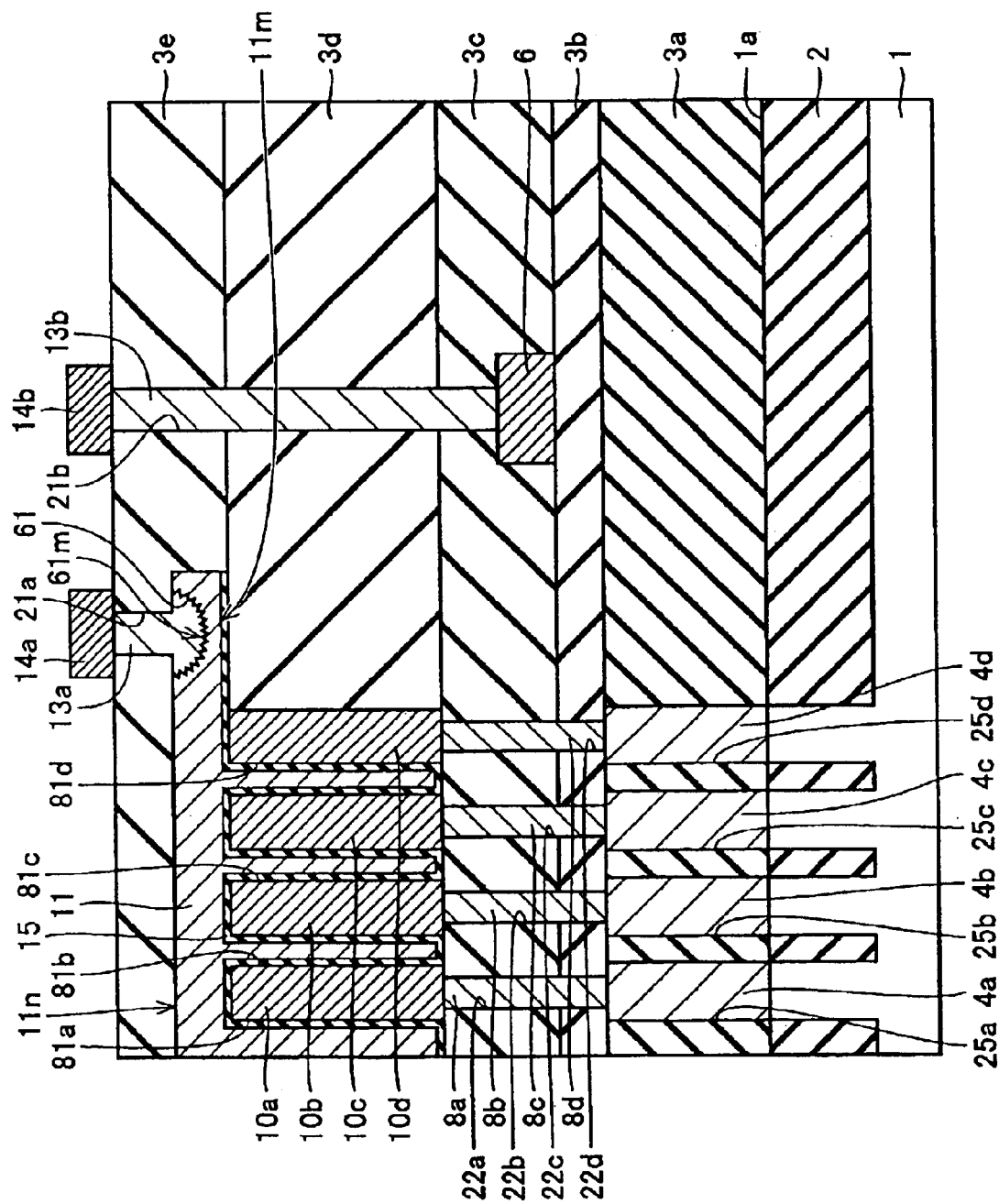
FIG. 53 is a cross sectional view showing a semiconductor device according to a forty-fifth embodiment of the present invention.
Figure 54:
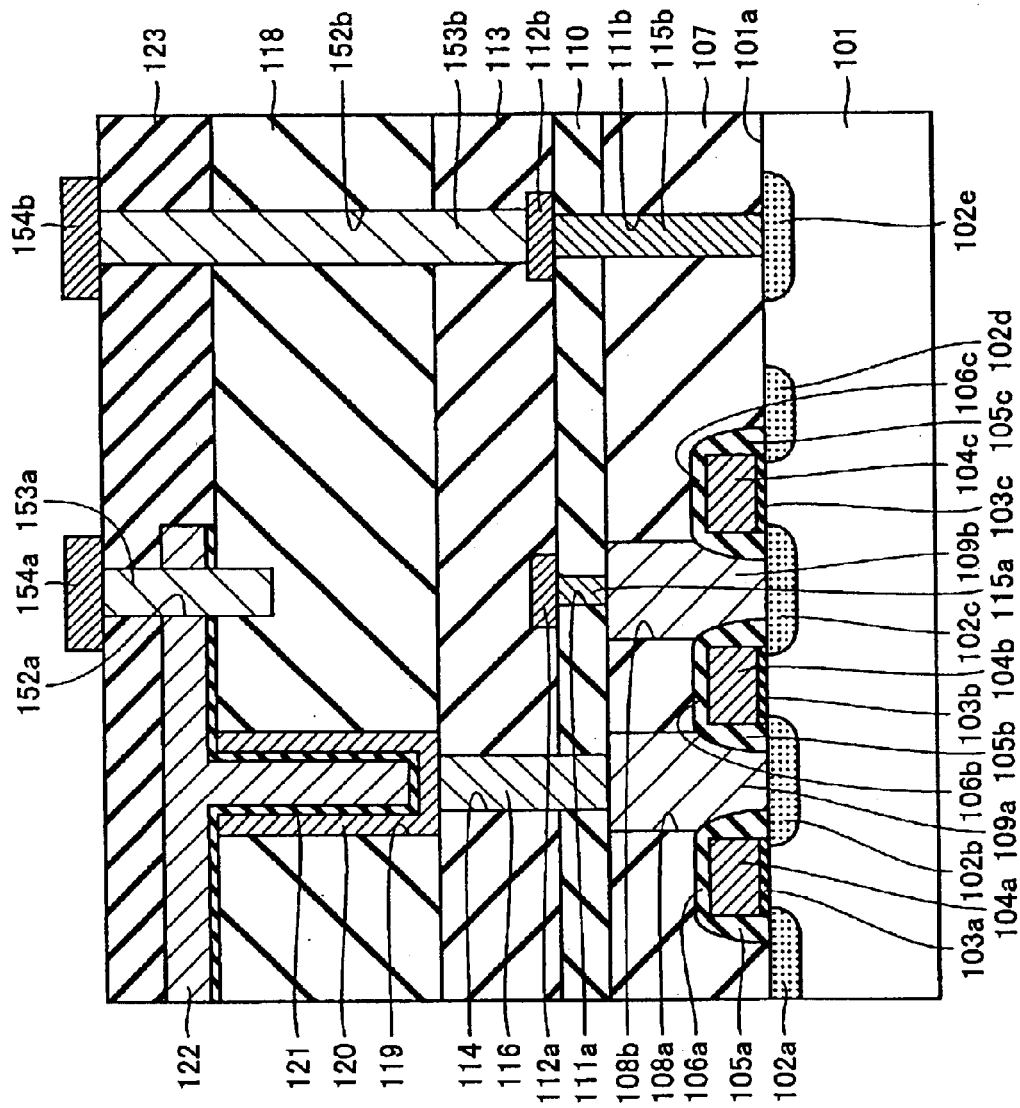
FIG. 54 is a cross sectional view showing a semiconductor device having a cylindrical capacitor structure according to a prior art.
Figure 55:
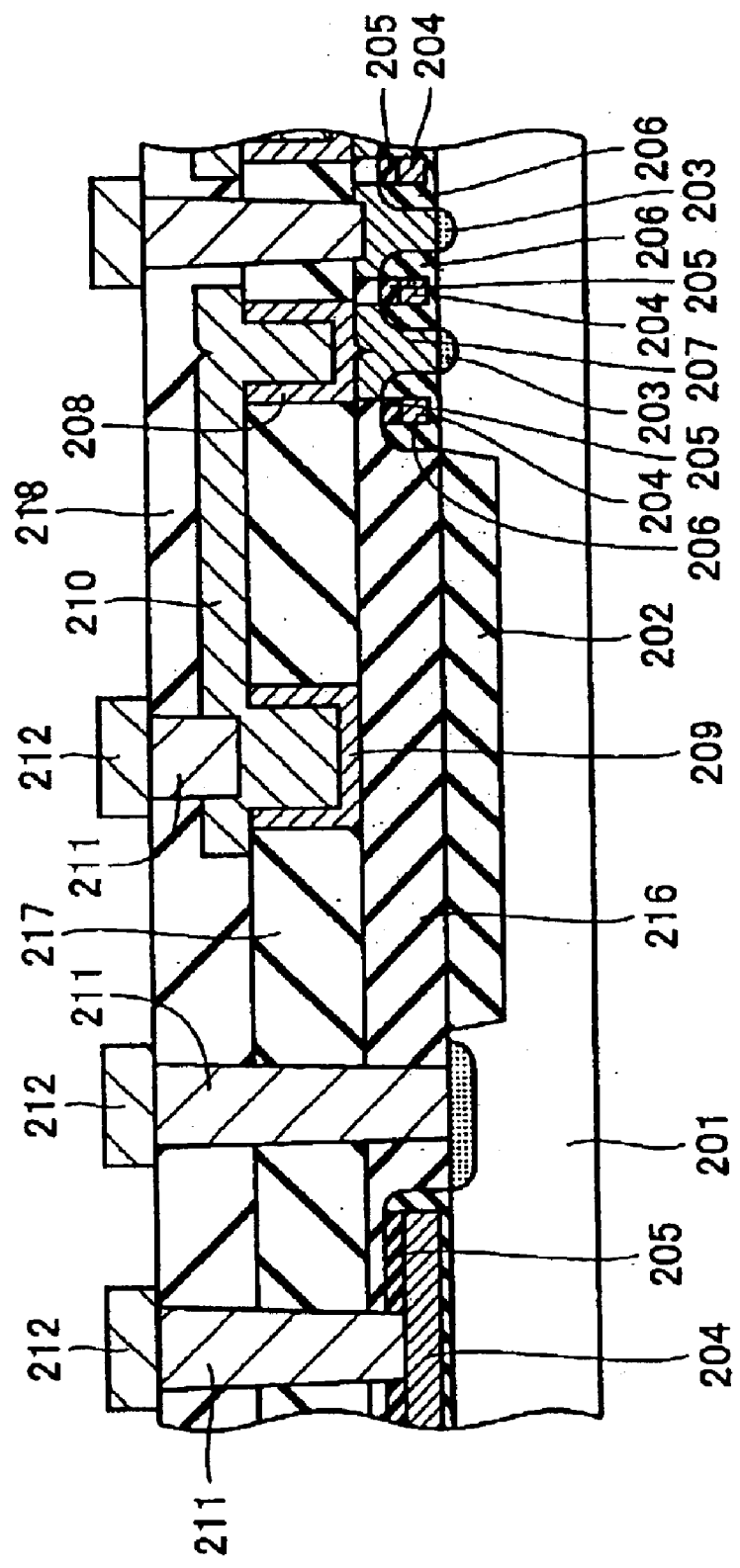
FIG. 55 is a cross sectional view showing a semiconductor device disclosed in Japanese Patent Laying-Open No. 2000-216357.

The capacitor structure of the semiconductor device according to a forty-fifth embodiment differs from that of the semiconductor device according to the ninth embodiment, and that is the only difference between the two. With reference to FIG. 53, the semiconductor device has a pillar-like MIM (metal-insulator-metal) capacitor as described in the thirty-seventh embodiment.

According to the semiconductor device having such a configuration, the same effects as the effects according to the ninth embodiment can be obtained.

Here, though semiconductor devices having cylindrical capacitors, primarily, have been described in the above embodiments, the present invention can be applied to a semiconductor device having a capacitor other than a cylindrical capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a lower electrode provided on a main surface of a semiconductor substrate;
   a dielectric film provided on said lower electrode;
   an upper electrode provided on said dielectric film, which contains at least one material selected from the group consisting of ruthenium, titanium nitride and platinum; and
   an interlayer insulating film covering said upper electrode, wherein
      said interlayer insulating film has a first hole reaching said upper electrode,
      said first hole is provided so that the distance between the main surface of said semiconductor substrate and the bottom face of said first hole is not less than the distance between the main surface of said semiconductor substrate and the bottom face of said upper electrode in the portion where said first hole reaches said upper electrode,
      the side face and the bottom face of said first hole are defined by said upper electrode, and
      a portion of said upper electrode defining at least one of the side face and the bottom face of said first hole has an uneven surface.

2. A semiconductor device comprising:
   a lower electrode provided on a main surface of a semiconductor substrate;
   a dielectric film provided on said lower electrode;
   an upper electrode provided on said dielectric film, which contains at least one material selected from the group consisting of ruthenium, titanium nitride and platinum; and
   an interlayer insulating film covering said upper electrode, wherein
      said interlayer insulating film has a first hole reaching said upper electrode,
      said first hole is provided so that the distance between the main surface of said semiconductor substrate and the bottom face of said first hole is not less than the distance between the main surface of said semiconductor substrate and the bottom face of said upper electrode in the portion where said first hole reaches said upper electrode,
      the side face and the bottom face of said first hole are defined by said upper electrode,
      said upper electrode has a first recess, and
      said first recess is connected to said first hold and is formed so that the area of the opening in a plane parallel to the main surface of said semiconductor substrate is greater than the area of the opening at the bottom face of said first hole.

3. The semiconductor device according to claim 2, wherein
   said first recess is formed so that the area of the opening of said first recess in a plane parallel to the main surface of said semiconductor substrate becomes greater as the position of the opening becomes closer to the bottom face from the top face of said upper electrode.

4. The semiconductor device according to claim 2, wherein said first recess has an uneven surface.

5. A semiconductor device comprising:
   a lower electrode provided on a main surface of a semiconductor substrate;
   a dielectric film provided on said lower electrode;
   an upper electrode provided on said dielectric film, which contains at least one material selected from the group consisting of ruthenium, titanium nitride and platinum; and
   an interlayer insulating film covering said upper electrode, wherein
      said interlayer insulating film has a first hole reaching said upper electrode,
      said first hole is provided so that the distance between the main surface of said semiconductor substrate and the bottom face of said first hole is not less than the distance between the main surface of said semiconductor substrate and the bottom face of said upper electrode in the portion where said first hole reaches said upper electrode,
      the side face and the bottom face of said first hole are defined by said upper electrode,
      said upper electrode has a first recess,
      said first recess is connected to said first hole and is formed so that the area of the opening at the top face of said upper electrode is greater than the area of the opening at the bottom face of said first hole, and
      said first recess is defined by a curved surface of said upper electrode.

6. The semiconductor device according to claim 5, wherein the surface defining said first recess is uneven.

7. The semiconductor device according to claim 1, further comprising:

a conductive film provided in said interlayer insulating film so that the distance between the top face of said interlayer insulating film and the conductive film is greater than the distance between the top face of said interlayer insulating film and said upper electrode, wherein said interlayer insulating film has a second hold reaching said conductive film, said upper electrode is etched at a relatively low etching rate by a predetermined etchant for forming said first and second holes by removing portions of said interlayer insulating film, and said interlayer insulating film is etched at a relatively high etching rate by said predetermined etchant.

8. The semiconductor device according to claim 2, further comprising:

a conductive film provided in said interlayer insulating film so that the distance between the top face of said interlayer insulating film and the conductive film is greater than the distance between the top face of said interlayer insulating film and said upper electrode, wherein said interlayer insulating film has a second hold reaching said conductive film, said upper electrode is etched at a relatively low etching rate by a predetermined etchant for forming said first and second holes by removing portions of said interlayer insulating film, and said interlayer insulating film is etched at a relatively high etching rate by said predetermined etchant.

9. The semiconductor device according to claim 5, further comprising:

a conductive film provided in said interlayer insulating film so that the distance between the top face of said interlayer insulating film and the conductive film is greater than the distance between the top face of said interlayer insulating film and said upper electrode, wherein said interlayer insulating film has a second hold reaching said conductive film, said upper electrode is etched at a relatively low etching rate by a predetermined etchant for forming said first and second holes by removing portions of said interlayer insulating film, and said interlayer insulating film is etched at a relatively high etching rate by said predetermined etchant.

* * * * *